United States Patent
Hwang et al.

(10) Patent No.: US 8,592,912 B2
(45) Date of Patent: Nov. 26, 2013

(54) SEMICONDUCTOR DEVICE AND METHOD OF FABRICATING THE SAME

(75) Inventors: Sung-Min Hwang, Seoul (KR); Hansoo Kim, Suwon-si (KR); Wonseok Cho, Suwon-si (KR); Jaehoon Jang, Seongnam-si (KR); Jae-Joo Shim, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 245 days.

(21) Appl. No.: 13/106,481

(22) Filed: May 12, 2011

(65) Prior Publication Data
US 2011/0284943 A1 Nov. 24, 2011

(30) Foreign Application Priority Data
May 18, 2010 (KR) .................. 10-2010-0046593

(51) Int. Cl.
*H01L 29/78* (2006.01)
(52) U.S. Cl.
USPC ...... 257/365; 257/314; 257/773; 257/E23.06; 257/E29.262
(58) Field of Classification Search
USPC .............. 257/365, 773, E23.06, E29.264
See application file for complete search history.

(56) References Cited

U.S. PATENT DOCUMENTS

| | | |
|---|---|---|
| 2007/0170589 A1 | 7/2007 | Kato et al. |
| 2008/0173932 A1 | 7/2008 | Kidoh et al. |
| 2008/0253183 A1 | 10/2008 | Mizukami et al. |
| 2009/0146206 A1 | 6/2009 | Fukuzumi et al. |

FOREIGN PATENT DOCUMENTS

| | | |
|---|---|---|
| JP | 06-338602 | 12/1994 |
| JP | 2007-194496 | 8/2007 |
| JP | 2008-171918 | 7/2008 |
| JP | 2008-192857 | 8/2008 |
| JP | 2008-258458 | 10/2008 |
| JP | 2008-263029 | 10/2008 |
| JP | 2009-135324 | 6/2009 |
| KR | 1020070077118 | 7/2007 |
| KR | 1020080092290 | 10/2008 |

*Primary Examiner* — Mamadou Diallo
(74) *Attorney, Agent, or Firm* — F. Chau & Associates, LLC

(57) ABSTRACT

Provided are a semiconductor device and a method of fabricating the same. The semiconductor device includes: a plurality of conductive patterns stacked on a substrate and spaced apart from each other and a pad pattern including a flat portion extending in a first direction parallel to the substrate from one end of any one of the plurality of conductive patterns, and a landing sidewall portion extending upward from a top surface of the flat portion, wherein a width of a portion of the landing sidewall portion in a second direction parallel to the substrate and perpendicular to the first direction is less than a width of the flat portion.

11 Claims, 57 Drawing Sheets

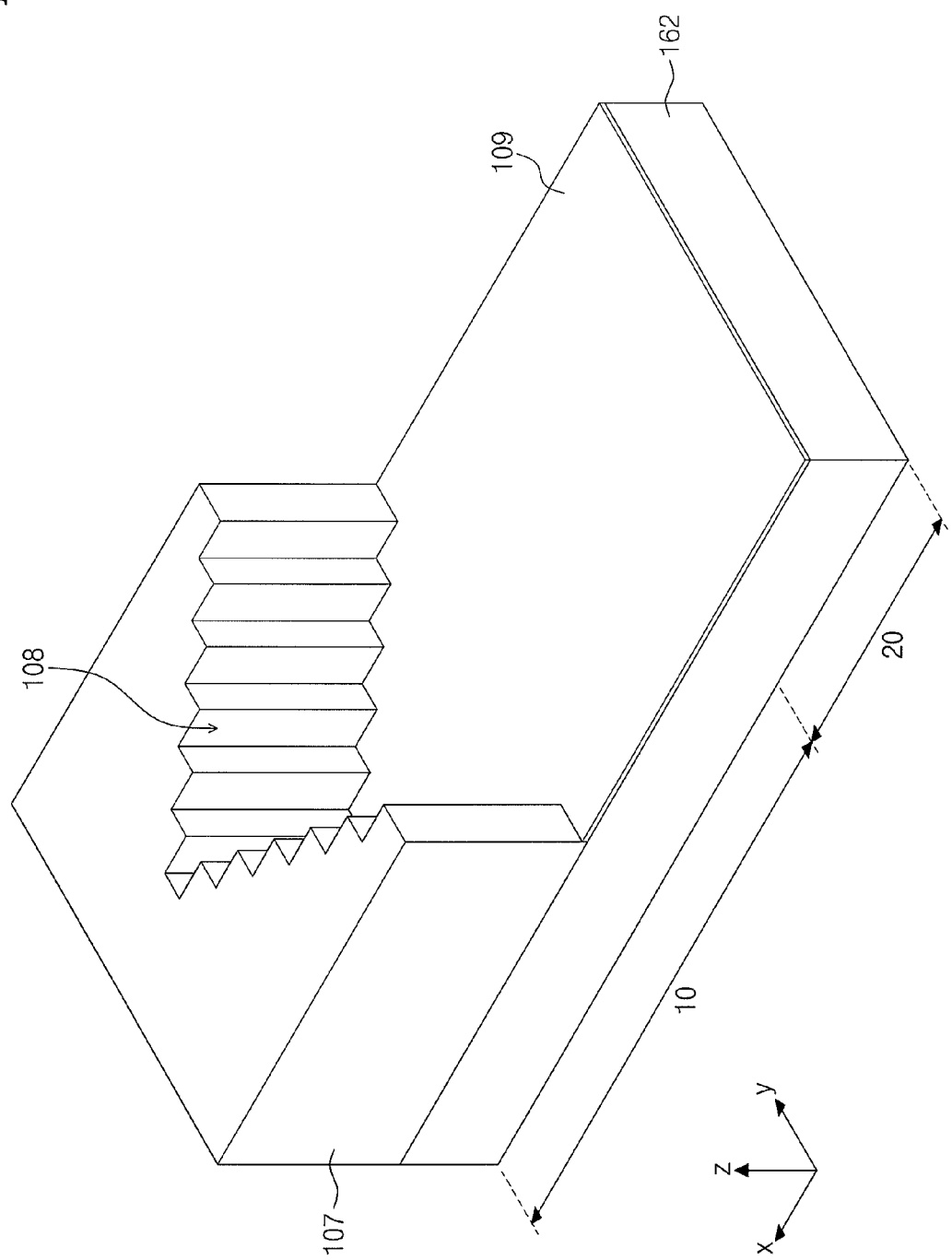

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2010-0046593, filed on May 18, 2010, the entire disclosure of which is hereby incorporated by reference herein in it's entirety.

BACKGROUND

1. Technical Field

The present disclosure herein relates to a semiconductor device and a method of fabricating the same.

2. Description of the Related Art

As the electronic industry has advanced to a higher level, the integration density of semiconductor devices has likewise increased . Higher integration of semiconductor devices may be a significant factor in determining product price. In other words, as integration density of semiconductor devices increases, product prices of semiconductor devices may decrease. Requirement for higher integration of semiconductor devices is increasing. Typically, since integration density of semiconductor devices is mainly determined by the area occupied by a unit memory cell, integration density may be significantly influenced by the level of fine pattern forming technology. However, pattern fineness may be limited due to expensive semiconductor equipment and/or difficulties in semiconductor fabrication processes.

SUMMARY

The present disclosure provides a semiconductor device with high reliability, and a method of fabricating the same.

The present disclosure also provides a semiconductor device optimized for high integration density, and a method of fabricating the same.

Embodiments of the inventive concept provide semiconductor devices including: a plurality of conductive patterns stacked on a substrate and spaced apart from each other, and a pad pattern including a flat portion extending in a first direction parallel to the substrate from one end of any one of the plurality of conductive patterns, and a landing sidewall portion extending upward from a top surface of the flat portion, wherein the width of a portion of the landing sidewall portion is less than the width of the flat portion in a second direction parallel to the substrate and perpendicular to the first direction.

In some embodiments, the landing sidewall portion may include a first portion extending the first direction, and a second portion extending in the second direction, the width of the first portion of the landing sidewall portion may be less than the width of the flat portion in the second direction, and the width of the second portion of the landing sidewall portion may be equal to the width of the flat portion in the second direction.

In other embodiments, the pad pattern may be provided in plurality on the substrate, the plurality of pad patterns may be connected to one end of the stacked conductive patterns respectively, the flat portions respectively connected to the stacked conductive patterns may have a stepwise structure, and top surfaces of the landing sidewall portions extending upward respectively from top surfaces of one end of the flat portions may be positioned at the same level.

In still other embodiments, each of the conductive patterns may include gate electrodes extending in parallel in the first direction and positioned at the same level, and a connecting portion connecting one end of the gate electrodes to each other.

In even other embodiments, the connecting portion may include a first sidewall contacting the gate electrodes, and a second sidewall facing the first sidewall, and the pad pattern is connected to the second sidewall.

In yet other embodiments, the above semiconductor device may further include: a semiconductor pillar penetrating the stacked conductive patterns; and an information storage layer between the semiconductor pillar and the conductive patterns.

In further embodiments, the above semiconductor device may further include: a first insulation layer and a second insulation layer disposed on the uppermost conductive pattern among the conductive patterns; and a barrier layer between the first insulation layer and the second insulation layer, wherein the barrier layer comprises the same material as the information storage layer.

In still further embodiments, the above semiconductor device may further include an auxiliary pad pattern extending in the first direction from the one end of any one of the conductive patterns and spaced apart from the pad pattern, wherein the auxiliary pad pattern comprises an auxiliary flat portion parallel to the substrate, and an auxiliary sidewall portion extending upward from one end of the auxiliary flat portion.

In even further embodiments, the width of the auxiliary sidewall portion may be equal to the width of the auxiliary flat portion in the second direction.

In yet further embodiments, the above semiconductor device may further include a contact plug on the landing sidewall portion.

In other embodiments, each of the widths of the contact plug in the first and second directions may be greater than the width of the some portion of the landing sidewall portion.

In still other embodiments, the width of the landing sidewall portion in the first direction may be greater than the thickness of the conductive pattern.

In even other embodiments of the inventive concept, methods of fabricating a semiconductor device, the methods include: preparing a substrate including a first region and a second region, and forming a pattern structure having a top surface which is positioned at a higher level than a top surface of the substrate of the second region, within the first region, the pattern structure including an intaglio pattern, wherein the width of the intaglio pattern in a second direction perpendicular to a first direction decreases gradually as the intaglio pattern extends in the first direction, one side of the intaglio pattern adjacent to the second region is opened, and the first and second directions are parallel to the top surface of the substrate.

In yet other embodiments, the above method may further include: alternatingly and repeatedly stacking first material layers and second material layers on the entire surface of the substrate having the pattern structure, performing a planarization process using the top surface of the pattern structure as an etch stop layer, forming a semiconductor pillar penetrating the first material layers and the second material layers; continuously patterning the first material layers and the second material layers to form a trench defining first material patterns and second material patterns stacked alternatingly and repeatedly, and removing some portion of the first material pattern exposed to the trench and leaving another portion to form a recess.

In further embodiments, each of the first material patterns may include a flat portion parallel to the substrate, and a sidewall portion extending upward from one end of the flat portion, and the sidewall portion may include at least one first portion extending in the first direction and at least one second portion extending in the second direction.

In still further embodiments, the first material layers and the second material layers may be formed of an insulation material, and the first material layers may be formed of a material having an etch selectivity with respect to the second material layers.

In even further embodiments, the removed some portion of the first material pattern may include at least the first portion of the sidewall portion.

In yet further embodiments, the above method may further include: forming an information storage layer within the recess regions; and forming conductive patterns filling the recess regions respectively.

In other embodiments, the first material layers may be formed of a conductive material and the second material layers may be formed of an insulation material.

In even other embodiments, the other portion of the first material pattern left may include at least the first portion of the sidewall portion.

Embodiments of the inventive concept provide a method of fabricating a semiconductor device, which includes preparing a substrate including a cell region and a peripheral region spaced apart from each other, forming a pattern structure having a top surface which is positioned at a higher level than a top surface of the substrate of the cell region, within the cell region. The pattern structure including an intaglio pattern, wherein a width of the intaglio pattern in a second direction perpendicular to a first direction decreases gradually as the intaglio pattern extends in the first direction, one side of the intaglio pattern adjacent to the second region is opened, and the first and second directions are parallel to the top surface of the substrate. The method further includes forming a buffer dielectric layer within the cell region of the substrate, alternatingly and repeatedly stacking sacrificial layers and insulating layers on the entire surface of the substrate having the pattern structure, performing a planarization process using the top surface of the pattern structure as an etch stop layer, sequentially forming a first upper insulation layer, an uppermost sacrificial layer and a second upper insulation layer on the sacrificial layers and the insulation layers stacked alternatingly, forming channel openings penetrating the buffer dielectric layer, the insulation layers, the first and second upper insulation layers, the uppermost sacrificial layer and the sacrificial layers and forming semiconductor pillars filling the channel openings, forming an additional sacrificial layer and a capping insulation layer sequentially on the cell region and the peripheral region of the substrate, continuously patterning the sacrificial layers, the insulating layers, the first upper insulation layer, the second upper insulation layer, the uppermost sacrificial layer, the additional sacrificial layer, and the capping insulation layer to form a trench defining a preliminary stack structure, an additional sacrificial pattern on the preliminary stack structure, and a capping insulation pattern on the additional sacrificial pattern, the preliminary stack structure including sacrificial patterns, uppermost sacrificial patterns, first upper insulating patterns, second upper insulating patterns, and insulating patterns stacked alternatingly and repeatedly, and wherein the sacrificial patterns farmed below the uppermost sacrificial patterns include a flat portion parallel to a top surface of the substrate and a side portion upwardly extending from one end of the flat portion. The method further includes removing some portions of the sacrificial patterns and some portions of the additional sacrificial pattern which are exposed to the trench to form a recess region and an additional recess region between the first upper insulation pattern and the second upper insulation pattern, respectively, the recess region exposing portions of the semiconductor pillar.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIGS. 4A to 4I are perspective views for describing a method of fabricating a semiconductor device according to an embodiment of the inventive concept;

DETAILED DESCRIPTION OF EXEMPLARY EMBODIMENTS

Figure 1:
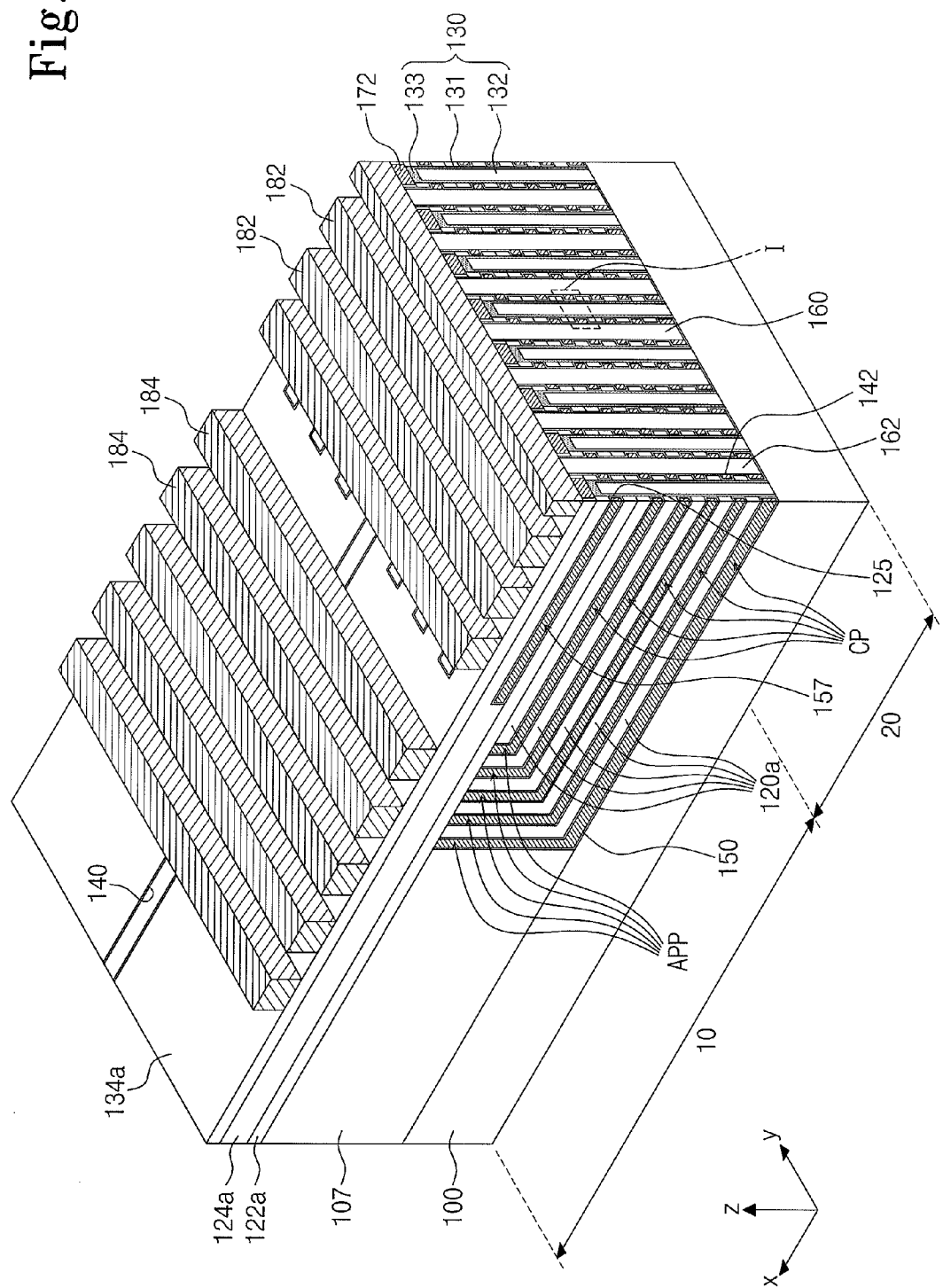
FIGS. 1, 2A, and 2B are perspective views illustrating a semiconductor device according to an embodiment of the inventive concept.

The present invention will be better understood from the following description of preferred embodiments taken in conjunction with the accompanying drawings. The present invention may, however, be embodied in different forms and should not be construed as limited to the embodiments set forth herein.

In the specification, it will be understood that when a layer (or film) is referred to as being 'on' another layer or substrate, it can be directly on the other layer or substrate, or intervening layers may also be present. Like reference numerals refer to like elements throughout.

Figure 2A:
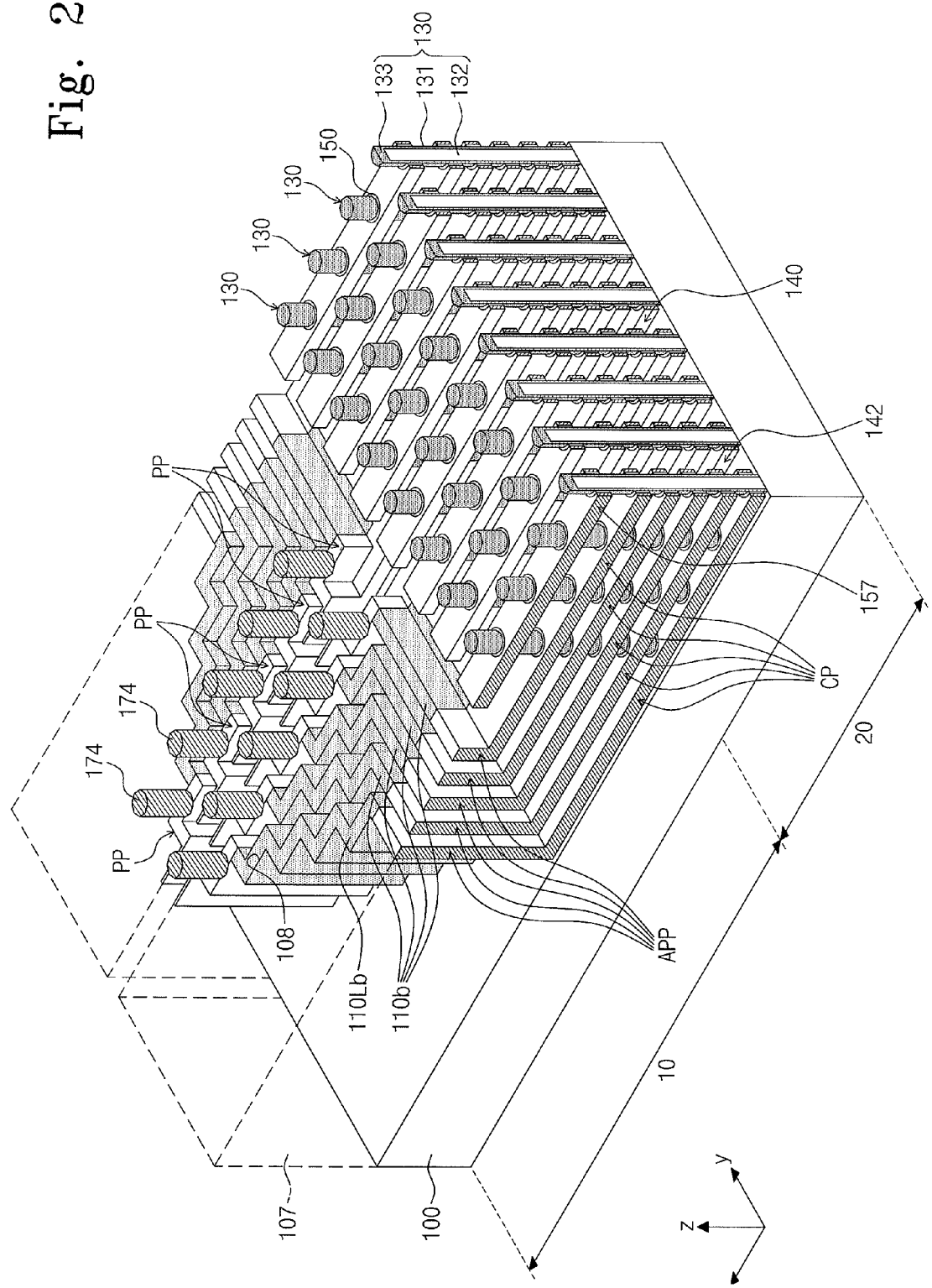
Figure 2B:
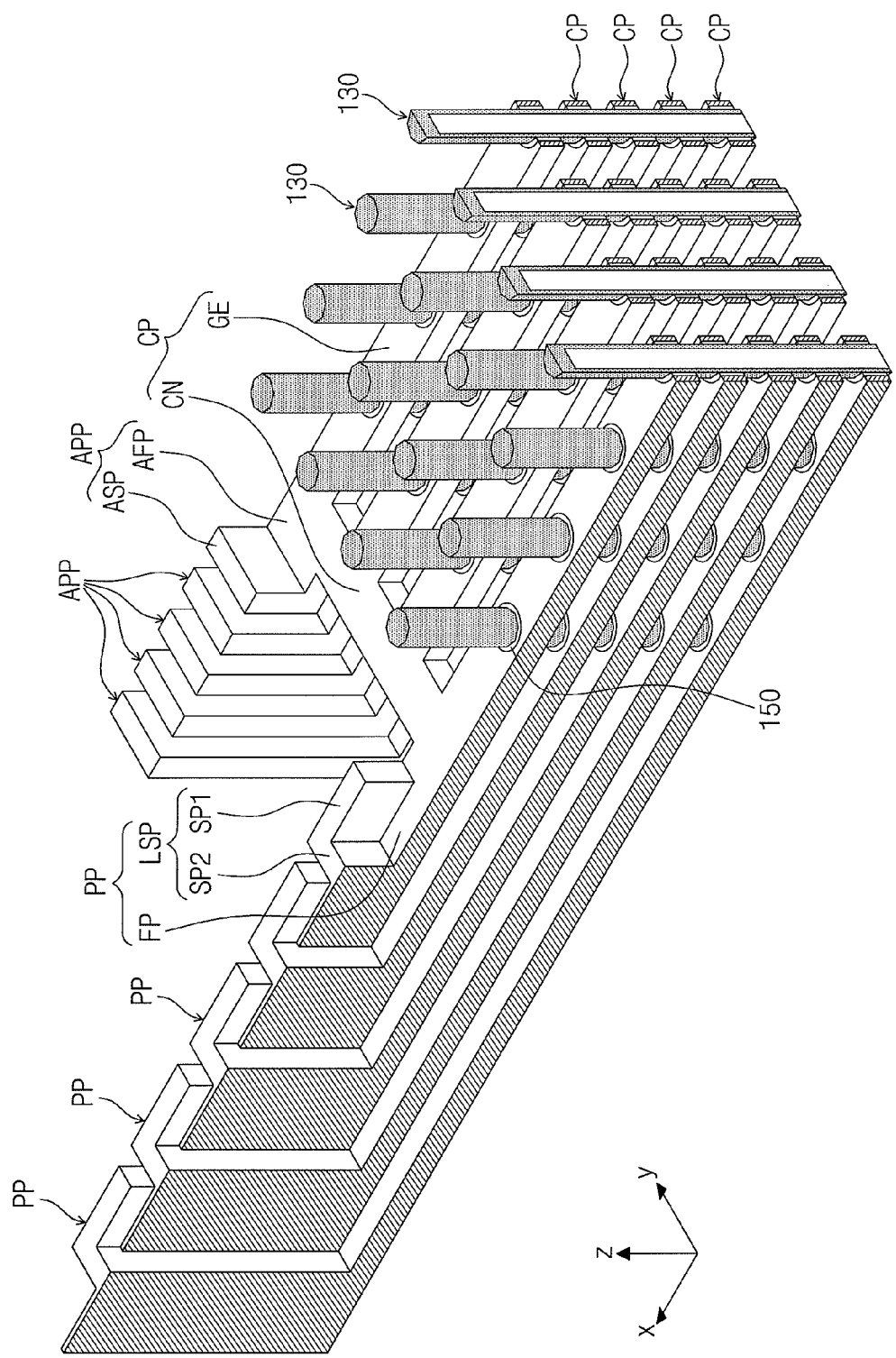

A semiconductor device according to a first embodiment of the inventive concept will be described. FIGS. 1, 2A and 2B are perspective views illustrating a semiconductor device according to a first embodiment of the inventive concept. For the convenience of the description, FIG. 2A illustrates conductive patterns CP, pad patterns PP, auxiliary pad patterns APP, a string select line 157, semiconductor pillars 130, sacrificial patterns 110Lb, 110b, cell contact plugs 174, and a substrate 100, which will be described below, and FIG. 2B illustrates conductive patterns CP included in one stack structure, pad patterns PP and auxiliary pad patterns APP connected to the conductive patterns CP. For the convenience of the recognition, some patterns of the conductive patterns CP, the pad patterns PP and the auxiliary pad patterns APP are omitted in FIGS. 2A and 2B.

Referring to FIGS. 1, 2A and 2B, the substrate 100 may include a first region 10 and a second region 20. The first region 10 may be a pad region where pad patterns are disposed, and the second region 20 may be a region where cells arranged three-dimensionally are disposed. The substrate 100 may be a semiconductor substrate. The substrate 100 may be, for example, a silicon substrate, a germanium substrate, a silicon-germanium substrate, or a compound semiconductor substrate. The substrate 100 may be doped with, for example, a first-type dopant.

A pattern structure 107 may be disposed on the substrate 100 within the first region 10. A top surface of the pattern structure 107 may be higher than a top surface of the substrate 100 within the second region 20. The pattern structure 107 may include, for example, an intaglio pattern 108 (see 108 of FIGS. 2A and 108 of FIG. 4A). The width of the intaglio pattern 108 in a second direction may be decreased gradually as the intaglio pattern 108 extends toward a first direction. The first direction and the second direction are parallel to the top surface of the substrate 100 and may cross each other. In the drawings, the first direction may be an x-axis direction and the second direction may be a y-axis direction. One side of the intaglio pattern 108 adjacent to the second region 20 may be opened toward the second region 20. That is, the intaglio pattern 108 may have a shape, for example, of which an upper end and one side are opened. The pattern structure 107 may include an insulation material. For example, the pattern structure 107 may include a silicon oxide layer. Alternatively, the pattern structure 107 may be formed of the same material as the substrate 100. In this case, the pattern structure 107 and the substrate 100 may be connected to each other without any boundary surface to thus form one body.

Conductive patterns CP stacked alternatingly may be disposed on the substrate 100 within the second region 20. Each of the conductive patterns CP may include a plurality of gate electrodes GE, and a connecting portion CN connecting one end of the plurality of gate electrodes GE to each other. The stacked conductive patterns CP may be included in one stack structure.

The gate electrodes GE included in each of the conductive patterns CP extend in parallel in the first direction, and may be positioned at the same level from the top surface of the substrate 100. The gate electrodes GE included in each of the conductive patterns CP may be spaced apart from each other in the second direction. The gate electrodes GE of each of the conductive patterns CP may have, for example, a line shape extending in the first direction. A sub-trench 142 may be defined between the gate electrodes GE disposed spaced apart in the second direction. A sub-device isolation pattern 162 may be disposed in the sub-trench 142. The sub-device isolation pattern 162 may include, for example, a silicon oxide layer.

The connecting portion CN may include a first sidewall connected to the gate electrodes GE, and a second sidewall facing the first sidewall. The connecting portion CN may have, for example, a line shape extending in the second direction. The connecting portions CN included in each of the stack structures may be stacked spaced apart from each other on the substrate 100 within the second region 20.

Pad patterns PP may extend from one end of the conductive patterns CP, respectively. The pad patterns PP may extend into the first region 10 in the first direction. The pad patterns PP may be connected to a portion of the second sidewall adjacent to the one end of the connecting portion CN of the conductive patterns CP. Among the stacked conductive patterns CP, the pad pattern PP connected to the conductive pattern CP positioned at a relatively low level may extend further in the first direction than the pad pattern PP connected to conductive pattern CP positioned at a relatively high level.

Each of the pad patterns PP may include a flat portion FP, and a landing sidewall portion LSP extending upward from a top surface of the flat portion FP. The flat portion FP may extend in the first direction from a portion of the second sidewall adjacent to one end of the connecting portion CN of the conductive pattern CP. The flat portion FP of any one of the pad patterns PP, and the conductive pattern CP connected to the any one of the pad patterns PP may be positioned at the same level from the top surface of the substrate 100, and may have the same thickness. Among the conductive patterns CP stacked on the substrate 100, the flat portion FP connected to the conductive pattern CP positioned at a relatively low level may have a greater length in the first direction than the flat portion FP connected to the conductive pattern CP positioned at a relatively high level. Therefore, the flat portions FP respectively connected to the conductive patterns CP stacked on the substrate 100 may have a shape of, for example, a terraced structure in which the lengths of the flat portions FP decrease away from the top surface of the substrate 100. The stacked flat portions FP may have, for example, a terraced structure descending toward the first region 10 from the second region 20.

Top surfaces of the landing sidewall portion LSP may be positioned at the same level from the top surface of the substrate 100. Among the conductive patterns CP stacked on the substrate 100, the landing sidewall portion LSP extending from the flat portion FP connected to the conductive pattern CP positioned at a relatively low level may have a greater length in the third direction than the landing sidewall portion LSP extending from the flat portion FP connected to the conductive pattern CP positioned at a relatively high level.

Each of the landing sidewall portions LSP may include a first portion SP1 extending in the first direction, and a second portion SP2 extending in the second direction. The width of the first portion SP1 of the landing sidewall portion LSP in the first direction may be less than the width of the flat portion FP and more than the thickness of the conductive pattern CP. The width of the first portion SP1 of the landing sidewall portion LSP may be less than the width of the flat portion FP, in the second direction. The width of the second portion SP2 of the landing sidewall portion LSP may be equal to the width of the flat portion FP, in the second direction. The first portion SP1 may be relatively closer to the conductive pattern CP than the second portion SP2.

In plan view, top surfaces of the first portions SP1 of the landing sidewall portions LSP connected to the stacked conductive patterns CP may be arranged in the first direction to form one row. In the one row, the first portions SP1 may be spaced apart from each other. The top surfaces of the respective first portions SP1 may have, for example, a substantially rectangular shape having a long-side in the first direction. A space between the top surfaces of the first portions SP1 adjacent to each other in the first direction may be shorter than the lengths of the long-sides of the top surfaces of the first portions SP1. The area of the top surfaces of the first portions SP1 may be larger than that of the top surfaces of the second portions SP2. The areas of the top surfaces of the landing sidewall portions LSP may be substantially equal to each other. The length of each of short-sides of the top surfaces of the first portions SP1 may be substantially equal to the thickness of each of the conductive patterns CP. In each of the pad patterns PP, the width of the first portion SP1 in the second direction may be equal to that of the second portion SP2 in the first direction.

Auxiliary pad patterns APP may extend in the first direction from one end of the conductive patterns CP. The auxiliary pad patterns APP may be spaced apart from the pad patterns PP. The auxiliary pad pattern APP may be connected to some of the second sidewall adjacent to the other end of the connecting portion CN. Among the stacked conductive patterns CP, the auxiliary pad pattern APP connected to the conductive pattern CP positioned at a relatively low level may extend further in the first direction than the auxiliary pad pattern APP connected to the conductive pattern CP positioned at a relatively high level.

Each of the auxiliary pad patterns APP may include an auxiliary flat portion AFP, and an auxiliary sidewall portion ASP extending upward from a top surface of the auxiliary flat portion AFP. The auxiliary flat portion AFP may extend in the first direction from some of the second sidewall adjacent to the other end of the connecting portion CN of the conductive pattern CP. Among the conductive patterns CP stacked on the substrate 100, the auxiliary flat portion AFP connected to the conductive pattern CP positioned at a relatively low level may have a greater length in the first direction than the auxiliary flat portion AFP connected to the conductive pattern CP positioned at a relatively high level. Therefore, the auxiliary flat portions AFP respectively connected to the conductive patterns CP stacked on the substrate 100 may have, for example, a shape of a terraced structure in which the widths of the auxiliary flat portions AFP in the first direction decrease away from the substrate 100. The stacked auxiliary flat portions AFP may have, for example, a terraced structure descending toward the first region 10 from the second region 20. The auxiliary flat portion AFP of any one of the auxiliary pad patterns APP, and the conductive pattern CP connected to the one auxiliary pad pattern APP may be positioned at the same level and may have the same thickness.

Top surfaces of the auxiliary sidewall portions ASP may be positioned at the same level from the top surface of the substrate 100. The respective auxiliary sidewall portions ASP may extend in the second direction. The width of the auxiliary sidewall portion ASP in the second direction may be equal to that of the auxiliary flat portion AFP in the second direction. The width of the auxiliary sidewall portion ASP in the first direction may be substantially equal to the thickness of the auxiliary flat portion AFP.

Any one of the conductive patterns CP, the pad pattern PP connected to the any one of the conductive patterns CP, and the auxiliary pad pattern APP connected to the any one of the conductive patterns CP may be connected to one another without any boundary surface to form one body.

Insulation patterns 120a may be disposed between the stacked conductive patterns CP. Each of the insulation patterns 120a under the uppermost insulation pattern 120a may include an insulation flat portion, and an insulation sidewall portion. The insulation flat portion may be parallel to the top surface of the substrate 100, and the insulation sidewall portion may extend upward from one end of the insulation flat portion. The insulation flat portions may be disposed between the stacked conductive patterns CP, between the stacked flat portions FP, and between the stacked auxiliary flat portions AFP. The insulation sidewall portions may be disposed between the landing sidewall portions LSP connected to the stacked conductive patterns CP, and between the auxiliary sidewall portions connected to the stacked conductive patterns CP.

A first upper insulation pattern 122a, string select lines 157, and a second upper insulation pattern 124a may be sequentially disposed on the insulation patterns 120a. The string select lines 157 may be disposed on the substrate 100 within the second region 20, and may have a line shape extending in the first direction. The string select lines 157 may be disposed spaced apart from each other in the second direction. The string select lines 157 may be disposed on the gate electrodes GE of the uppermost conductive patterns CP. The string select lines 157 may be disposed parallel to the gate electrodes GE. The number of the string select lines 157 may be equal to the number of the gate electrodes GE included in each of the conductive patterns CP. The string select lines 157 may be positioned at the same level from the top surface of the substrate 100.

The stacked conductive patterns CP, the string select lines 157 on the stacked conductive patterns CP, and the insulation patterns 120a, 122a and 124a may be included in one stack structure. The stack structure may be provided in plurality on the substrate 100. A main-device isolation pattern 160 may be disposed between one pair of stack structures adjacent to each other. The stack structures in one pair may be mirror-symmetric to each other from the main-device isolation pattern 160. The main-device isolation pattern 160 may be disposed in a main-trench 140 between the stack structures. The main-device isolation pattern 160 may be disposed on the substrate 100 at one side of the stack structures. The main-device isolation pattern 160 may include, for example, a silicon oxide layer. The stack structures may be disposed spaced apart from each other in the second direction.

Sacrificial patterns 110Lb and 110b may be disposed between the pad patterns PP and the auxiliary pad patterns APP. The stacked sacrificial patterns 110Lb and 110b may include a sacrificial flat portion positioned at the same level as the stacked conductive patterns CP from the top surface of the substrate 100, and a sacrificial sidewall portion extending upward from a top surface of the sacrificial flat portion. The sacrificial flat portion may be disposed between the flat portion FP of the pad pattern PP and the auxiliary flat portion AFP of the auxiliary pad pattern APP. The sacrificial sidewall portion may be disposed between the landing sidewall portion LSP of the pad pattern PP and the auxiliary sidewall portion ASP of the auxiliary pad pattern APP.

The flat portion of the sacrificial pattern positioned at a relatively low level among the sacrificial patterns 110Lb and 110b may have a greater width in the first direction than that of the sacrificial pattern positioned at a relatively high level.

The sacrificial flat portions of the sacrificial patterns 110Lb and 110b under the uppermost sacrificial pattern 110b may have widths decreased gradually in the first direction as the sacrificial flat portions go far from the conductive pattern CP. Each of the sacrificial sidewall portions of the sacrificial patterns 110Lb and 110b under the uppermost sacrificial pattern 110b may include at least one first portion extending in the first direction, and at least one second portion in the second direction. In this case, the width of the first portion of the sacrificial sidewall portion in the first direction may be greater than the thickness of the sacrificial flat portion.

The insulation patterns 120a, 122a and 124a may include, for example, an oxide. For example, the insulation patterns 120a, 122a and 124a may include a silicon oxide. The conductive patterns CP, the pad patterns PP, and the auxiliary pad patterns APP may include a conductive material. For example, the conductive patterns CP, the pad patterns PP, and the auxiliary pad patterns APP may include at least one of metals (e.g., tungsten, aluminum, titanium, tantalum, etc.), conductive metal nitrides (e.g., titanium nitride, tantalum nitride, etc.), and doped semiconductor materials (e.g., doped silicon, doped germanium, doped silicon germanium, etc.). The sacrificial patterns 110Lb, 110b may include a material having an etch selectivity with respect to the insulation patterns 120a, 122a and 124a. For example, the sacrificial patterns 110Lb and 110b may include a silicon nitride layer.

A semiconductor pillar 130 may penetrate the gate electrodes GE of the stacked conductive patterns CP, and the stacked insulation patterns 120a, 122a and 124a. The semiconductor pillar 130 may extend in the third direction. For example, the semiconductor pillar 130 contacts the substrate 100. The semiconductor pillar 130 may be provided in plurality on the semiconductor substrate 100. The plurality of semiconductor pillars 130 may be arranged two-dimensionally in the first and second directions. The plurality of semiconductor pillars 130 may penetrate the respective stack structures.

The semiconductor pillar 130 may include a semiconductor portion 131, a filling insulation material 132, and a drain portion 133. The semiconductor portion 131 may cover a sidewall of a channel opening 125 penetrating the stacked gate electrodes GE and the stacked insulation patterns 120a, 122a and 124a. The filling insulation material 132 may fill a region enclosed by the semiconductor portion 131 in the channel opening 125. The drain portion 133 may fill an upper region of the channel opening 125. The semiconductor portion 131 and the drain portion 133 may include, for example, a single crystalline or polycrystalline semiconductor. The drain portion 133 may be a region doped with a second-type dopant.

An information storage layer 150 may be disposed between the semiconductor pillars 130 and the gate electrodes GE. The information storage layer 150 may be formed in a multi-layer structure, which will be described with reference to FIG. 3.

Figure 3:
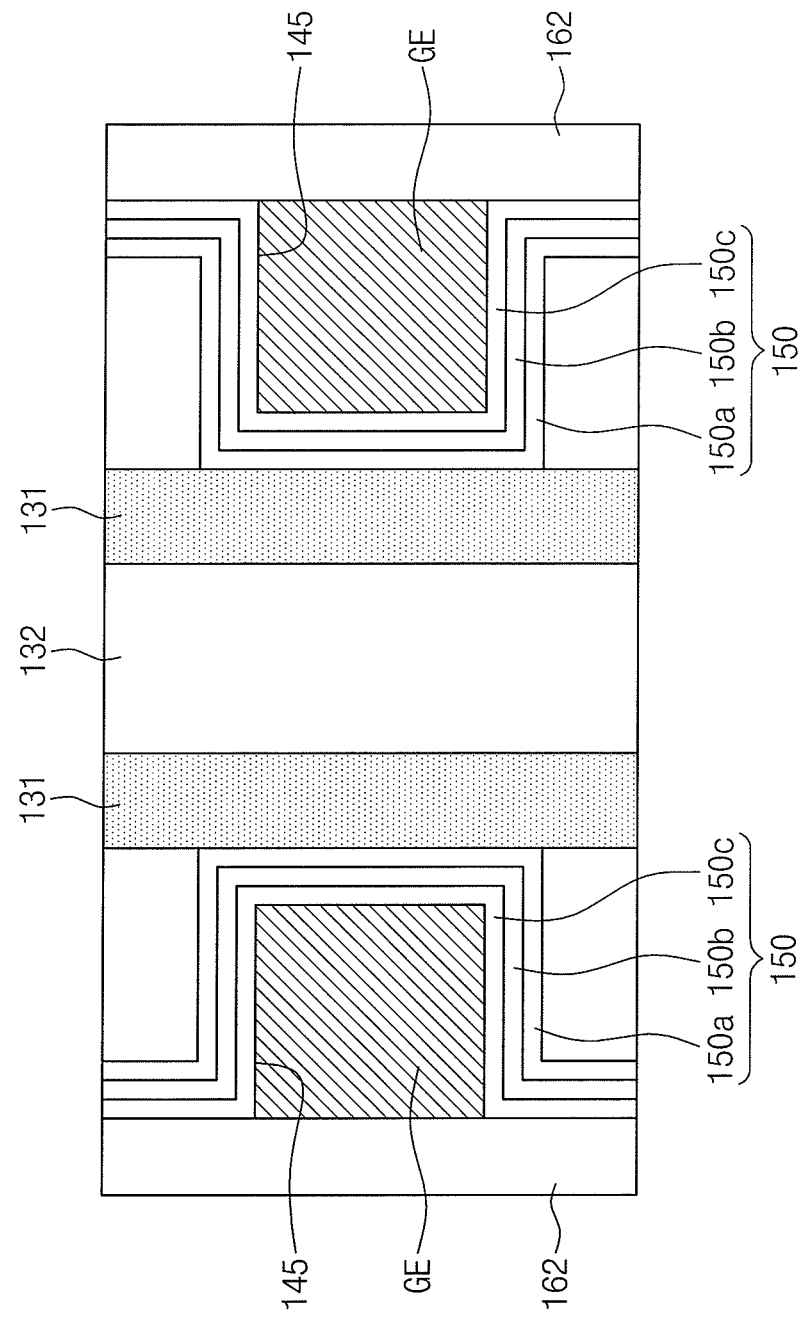
FIG. 3 is an enlarged view of portion I of FIG. 1 for describing an information storage layer included in a semiconductor device according to an embodiment of the inventive concept.

FIG. 3 is an enlarged view of portion I of FIG. 1 for describing an information storage layer included in a semiconductor device according to the first embodiment of the inventive concept.

The information storage layer 150 may include a tunnel dielectric layer 150a, a charge storage layer 150b, and a blocking layer 150c. The tunnel dielectric layer 150a may be formed so as to cover a sidewall of the semiconductor pillar 130. The tunnel dielectric layer 150a may have a single layer structure or a multilayer structure. For example, the tunnel dielectric layer 150a may include at least one selected from the group consisting of a silicon oxynitride layer, a silicon nitride layer, a silicon oxide layer and a metal oxide layer.

The charge storage layer 150b may be spaced apart from the semiconductor pillar 130 by the tunnel dielectric layer 150a. The charge storage layer 150b may include charge trap sites, which can store charges. For example, the charge storage layer 150b may include at least one selected from the group consisting of a silicon nitride layer, a metal nitride layer, a metal oxynitride layer, a metal silicon oxide layer, a metal silicon oxynitride layer, and nanodots.

The blocking layer 150c may cover the charge storage layer 150b. The blocking layer 150c may include, for example, at least one selected from the group consisting of a silicon oxide layer, a silicon nitride layer, a silicon oxynitride layer and a high-k dielectric layer. The high-k dielectric layer may include, for example, at least one selected from the group consisting of a metal oxide layer, a metal nitride layer, and a metal oxynitride layer. The high-k dielectric layer may include, for example, hafnium (Hf), zirconium (Zr), aluminum (Al), tantalum (Ta), lanthanum (La), cerium (Ce), praseodymium (Pr) or the like. A dielectric constant of the blocking layer 150c may be higher than that of the tunnel dielectric layer 150a.

The information storage layer 150 positioned between the gate electrodes GE and the semiconductor pillar corresponds to a data storage element of the memory cell. The information storage layer 150 between the lowermost gate electrode GE and the semiconductor pillar 130 may be included in the gate insulation layer of the lower select transistor, and the information storage layer 150 between the string select line 157 and the semiconductor pillar 130 may be included in the gate insulation layer of the upper select transistor.

Each of the semiconductor pillars 130, the gate electrodes enclosing each of the semiconductor pillars 130, and the information storage layer disposed between each of the semiconductor pillars 130 and the gate electrodes GE are included in one vertical type cell string. The vertical type cell string may include a lower select transistor, a plurality of memory cells and an upper select transistor which are connected in series and stacked. Among the gate electrodes GE, the lowermost gate electrode GE corresponds to a gate of the lower select transistor, and the string select line 157 corresponds to a gate of the upper select transistor. The gate electrodes GE between the lowermost gate electrode GE and the string select line 157 correspond to gates of the memory cells, respectively.

A common source region may be disposed in the substrate 100 under the main-device isolation pattern 160 and the sub-device isolation pattern 162. The common source region may have a line shape extending in the first direction. The common source region may be a region doped with the second-type dopant. The lowermost gate electrodes GE may control an electrical connection between the common source region and the semiconductor pillar 130.

A cell contact plug 174 may be provided on the first portion SP1 of the landing sidewall portion LSP of the pad pattern PP. The cell contact plug 174 may contact the first portion SP1 of the landing sidewall portion LSP. The cell contact plug 174 may penetrate a capping insulation pattern 138 covering the second upper insulation pattern 124a. The widths of the cell contact plug 174 in the first and second directions may be greater than the width of the first portion SP1 of the landing sidewall portion LSP in the second direction. The cell contact plug 174 may be provided in plurality on the landing sidewall portions LSP. Since the widths in the first direction of the first portions SP1 of the landing sidewall portions LSP connected to the cell contact plug 174 are greater than the thickness of the conductive pattern CP, a margin may be secured between the cell contact plugs 174 respectively connected to the landing sidewall portions LSP adjacent to each other. Due to this, a semiconductor device with high reliability may be realized. A conductive wiring 184 connected to the cell contact plug 174 may be provided.

A bit line 182 may be electrically connected to drain portions 133 of the semiconductor pillars 130 through bit line contact plugs 172 penetrating a capping insulation pattern 138 covering the second upper insulation pattern 124a. The string select lines 157 may control an electrical connection between the bit line 182 and the vertical type cell string. The bit line 182 extends in the second direction. That is, the bit line 182 crosses the gate electrodes GE. The bit line 182 may be provided in plurality. The bit lines 182 may be parallel to each other. One bit line 182 may be electrically connected to the plurality of drain portions 133 formed in the plurality of semiconductor pillars 130 arranged in the second direction to form one row.

A method of fabricating a semiconductor device according to the first embodiment of the inventive concept will be described. FIGS. 4A to 4I are perspective views for describing a method of fabricating a semiconductor device according to the first embodiment of the inventive concept.

Referring to FIG. 4A, a substrate 100 including a first region 10 and a second region 20 is provided. A pattern structure 107 may be formed on the substrate 100 in the first region 10. The pattern structure 107 may include an intaglio pattern 108. The width of the intaglio pattern 108 in a second direction may be decreased gradually as the intaglio pattern 108 extends toward a first direction. The first direction and the second direction are parallel to the top surface of the substrate 100 and may cross each other. The first direction may be an x-axis direction and the second direction may be a y-axis direction. One side of the intaglio pattern 108 adjacent to the second region 20 may be opened.

The pattern structure 107 may be formed by forming an insulation layer on an entire surface of the substrate 100 and patterning the insulation layer. Alternatively, the pattern structure 107 may be formed by etching the substrate 100. In this case, the pattern structure 107 and the substrate 100 may be connected to each other without any boundary surface to thus form one body.

The intaglio pattern 108 may include first sidewalls parallel to the first direction, and second sidewalls parallel to the second direction. The height of the first sidewalls of the intaglio pattern 108 may be substantially equal to that of the second sidewalls of the intaglio pattern 108. The intaglio pattern 108 may include one pair of first sidewalls facing each other. The first sidewalls in one pair facing each other may be defined as 'first sidewall-pair'. The intaglio pattern 108 may include a plurality of first sidewalls-pairs. Among the first sidewall-pairs, the distance between the first sidewalls included in the first sidewall-pair relatively close to the second region 20 may be greater than the distance between the first sidewalls included in the first sidewall-pair relatively distant from the second region 20.

A buffer dielectric layer 109 covering the top surface of the substrate 100 may be formed. For example, the buffer dielectric layer 109 may include a silicon oxide layer formed by a thermal oxidation process.

Figure 4B:
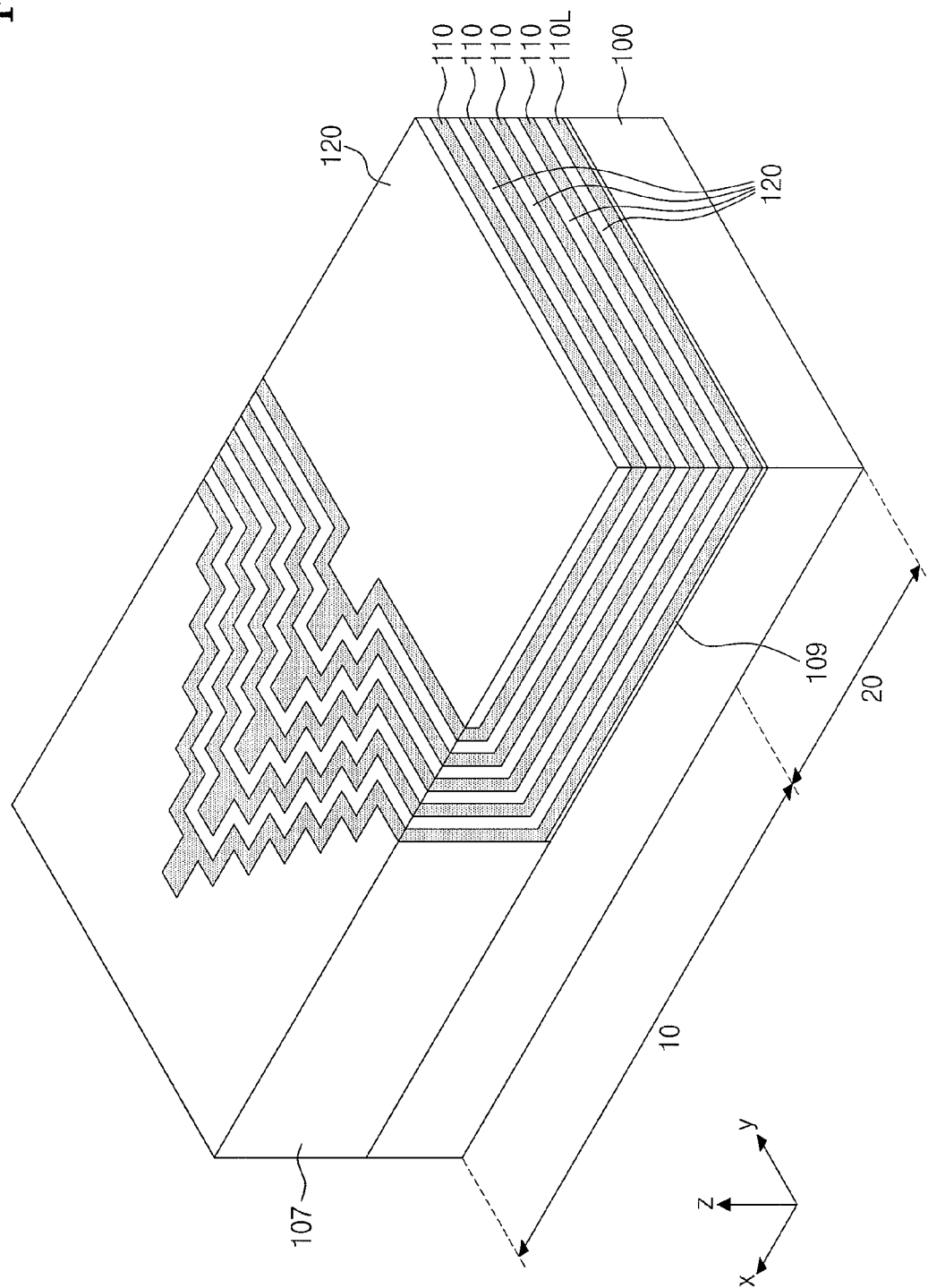

Referring to FIG. 4B, after the pattern structure 107 is formed, first material layers, and second material layers including a different material from the first material layers may be alternatingly and repeatedly stacked on the entire surface of the substrate 100. The first material layers may be sacrificial layers 110L, 110, and the second material layers may be insulation layers 120. After the sacrificial layers 110L, 110 are stacked, a planarization process using a top surface of the pattern structure 107 as an etch stop layer may be performed.

The sacrificial layers 110L, 110 may be formed of a material having an etch selectivity with respect to the insulation layers 120. For example, the insulation layers 120 may be formed of an oxide, and the sacrificial layers 110L, 110 may include a nitride and/or an oxynitride, etc. The sacrificial layers 110L, 110 may be formed of the same material. Likewise, the insulation layers 120 may be formed of the same material.

The sacrificial layers 110L, 110 may be formed with the same thickness. Unlike this, among the sacrificial layers 110L, 110, the lowermost sacrificial layer 110L may be formed thicker than the sacrificial layers 110 disposed on the lowermost sacrificial layer 110L. In this case, the sacrificial layers 110 disposed on the lowermost sacrificial layer 110L may be formed with the same thickness.

Each of the sacrificial layers 110L, 110 may includes a flat portion parallel to the top surface of the substrate 100, and a sidewall portion extending from one end of the flat portion. The sidewall portion may include at least one first portion extending in the first direction, and at least one second portion extending in the second direction. Among the stacked sacrificial layers 110L, 110, the number of the first and second portions of the sacrificial layers positioned at a relatively low level may be greater than the number of the first and second portions of the sacrificial layers positioned at a relatively high level. In plan view, top surfaces of the first portions of the sidewall portions of the sacrificial layers 110L, 110 may have, for example, a substantially rectangular shape having a long-side in the first direction. The long-side of the top surfaces of the first portions may be longer than the distance between the top surfaces of the first portions adjacent to each other.

Each of the insulation layers 120 may includes a flat portion parallel to the top surface of the substrate 100, and a sidewall portion extending from one end of the flat portion. The sidewall portion of at least one of the insulation layers 120 may include at least one first portion extending in the first direction, and at least one second portion extending in the second direction. Among the stacked insulation layers 120, the number of the first and second portions of the insulation layers positioned at a relatively low level may be greater than the number of the first and second portions of the sacrificial layers positioned at a relatively high level.

Figure 4C:
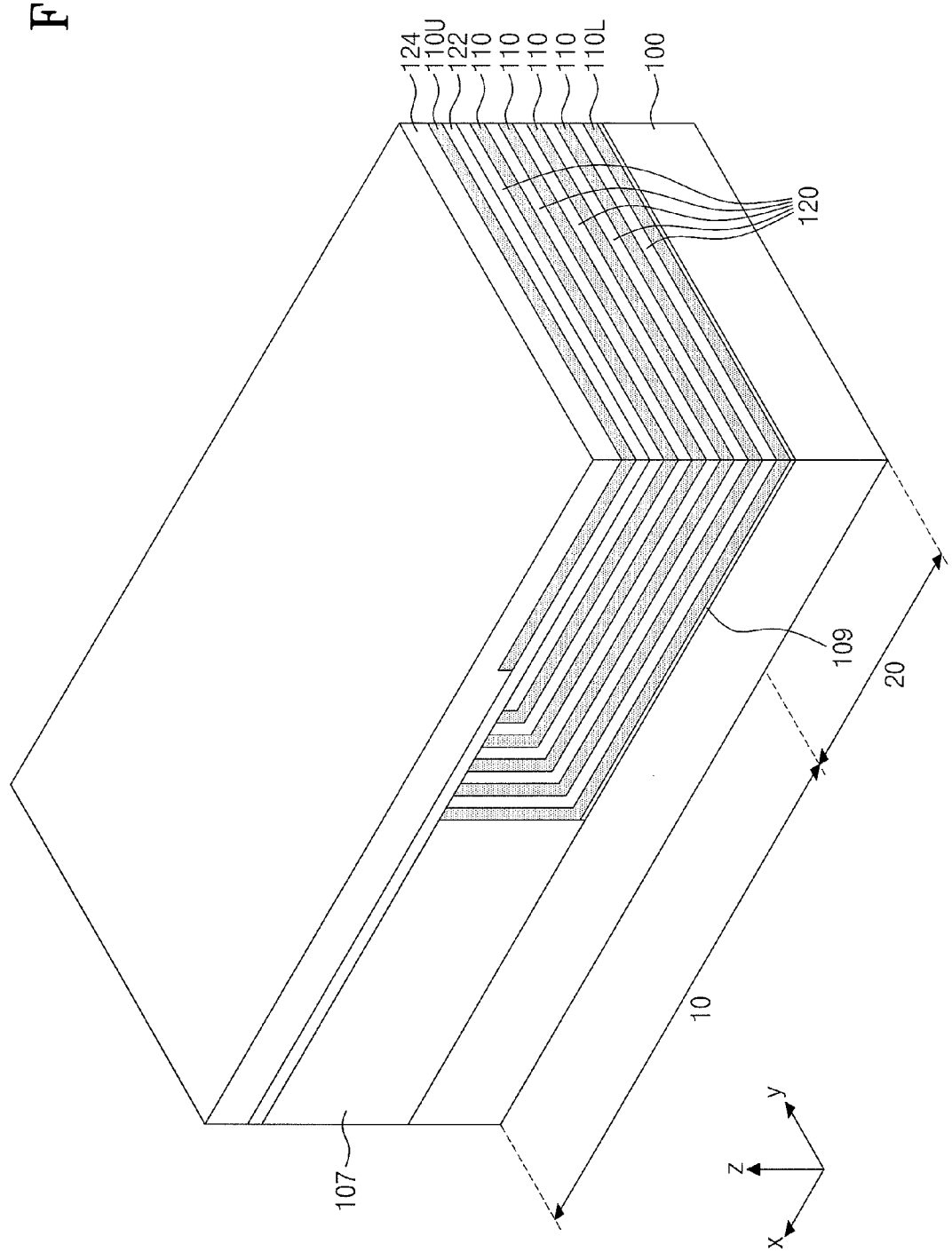

Referring to FIG. 4C, a first upper insulation layer 122, an uppermost sacrificial layer 110U and a second upper insulation 124 may be sequentially formed. The uppermost sacrificial layer 110U may be formed by forming a material layer on the first upper insulation layer 122 and patterning the material layer using the first upper insulation layer as an etch stop layer. In this case, the material layer may include the same material as the sacrificial layers 110L, 110, and a portion of the material layer removed by the patterning may be a portion covering sidewalls of the sacrificial layers 110L, 110. That is, the remaining uppermost sacrificial layer 110U may be disposed on the substrate in the second region 20 while covering the flat portions of the sacrificial layers 110L, 110. The uppermost sacrificial layer 110U may be parallel to the top surface of the substrate 100. The uppermost sacrificial layer 110U may be thicker than the sacrificial layers 110 between the lowermost sacrificial layer 110L and the uppermost sacrificial layer 110U. The first and second upper insulation layers 122 and 124 may include the same material as the insulation layers 120.

Figure 4D:
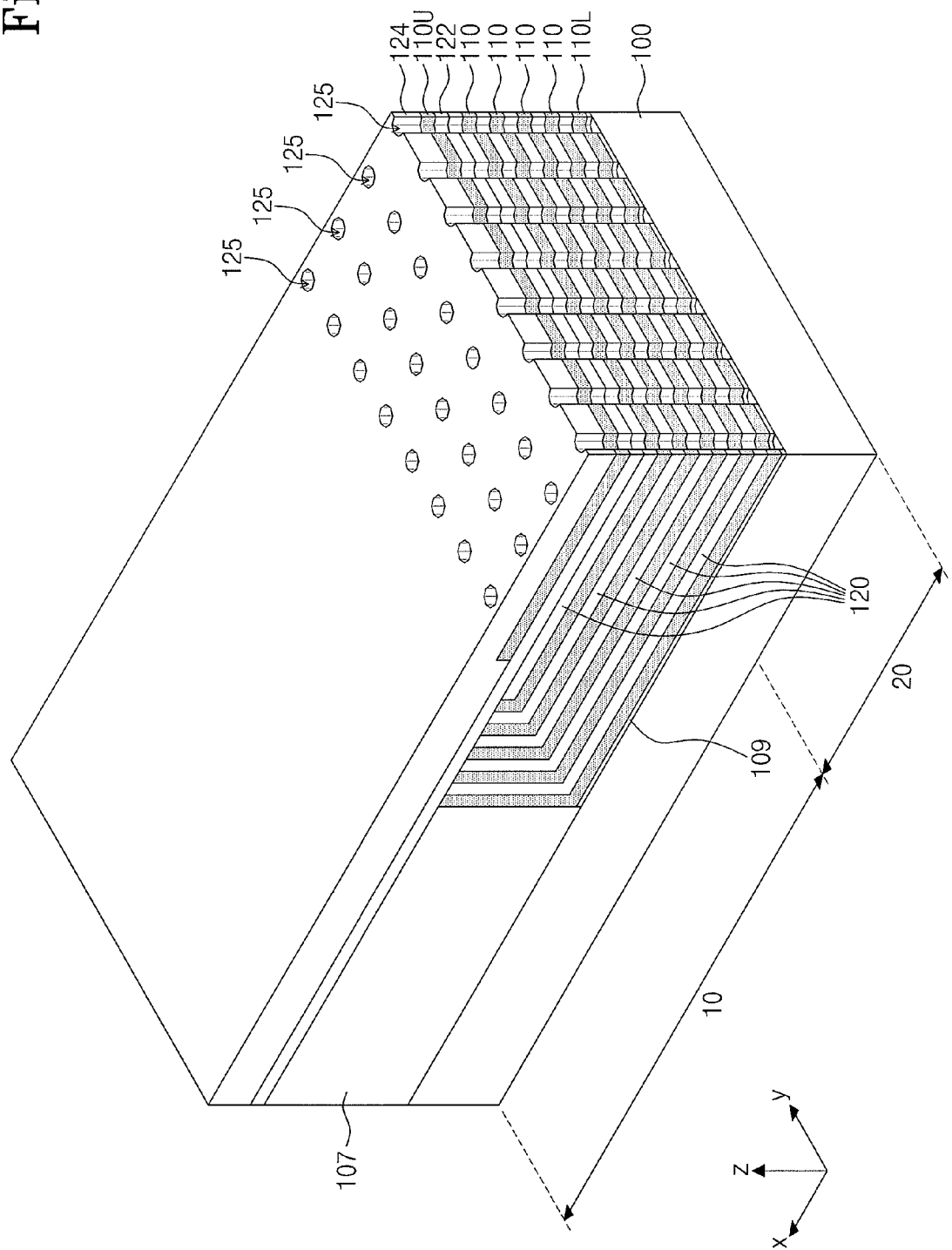

Referring to FIG. 4D, channel openings 125 exposing the top surface of the substrate 100 may be formed by, for example, continuously patterning the buffer dielectric layer 109, the insulation layers 120 and the upper insulation layers 122 and 124. The channel openings 125 may penetrate the flat portions of the sacrificial layers 110L, 110. The channel openings 125 may be formed by using, for example, an anisotropic etching process. The channel openings 125 may have, for example, a hole shape. The channel openings 125 may be spaced apart from one another. The channel openings 125 may be arranged, for example, two-dimensionally in the first direction and the second direction. The channel openings 125 may have, for example, a circular, elliptical, or polygonal shape in plan view.

Figure 4E:
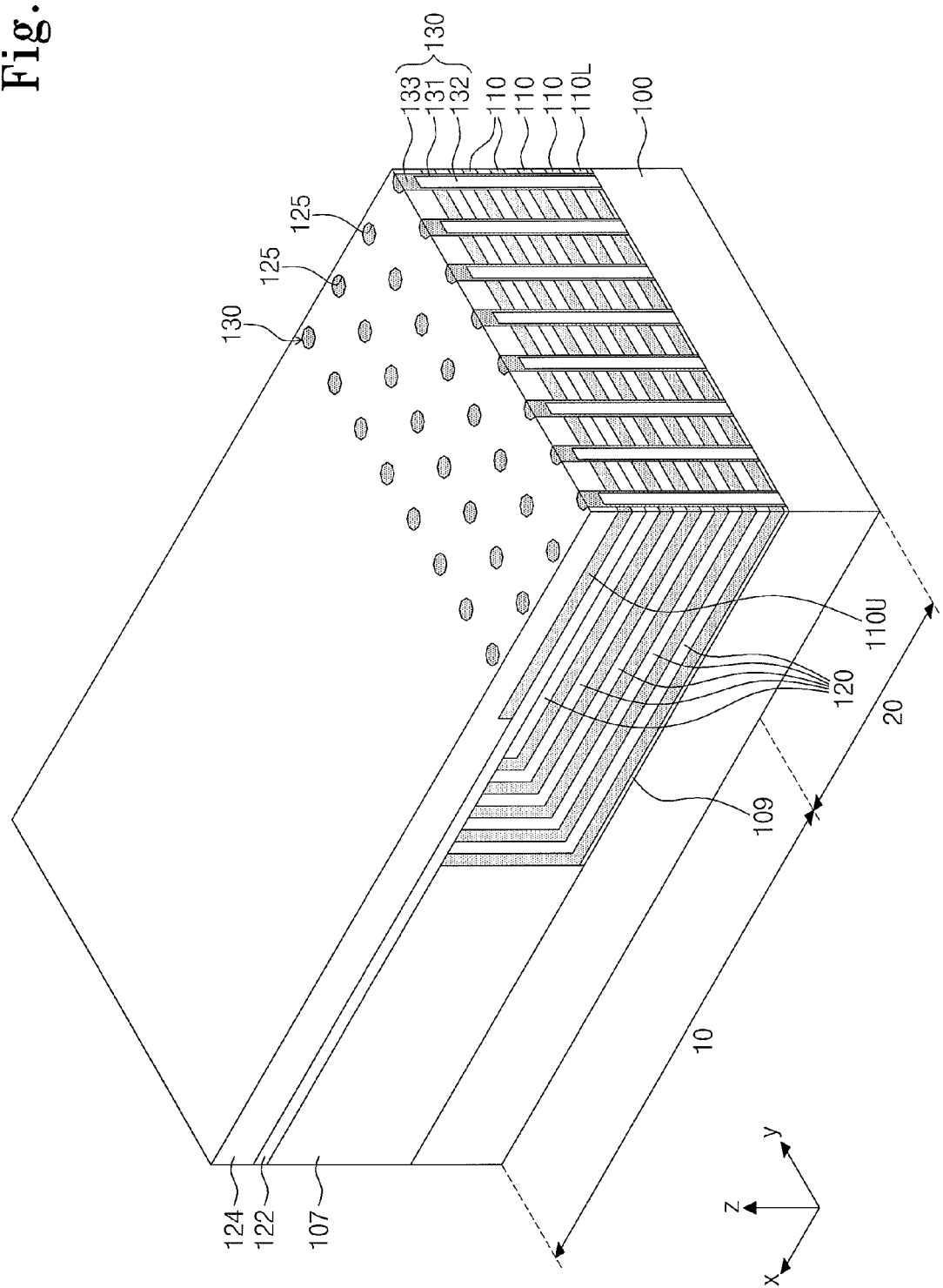

Referring to FIG. 4E, semiconductor pillars 130 filling the channel openings 125, respectively may be formed. Each of the semiconductor pillars 130 may include a semiconductor portion 131 adjacent to a sidewall of the channel opening 125, a filling insulation material 132 filling a region enclosed by the semiconductor portion 131 in the channel opening 125, and a drain portion 133 filling an upper region of the channel opening 125. The semiconductor portion 131 and the drain portion 133 may include, for example, a single crystalline or polycrystalline semiconductor. The drain portion 133 may be a region doped with, for example, a second-type dopant.

Figure 4F:
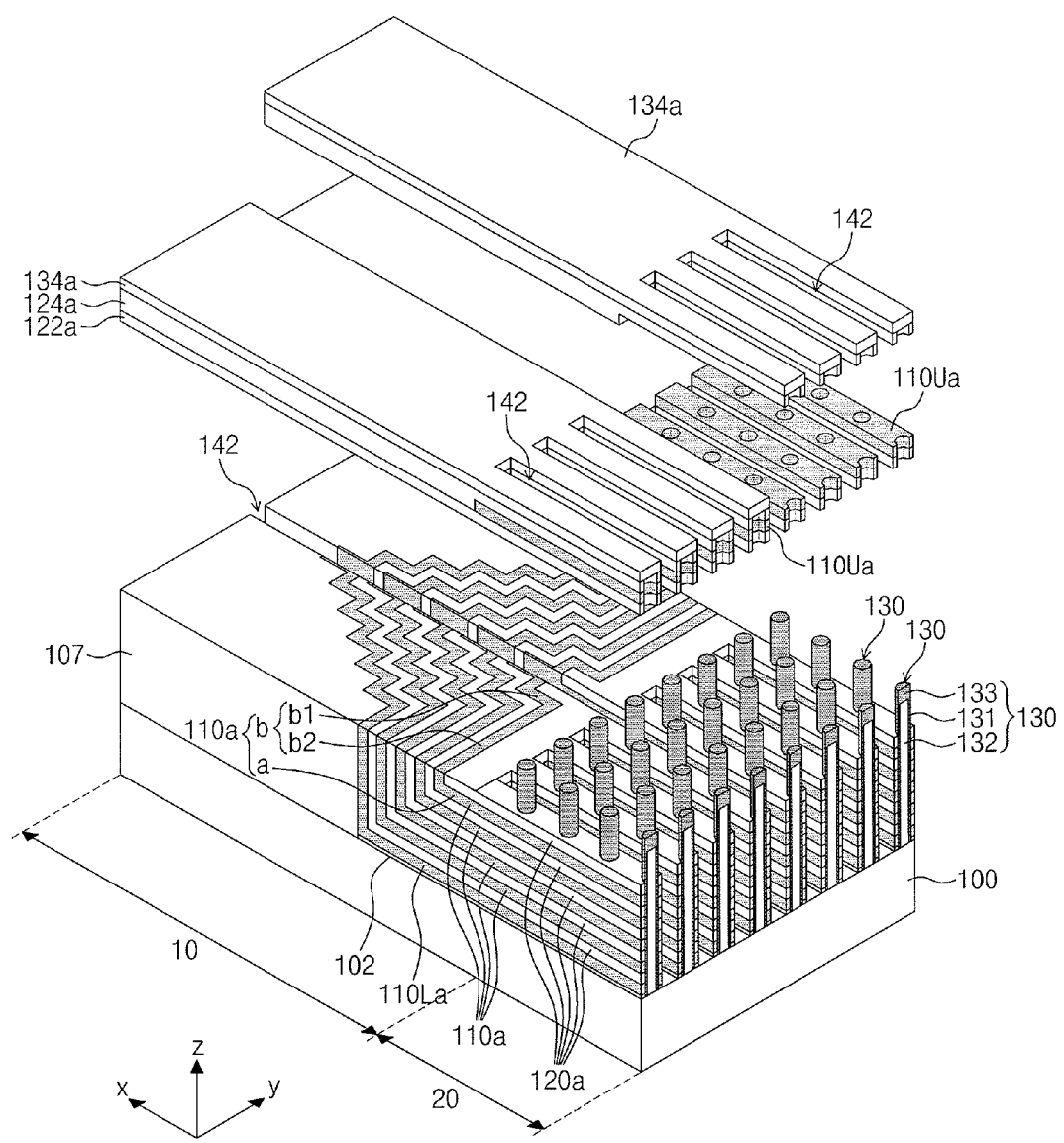

Referring to FIG. 4F, a capping insulation layer may be formed on the substrate 100 having the semiconductor pillars 130. The capping insulation layer may be formed of the same material as the insulation layers 120. A main-trench 140 and sub-trenches 142 may be formed on the substrate 100 by, for example, continuously patterning the pattern structure 107, the upper insulation layers 122, 124, the capping insulation layer, the insulation layers 120, and the sacrificial layers 110L, 110, 110U. The main-trench 140 may be disposed on the substrate 100 in the first and second regions 10 and 20, and the sub-trenches 142 may be disposed on the substrate 100 in the second region 20. The length of the main-trench 140 in the first direction may be longer than the length of the sub-trench 142. The main-trench 140 and the sub-trenches 142 may be formed by, for example, an anisotropic etching process using a dry and/or etching process.

The main-trench 140 may define preliminary stack structures having sacrificial patterns 110La, 110a, 110Ua and insulation patterns 120a, 124a, 134a which are stacked alternatingly and repeatedly. The main-trench 140 may extend in the first direction, and the preliminary stack structures may be mirror-symmetric about the main-trench 140.

The sub-trenches 142 may extend in the first direction and define some portions of the preliminary stack structures through which the semiconductor pillars 130 penetrate as a line shape extending in the first direction.

Each of the sacrificial patterns 110La, 110a under the uppermost sacrificial pattern 110Ua may include a flat portion 'a' parallel to the top surface of the substrate 100, and a sidewall portion 'b' extending from one end of the flat portion 'a'. The sidewall portion 'b' of each of the sacrificial patterns 110La, 110a may include at least one first portion 'b1' extending in the first direction, and at least one second portion 'b2' extending in the second direction. In plan view, top surfaces of the first portions 'b1' of the sidewall portions 'b' of the sacrificial layers 110L, 110 may have, for example, a substantially rectangular shape having a long-side in the first direction. The long-sides of the top surfaces of the first portions 'b1' may be longer than the distance between the tops surfaces of the first portions 'b1' adjacent to each other. The uppermost sacrificial pattern 110Ua may have, for example, a line shape extending in the first direction.

The semiconductor pillars arranged in the first direction form one row, and the semiconductor pillars arranged in the second direction form one column. A plurality of rows and a plurality of columns may be disposed on the semiconductor substrate 100. Each of the sub-trenches 142 is preferably disposed between the columns in one pair adjacent to each other.

Sidewalls of the sacrificial patterns 110La, 110a, 110Ua and sidewalls of the insulation patterns 120a, 122a, 124a, 134a may be exposed by the sidewalls of the main-trench 140 and the sub-trenches 142.

A common source region may be formed in the substrate 100 under bottom surfaces of the main- and/or sub-trenches 140 and 142. The common source region may have, for example, a line shape extending in the first direction. The common source region is a region doped with a second-type dopant. The common source region may be formed by, for example, implanting second-type dopant ions into the substrate 100.

Figure 4G:
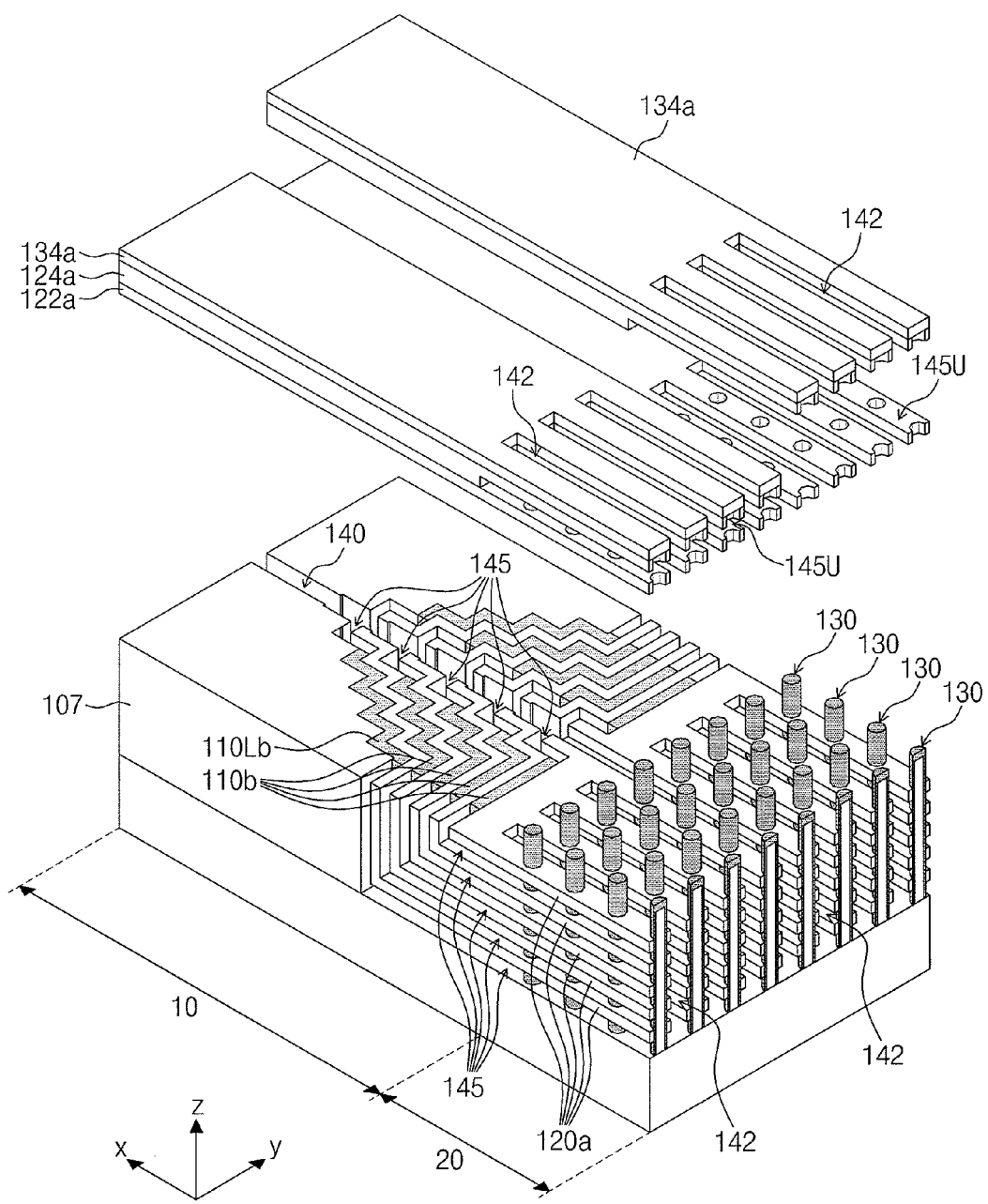

Referring to FIG. 4G, an uppermost recess region 145U may be formed by performing, for example, a selective etching process to completely remove the uppermost sacrificial pattern 110Ua. Recess regions 145 may be formed by removing some portion of the sacrificial patterns 110La, 110a under the uppermost sacrificial pattern 110Ua and remaining the other portion.

The first portions of the sidewalls of the sacrificial patterns 110La, 110a exposed by the main-trench 140 may be at least removed. After the selective etching process, the remaining sacrificial patterns 110Lb, 110b may be left.

The selective etching process may be, for example, an isotropic etching process. The selective etching process may be performed by, for example, a wet etching and/or an isotropic dry etching, etc. The etch rate of the sacrificial patterns 110La, 110a, 110Ua by the selective etching process may be greater than the etch rate of the insulation patterns 120a, 122a, 124a and the semiconductor pillars 130 by the selective etching process. Therefore, after the selective etching process is performed, the insulation patterns 120a, 122a, 124a and the semiconductor pillar 130 may be left. The buffer dielectric layer 109 which is thinner than the insulation patterns 120a, 122a, 124a may be removed during the selective etching process. Unlike this, the buffer dielectric layer 109 may be left. Hereinafter, for the convenience of the description, a case where the buffer dielectric layer 109 is removed will be described.

The recess regions 145, 145U may expose some portions of the sidewall of the semiconductor pillar 130 contacting the sacrificial patterns 110La, 110a, 110Ua, respectively.

Figure 4H:
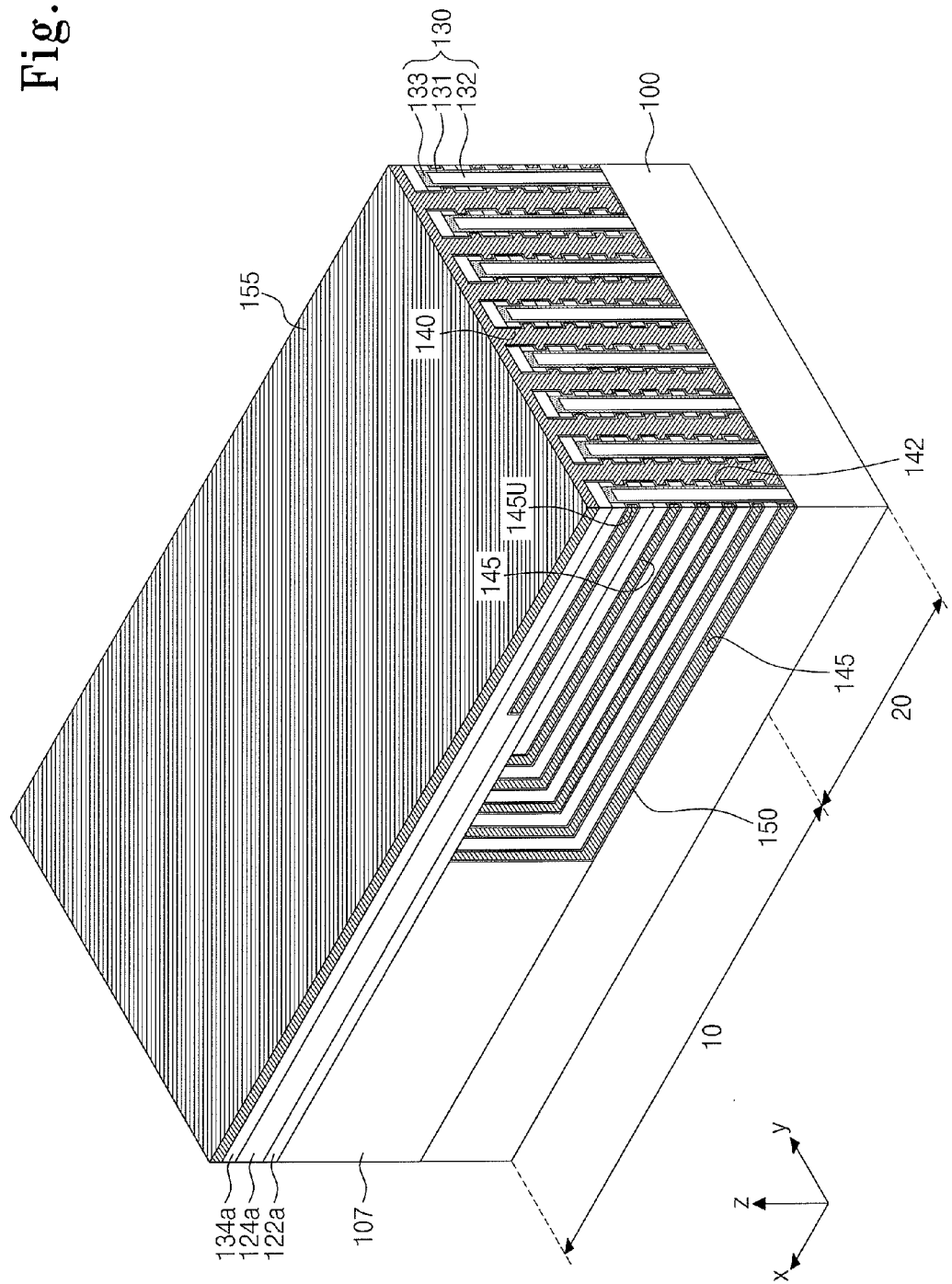

Referring to FIG. 4H, after the recess regions 145, 145U are formed, an information storage layer 150 may be formed on the substrate 100. The information storage layer 150 may be formed by using, for example, a deposition technique (e.g., a chemical vapor deposition or atomic layer deposition, etc.) capable of providing superior step coverage. By doing so, the information storage layer 150 may be formed conformally. The information storage layer 150 may be formed with a substantially uniform thickness along inner surfaces of the recess regions 145, 145U. The information storage layer 150 may fill some portions of the recess regions 145, 145U. The forming of the information storage layer 150 may include sequentially forming the tunnel dielectric layer 150a, the charge storage layer 150b, and the blocking layer 150c, which is described with reference to FIG. 3.

After the information storage layer 150 is formed, a gate conductive layer 155 may be formed over the substrate 100. The gate conductive layer 155 may fill the recess regions 145, 145U. The gate conductive layer 155 may fill some or the entire regions of the main- and sub-trenches 140, 142. The gate conductive layer 155 may be electrically isolated by the information storage layer 150 from the semiconductor pillar 130 and the substrate 100. The gate conductive layer 155 may include, for example, at least any one selected from the group consisting of metal, metal silicide, conductive metal nitride and doped semiconductor material.

Figure 4I:
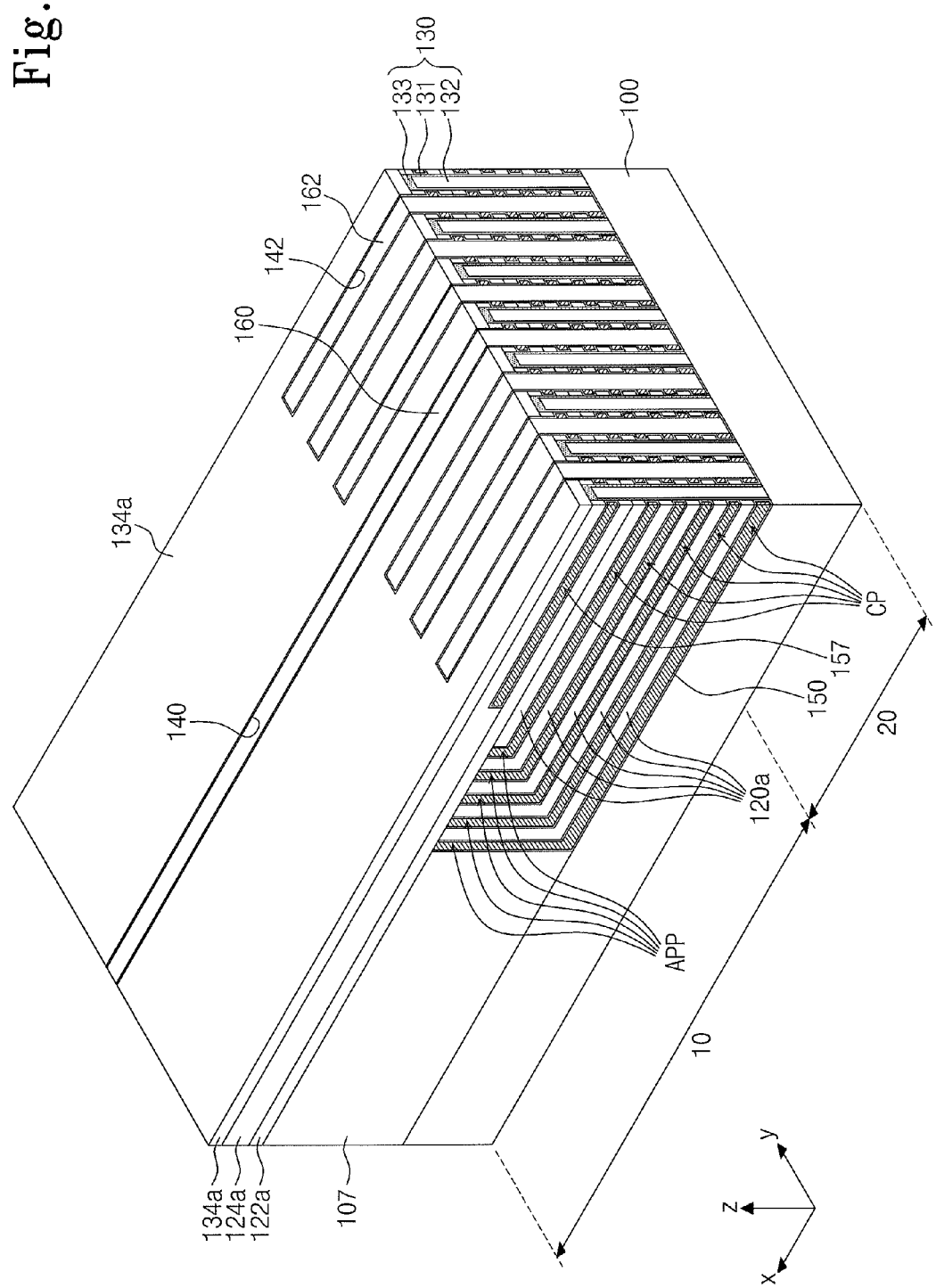

Referring to FIG. 4I, after the gate conductive layer 155 is formed, the gate conductive layer 155 positioned outside the recess regions 145, 145U is removed such that conductive patterns CP, pad patterns PP and auxiliary pad patterns APP, and a string select line 157 which are described with reference to FIGS. 1, 2A and 2B, may be formed in the recess regions 145, 145U. The first portions SP1 of landing sidewall portions LSP may fill some portions of the recess regions 145 formed by removing first portions 'b1' of sidewall portions 'b' of the sacrificial patterns 110La, 110a. The gate conductive layer 155 positioned outside the recess regions 145, 145U may be removed by, for example, a wet etching and/or dry etching process, etc.

The stacked conductive patterns CP, the string select lines 157 over the stacked conductive patterns CP, and the insulation patterns 120a, 122a, 124a may define one stack structure. The stack structures may be mirror-symmetric to each other about the main-trench 140. The stack structures mirror-symmetric to each other may be provided in plurality on the substrate 100.

The conductive patterns CP and the string select lines 157 correspond to some portions of the gate conductive layers 155 positioned within the recess regions 145, 145U. Among the conductive patterns CP, the lowermost conductive pattern CP may correspond to a gate of a lower select transistor, and the string select line 157 may correspond to a gate of an upper select transistor. The conductive patterns CP between the lowermost conductive pattern CP and the string select line 157 may correspond to control gates of memory cells, respectively.

Main- and sub-device isolation patterns 160 and 162 filling the main- and sub-trenches 140 and 142 may be formed, respectively. The forming of the main- and sub-device isolation patterns 160 and 162 may include, for example, forming a device isolation layer on the substrate 100, and performing a planarization process using a top surface of the capping insulation pattern 134a as an etch stop layer. For example, the main- and sub-device isolation patterns 160 and 162 may be formed of a high density plasma oxide layer, a spin on glass (SOG) layer, and/or a chemical vapor deposition (CVD) layer, etc.

Referring to FIGS. 1, 2A and 2B again, a bit line contact plug 172 and a cell contact plug 174 penetrating the capping insulation pattern 134a may be formed. The bit line contact plug 172 may be connected to a drain portion 133 of the semiconductor pillar 130. The plurality of cell contact plugs 174 may be connected to the first portions SP1 of the landing sidewall portions LSP, respectively. The bit line contact plug 172 and the cell contact plug 174 may be formed by forming contact holes penetrating the capping insulation pattern 134a to expose the drain portions 133 and the first portions SP1 of the landing sidewall portions LSP and filing the contact holes with a conductive layer. A bit line 182 connected to the bit line contact plug 172 and extending in the second direction, and a conductive wiring 184 connected to the cell contact plug 174 may be formed.

Figure 5:
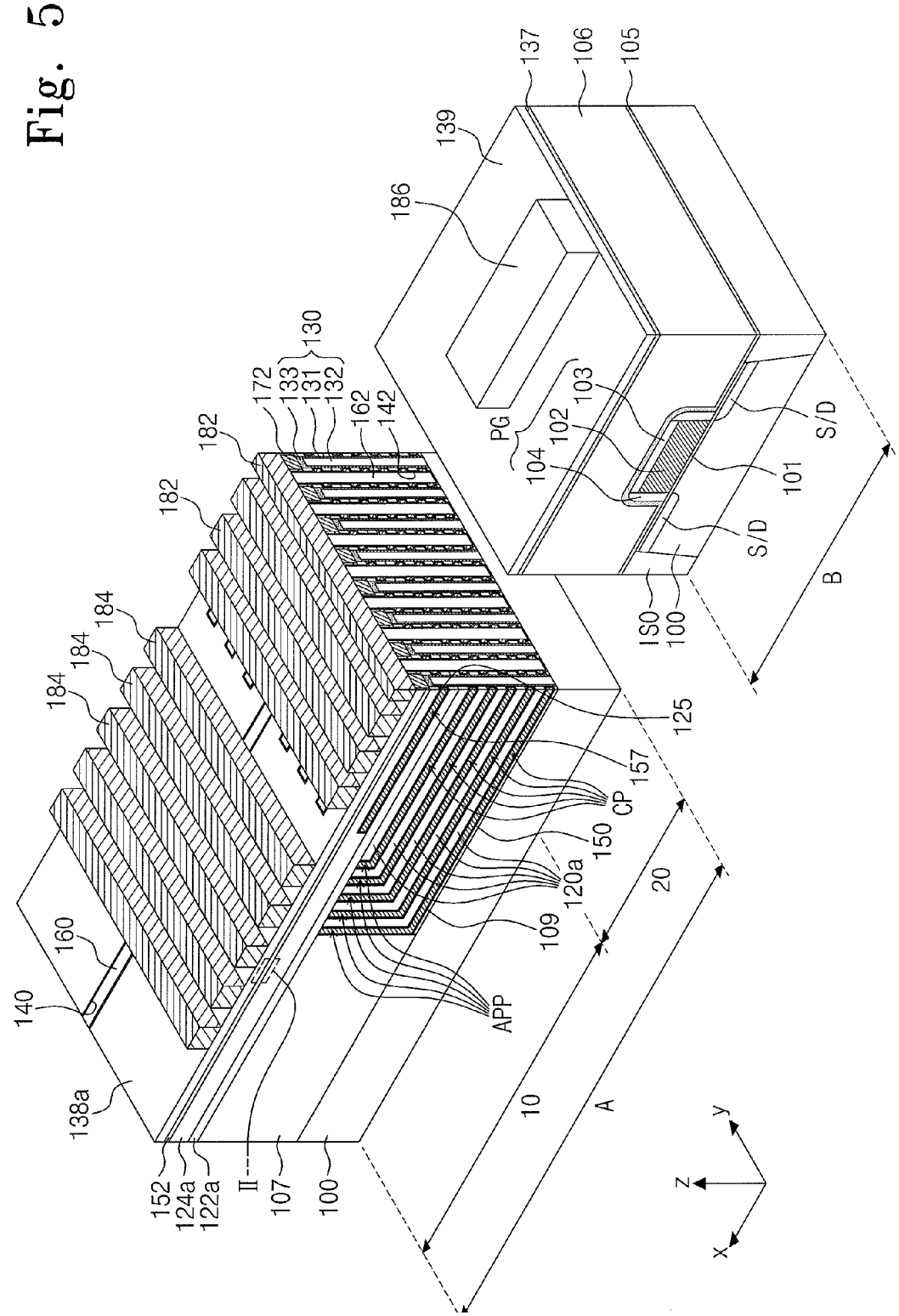
FIG. 5 is a perspective view illustrating a semiconductor device according to an embodiment of the inventive concept.

A semiconductor device according to a second embodiment of the inventive concept will now be described. FIG. 5 is a perspective view illustrating a semiconductor device according to a second embodiment of the inventive concept.

Referring to FIG. 5, a substrate may include a cell region 'A' and a peripheral region 'B' spaced apart from each other. The cell region 'A' may be a region where a memory cell array is formed, and the peripheral region 'B' may be a region where a peripheral circuit is formed. The cell region 'A' may include a first region 10 and a second region 20. The first and second regions 10 and 20 may be the first and second regions 10 and 20 described with reference to FIGS. 1, 2A and 2B. The pattern structure 107 described with reference to FIGS. 1, 2A and 2B may be disposed on the substrate 100 within the first region 10.

A stack structure including conductive patterns CP stacked on the substrate 100 within the cell region 'A', string select lines 157 on the stacked conductive patterns CP, and insulation patterns 120a, 122a, 124a may be disposed on the substrate 100 within the cell region 'A'. The stack structure may be the stack structure described with reference to FIGS. 1, 2A and 2B.

Pad patterns PP described with reference to FIGS. 1, 2A and 2B may extend in the first direction from one end of the conductive patterns CP. Auxiliary pad patterns described with reference to FIGS. 1, 2A and 2B may be spaced apart from the pad patterns PP and extend in the first direction from one end of the conductive patterns CP, respectively. Sacrificial patterns 110Lb, 110b described with reference to FIGS. 1, 2A and 2B may be disposed between the pad pattern PP and the auxiliary pad pattern APP.

A semiconductor pillar 130 may penetrate the gate electrodes GE of the stacked conductive patterns CP, and the insulation patterns 120a, 122a and 124a. The semiconductor pillar 130 may be the semiconductor pillar 130 according to the first embodiment of the inventive concept described with reference to FIGS. 1, 2A and 2B.

Figure 6:
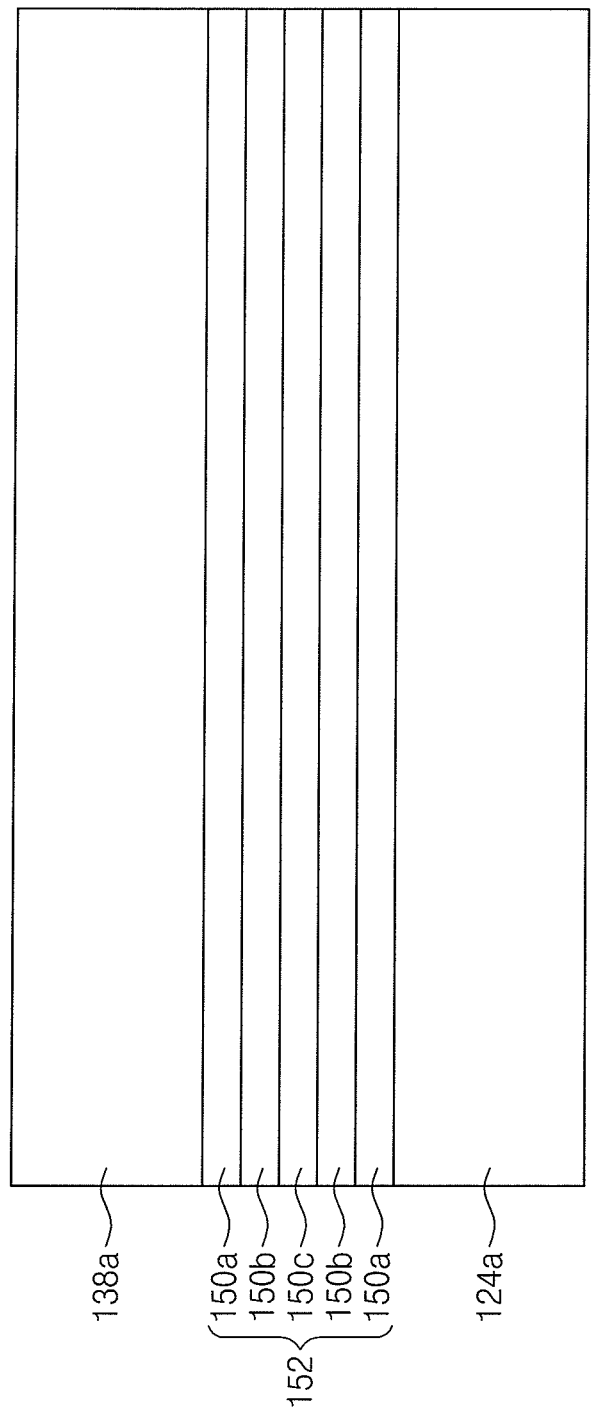
FIG. 6 is an enlarged view of portion II of FIG. 5 for describing a barrier layer included in a semiconductor device according to an embodiment of the inventive concept.

A barrier layer 152 and a capping insulation pattern 138a may be sequentially stacked on the stack structure. The barrier layer 152 may include the same material as the information storage layer 150, which will be described with reference to FIG. 6. FIG. 6 is an enlarged view of portion II of FIG. 5 for describing a barrier layer included in a semiconductor device according to the second embodiment of the inventive concept.

Referring to FIG. 6, The barrier layer 152 may include the same material as the information storage layer 150. The barrier layer 152 may include a tunnel dielectric layer 150a, a charge storage layer 150b, a blocking layer 150c, a charge storage layer 150b and a tunnel dielectric layer 150a which are stacked sequentially on the upper insulation layer 124a. The tunnel dielectric layer 150a, the charge storage layer 150b and the blocking layer 150c may include the same material as the tunnel dielectric layer 150a, the charge storage layer 150b and the blocking layer 150c described with reference to FIG. 3, respectively.

Bit line contact plugs 172 and cell contact plugs 174 penetrating the capping insulation pattern 138a and the barrier layer 152 may be disposed. The cell contact plugs 174 may be connected to the landing sidewall portions LSP, and the bit line contact plugs 172 may be connected to drain portions 133 of the semiconductor pillars 130. Conductive wirings 184 and bit lines 182 connected to the cell contact plugs 174 and the bit line contact plugs 172 may be disposed, respectively.

A peripheral device isolation pattern ISO may be formed in the substrate 100 in the peripheral region 'B' to define a peripheral active region in the peripheral region 'B'. The peripheral active region may be a portion enclosed by the peripheral device isolation pattern ISO. The peripheral active region may include a channel region, and a channel may be formed in the channel region while the semiconductor device operates.

A peripheral gate insulation layer 101 may be disposed on the peripheral active region. The peripheral gate insulation layer 101 may include, for example, a silicon oxide layer. A peripheral gate pattern PG may be disposed on the peripheral gate insulation layer 101. The peripheral gate pattern PG may include a peripheral gate electrode 102 on the peripheral gate insulation layer 101, a peripheral gate capping pattern 103 on the peripheral gate electrode 102, and a peripheral spacer 104 on both sidewalls of the peripheral gate electrode 102. A peripheral source/drain (S/D) may be disposed in the peripheral active region at both sides of the peripheral gate pattern PG. The peripheral source/drain (S/D) may be, for example, a region doped with a second-type dopant.

A peripheral etch stop layer 105, a peripheral interlayer insulation layer 106, a peripheral upper insulation layer 137, and a peripheral capping insulation layer 139 may be sequentially stacked on the peripheral gate pattern PG. The peripheral etch stop layer 105 and the peripheral upper insulation layer 137 may be formed of the same material, and the peripheral interlayer insulation layer 106 and the peripheral capping insulation layer 139 may be formed of the same material. For example, the peripheral etch stop layer 105 and the peripheral upper insulation layer 137 may include, for example, a silicon nitride layer or silicon oxynitride layer, and the peripheral interlayer insulation layer 106 and the peripheral capping insulation layer 139 may include, for example, a silicon oxide layer.

A peripheral contact plug connected to the gate electrode 102 of the peripheral gate pattern PG may be disposed penetrating the peripheral material layers 105, 106, 137, 139 on the peripheral gate pattern PG. A peripheral conductive wiring 186 connected to the peripheral contact plug may be disposed on the peripheral capping insulation layer 139.

A method of fabricating a semiconductor device according to the second embodiment of the inventive concept will be described. FIGS. 7A to 7I are perspective views for describing a method of fabricating a semiconductor device according to the second embodiment of the inventive concept.

Figure 7A:
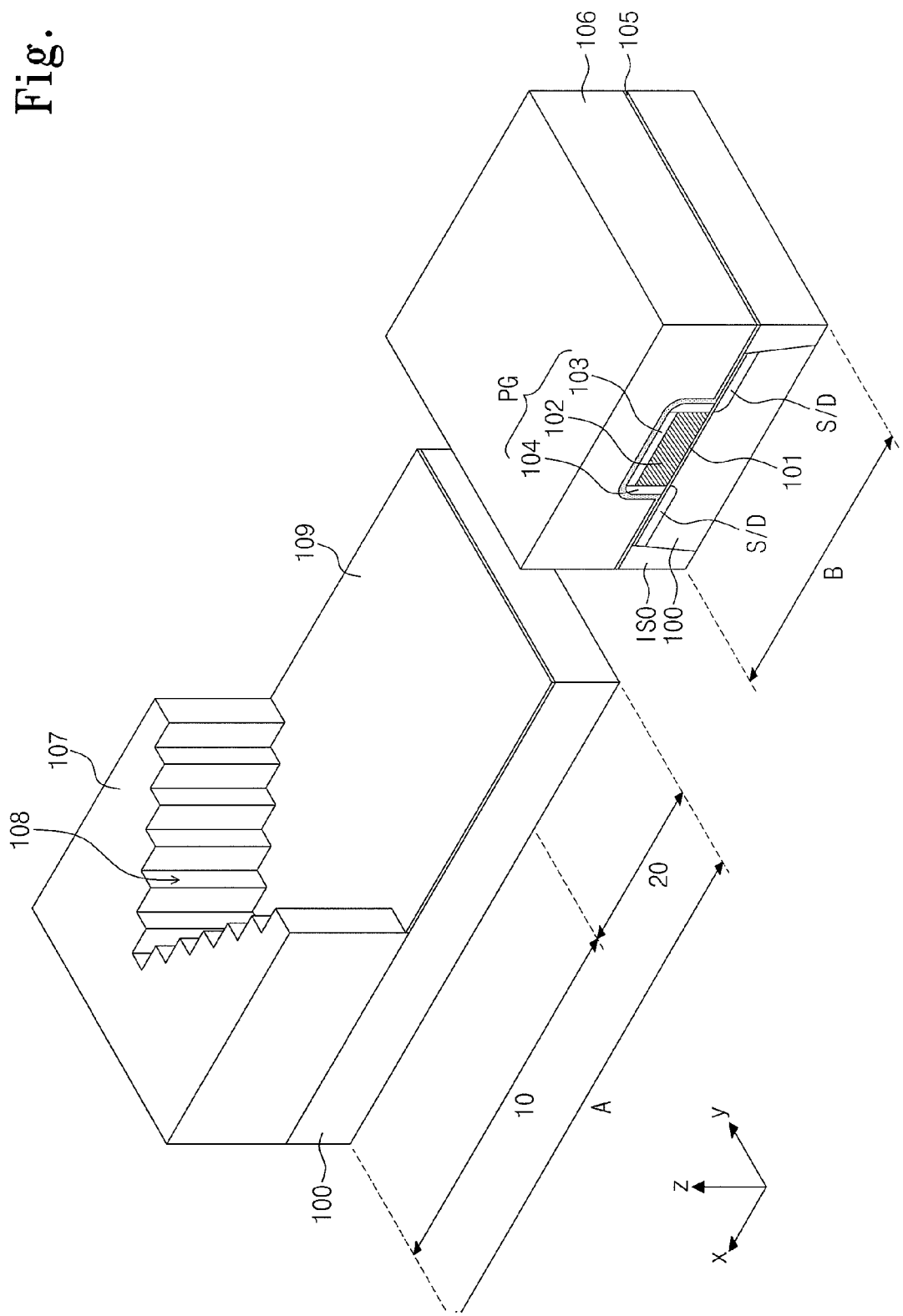
FIGS. 7A to 7I are perspective views for describing a method of fabricating a semiconductor device according to an embodiment of the inventive concept.

Referring to FIG. 7A, a substrate including a cell region 'A' and a peripheral region 'B' spaced apart from each other is provided. The cell region 'A' may include a first region 10 and a second region 20. A peripheral device isolation pattern ISO may be formed in the substrate 100 within the peripheral region 'B' to define a peripheral active region. The peripheral device isolation pattern ISO may be formed by etching the substrate 100 to form a trench and filling the trench with an insulation material. A peripheral gate insulation layer 101 may be formed on the peripheral active region. For example, the peripheral gate insulation layer 101 may include, for example, a silicon oxide layer formed by a thermal oxidation process. A peripheral gate pattern PG including a peripheral gate electrode 102, a peripheral gate capping pattern 103 and a peripheral spacer 104 may be formed on the peripheral gate insulation layer 101. A peripheral etch stop layer 105 covering the peripheral gate pattern PG may be formed.

An insulation layer may be formed on the substrate 100 of the cell region 'A' and the peripheral region 'B' and be then patterned. The insulation layer within the cell region 'A' may be patterned to form a pattern structure 107 described with reference to FIG. 4A, and the insulation layer within the peripheral region 'B' may be left to form a peripheral interlayer insulation layer 106 on the peripheral etch stop layer 105. Top surfaces of the peripheral interlayer insulation layer 106 and the pattern structure 107 may be positioned at the same level from the top surface of the substrate 100.

Alternatively, the pattern structure 107 may be formed by etching the substrate 100 in the cell region 'A'. The pattern structure 107 may be the pattern structure 107 described with reference to FIG. 4A. After the pattern structure 107 is formed, a buffer dielectric layer 109 may be formed on the substrate 100 within the cell region 'A'.

Figure 7B:
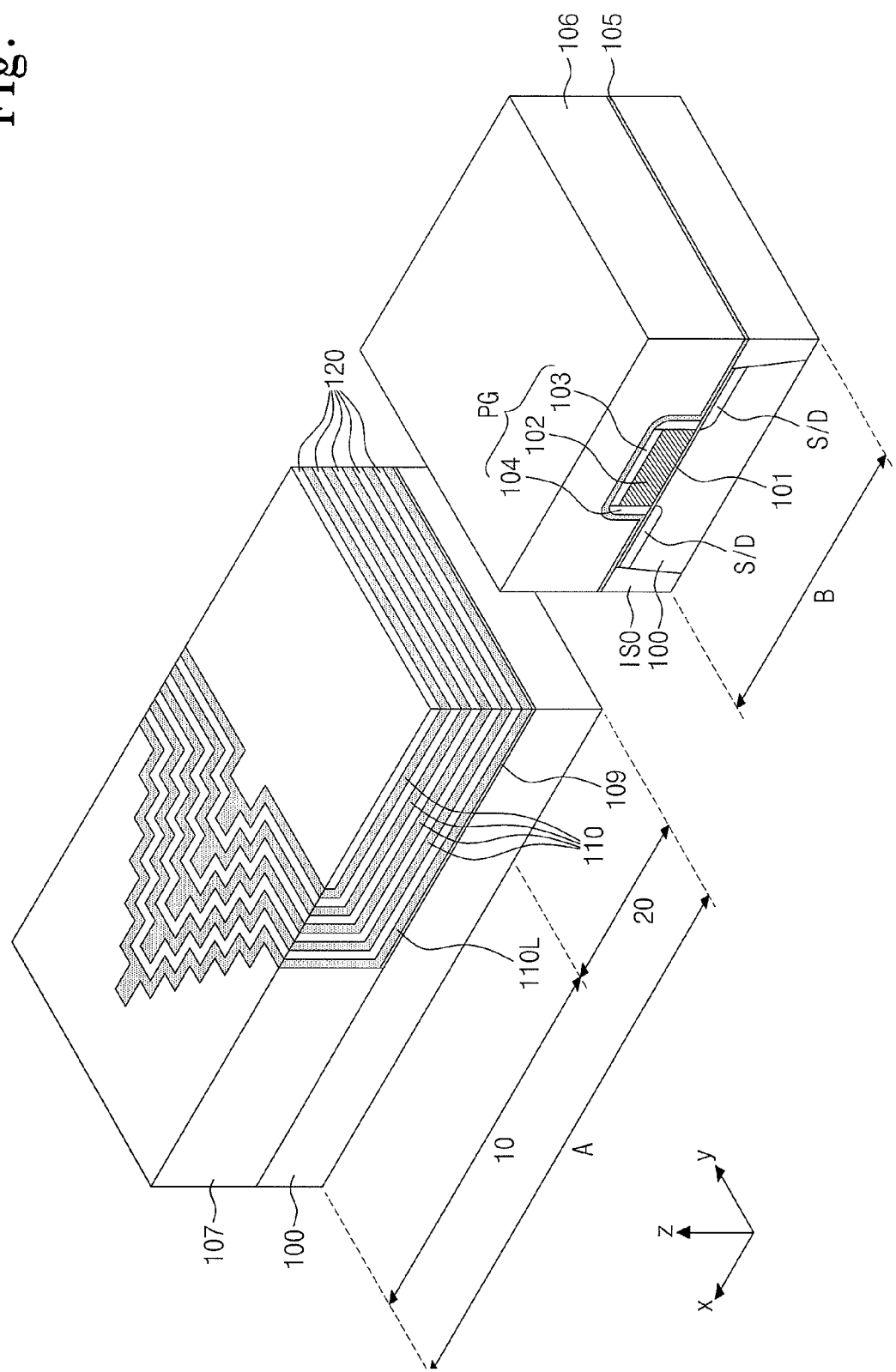

Referring to FIG. 7B, first material layers, and second material layers including a different material from the first material layers may be formed alternatingly and repeatedly stacked on the entire surface of the substrate 100 having the pattern structure 107. The first material layers may be sacrificial layers 110L, 110, and the second material layers may be insulation layers 120. For example, after the sacrificial layers 110L, 110 and the insulation layers 120 are stacked, a planarization process using a top surface of the pattern structure 107 and/or a top surface of the peripheral interlayer insulation layer 106 as an etch stop layer may be performed. The sacrificial layers 110L, 110 and the insulation layers 120 may be the sacrificial layers 110L, 110 and the insulation layers 120 described with reference to FIG. 4B.

Figure 7C:
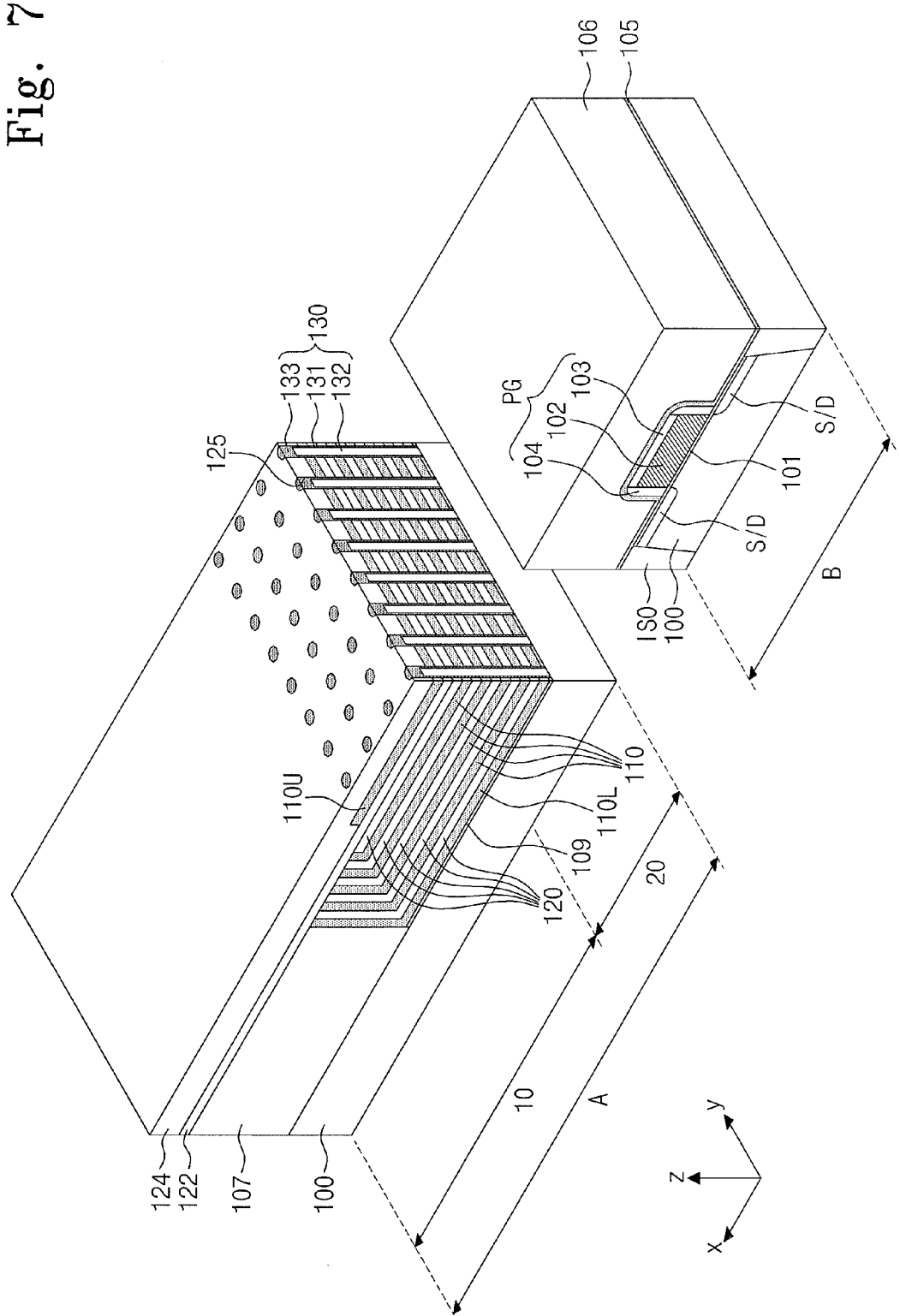

Referring to FIG. 7C, a first upper insulation layer 122, an uppermost sacrificial layer 110U and a second upper insulation layer 124 may be formed sequentially on the sacrificial layers 110L, 110 and the insulation layers 120 stacked alternatingly. As described with reference to FIG. 4C, the uppermost sacrificial layer 110U may be formed by forming a material layer on the first upper insulation layer 122 and patterning the material layer such that a remaining portion covers flat portions of the sacrificial layers 110L, 110. The peripheral interlayer insulation layer 106 may further include portions of the first and second upper insulation layers 122 and 124 formed on the substrate 100 within the peripheral region 'B'.

After the second upper insulation layer 124 is formed, channel openings 125 penetrating the buffer dielectric layer 109, the insulation layers 120, the upper insulation layers 122 and 124, and the sacrificial layers 110L, 110, 110U may be formed and semiconductor pillars 130 filling the channel openings 125 may be formed as described with reference to FIGS. 4D and 4E.

Figure 7D:
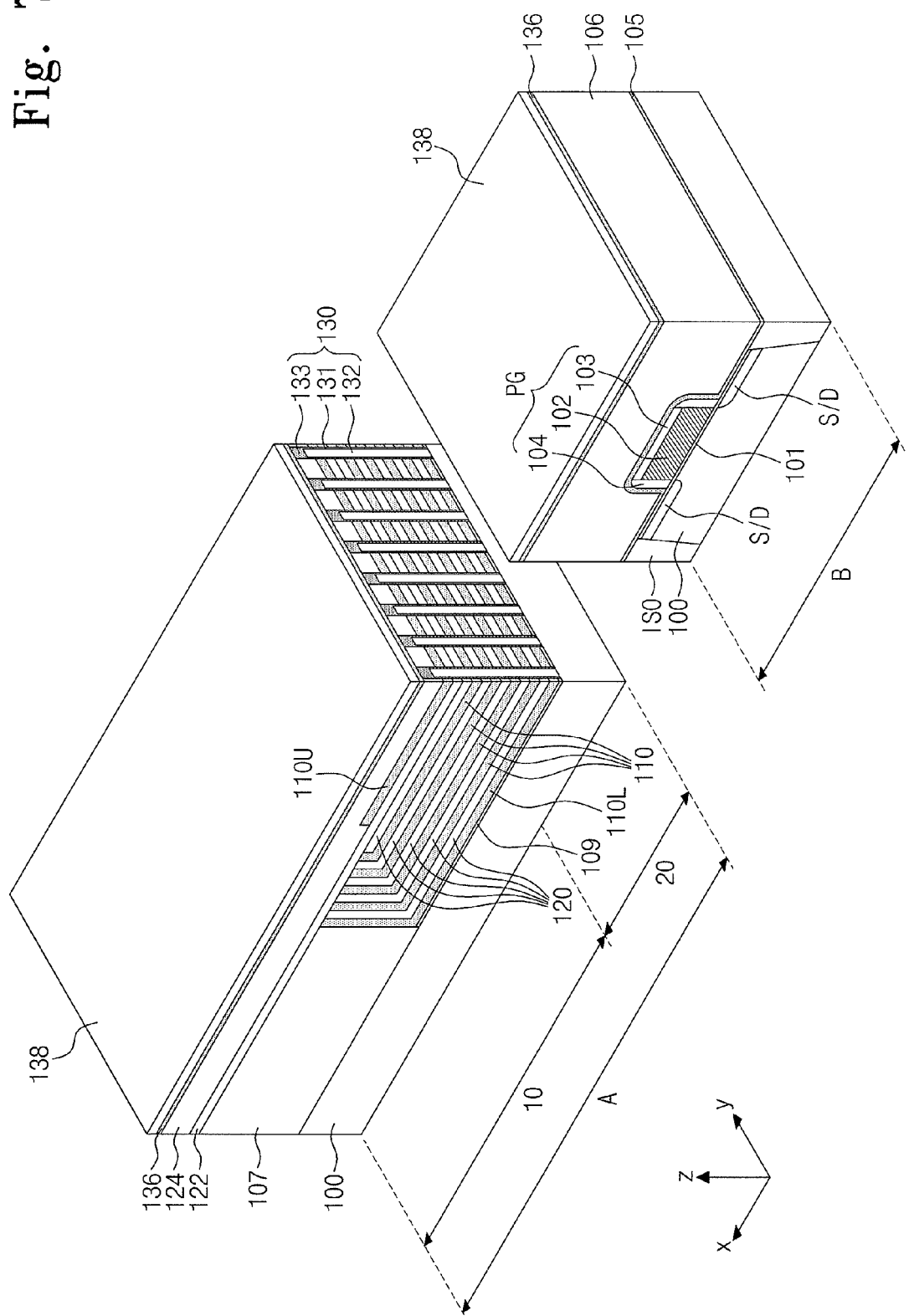

Referring to FIG. 7D, an additional sacrificial layer 136 and a capping insulation layer 138 may be formed sequentially on the substrate 100 of the cell region 'A' and the peripheral region 'B'. The additional sacrificial layer 136 may include a different material from the capping insulation layer 138. For example, the additional sacrificial layer 136 may include the same material as the sacrificial layers 110L, 110, 110U, and the capping insulation layer 138 may include the same material as the insulation layers 120 and the upper insulation layers 122, 124.

Figure 7E:
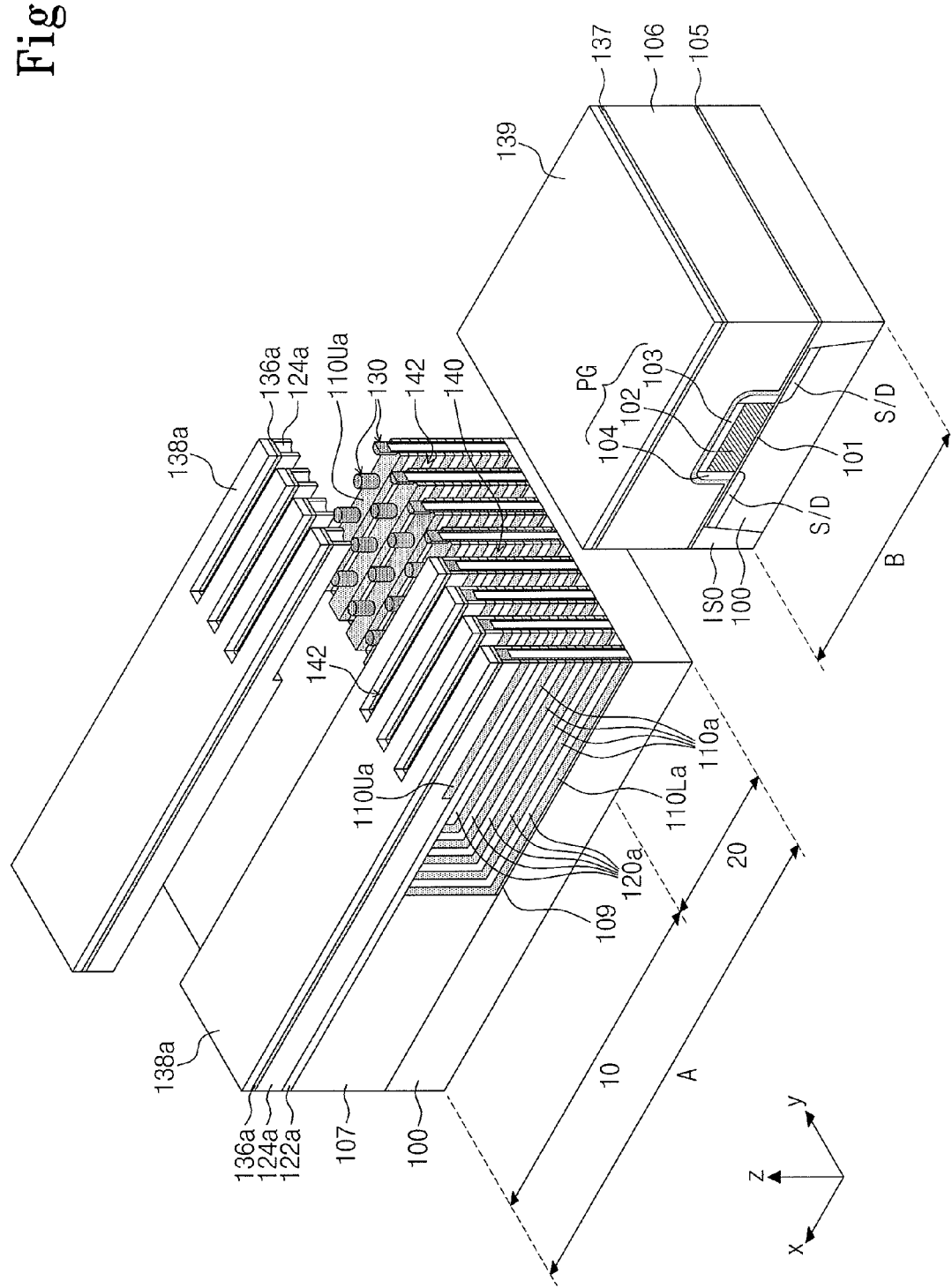

Referring to FIG. 7E, the pattern structure 107, the upper insulation layers 122, 124, the additional sacrificial layer 136, the capping insulation layer 138, the insulation layers 120 and the sacrificial layers 110L, 110, 110U may be, for example, continuously patterned to form a main-trench 140 and sub-trenches 142 described with reference to FIG. 4F. The main-trench 140 and the sub-trenches 142 may be formed by, for example, an anisotropic etch process using a dry etching and/or wet etching process.

The main-trench 140 may define preliminary stack structures having the sacrificial patterns 110La, 110a, 110Ua and the insulation patterns 120a, 122a, 124a which are stacked alternatingly and repeatedly. The preliminary stack structures may be the same as the preliminary stack structures described with reference to FIG. 4F.

As described with reference to FIG. 4F, each of the sacrificial patterns 110La, 110a disposed under the uppermost sacrificial pattern 110Ua may include a flat portion 'a' parallel to the top surface of the substrate 100, and a sidewall portion 'b' extending from one end of the flat portion 'a'. The uppermost sacrificial pattern 110Ua may have, for example, a line shape extending in the first direction.

The additional sacrificial layer 136 and the capping insulation layer 138 may be patterned to form an additional sacrificial pattern 136a and a capping insulation pattern 138a which are disposed sequentially on the top surfaces of the preliminary stack structures. The sacrificial etch stop layer 136 and the capping insulation layer 138 within the peripheral region 'B' may not be patterned but left as a peripheral upper insulation layer 137 and a peripheral capping insulation layer 139, respectively.

Sidewalls of the sacrificial patterns 110La, 110a, 110Ub, the insulation patterns 120a, 122a, 124a, the additional sacrificial pattern 136a and the capping insulation pattern 138a may be exposed by sidewalls of the main-trench 140 and the sub-trenches 142.

Figure 7F:
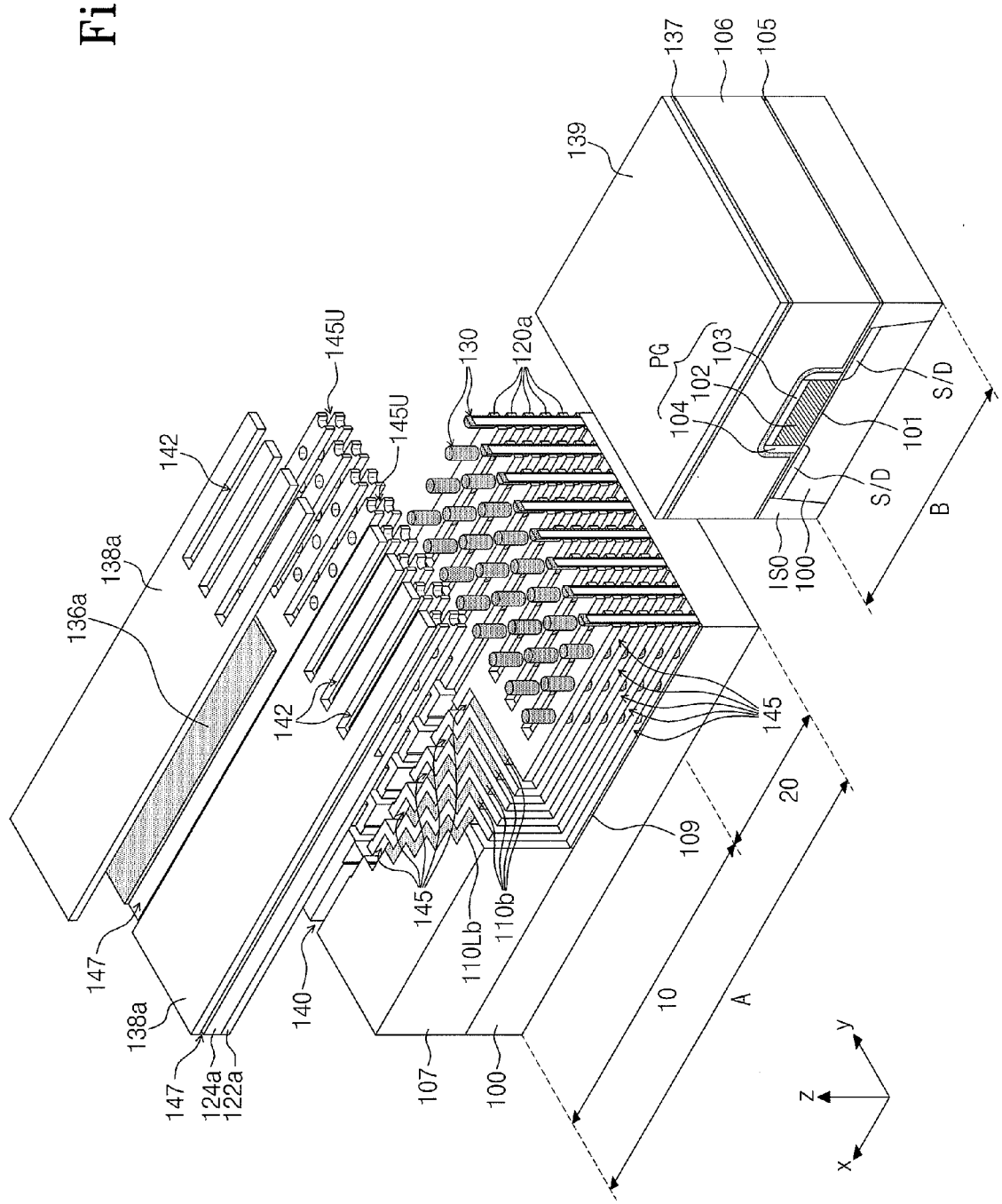

For example, referring to FIG. 7F, a selective etching process may be performed to completely remove the uppermost sacrificial pattern 110Ua exposed by the main-trench 140 and the sub-trenches 142 such that an uppermost recess region 145U is formed. Some of the sacrificial patterns 110La, 110a under the uppermost sacrificial pattern 110Ua is removed and the other is left such that recess regions 145 may be formed.

First portions of sidewall portions of the sacrificial patterns 110La, 110a exposed by the main-trench 140 may be at least removed. After the selective etching process, the remaining sacrificial patterns 110Lb, 110b may be left.

By the selective etching process, some of the additional sacrificial pattern 136a disposed between the second upper insulation pattern 124a and the capping insulation pattern 138a is removed and the other is left such that an additional recess region 147 may be formed. The additional recess region 147 may be formed on some portions of the recess regions 145 formed by removing the first portions of the sidewall portions of the sacrificial patterns 110La, 110a. After the selective etching process, the remaining sacrificial pattern 136a may be left between the second upper insulation pattern 124a and the capping insulation pattern 138a.

The selective etching process may be a selective etching process described with reference to FIG. 4G. The recess regions 145, 145U may expose some portions of a sidewall of the semiconductor pillar 130 contacting the sacrificial patterns 110La, 110a, 110Ua.

Figure 7G:
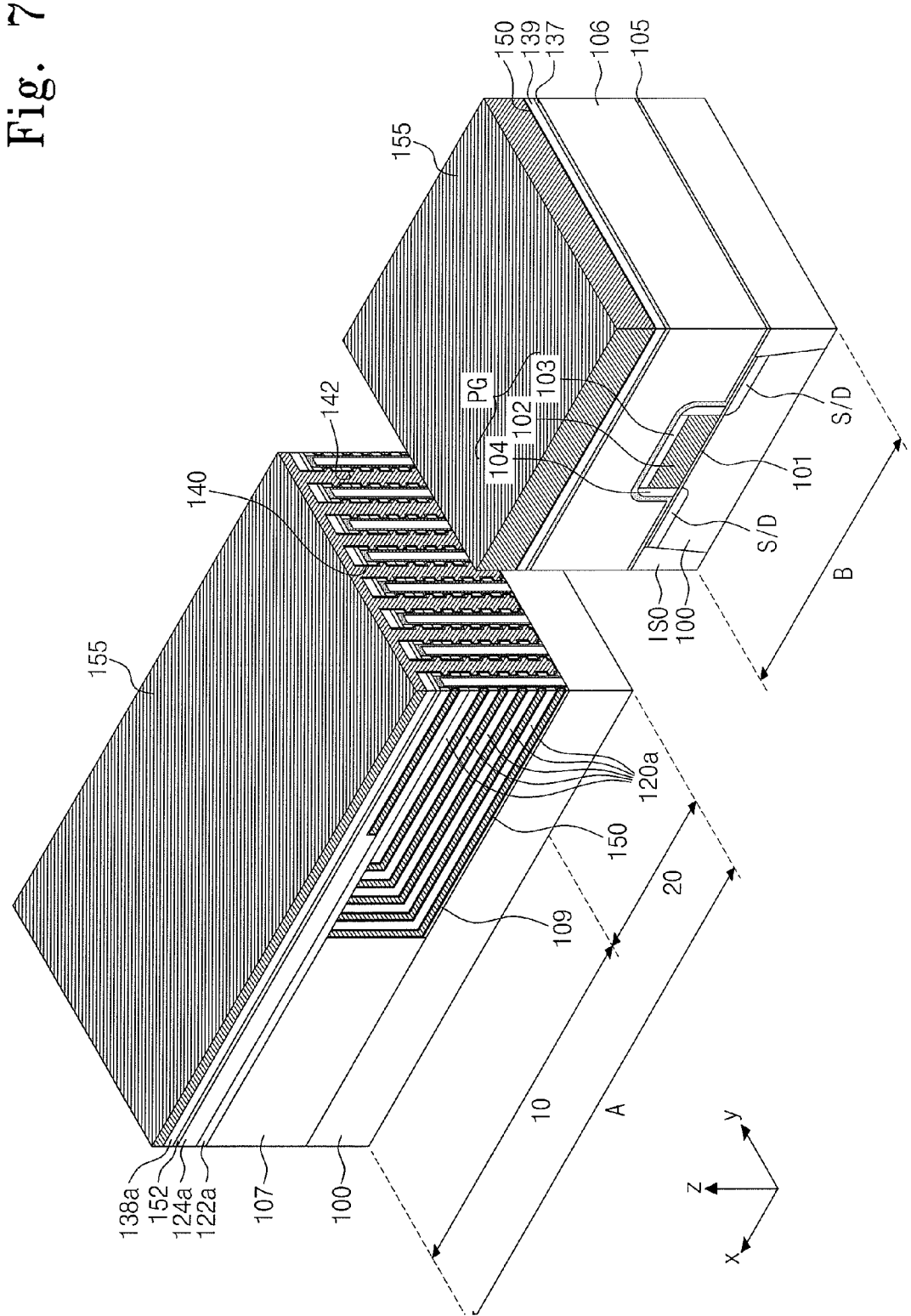

Referring to FIG. 7G, an information storage layer 150 may be formed on the substrate 100. The information storage layer 150 may be formed in the additional recess region 147 to form a barrier layer 152. The barrier layer 152 may include the same material as the information storage layer 150, as described with reference to FIG. 6. The information storage layer 150 may be formed by the same process as the information storage layer 150 described with reference to FIG. 4G.

After the information storage layer 150 is formed, as described with reference to FIG. 4G, a gate conductive layer 155 may be formed on the substrate 100. The gate conductive layer 155 may fill the recess regions 145, 145U. The gate conductive layer 155 may fill the main-trench 140 and the sub-trenches 142, partially or completely.

The information storage layer 150 and the gate conductive layer 155 may be formed even on the peripheral capping insulation layer 138 within the peripheral region 'B'.

Figure 7H:
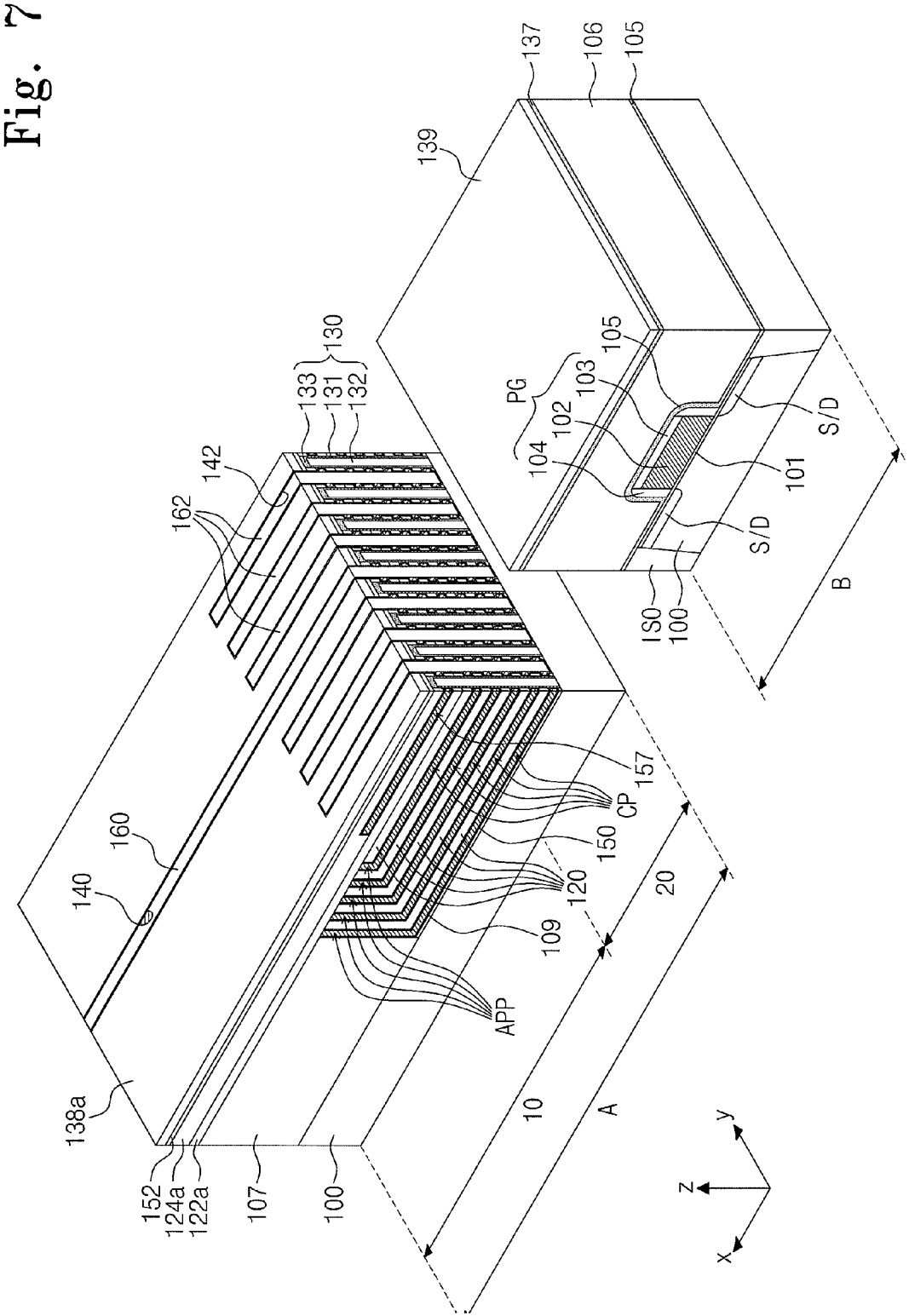

Referring to FIG. 7H, after the gate conductive layer 155 is formed, a portion of the gate conductive layer 155 positioned outside the recess regions 145, 145U may be removed to form conductive patterns CP, pad patterns PP and auxiliary pad patterns APP, and a string select line 157 in the recess regions 145, 145U described with reference to FIGS. 1, 2A and 2B. The portion of the gate conductive layer 155 positioned outside the recess regions 145, 145U may be removed by the process described with reference to FIG. 4I.

The stacked conductive patterns CP, the string select lines 157 on the stacked conductive patterns CP, and the insulation patterns 120a, 122a, 124a may define one stack structure. The stack structure may be the stack structure described with reference to FIG. 4I. As the process described with reference to FIG. 4I, main- and sub-device isolation patterns 160 and 162 filling the main- and sub-trenches 140 and 142 may be formed.

Figure 7I:
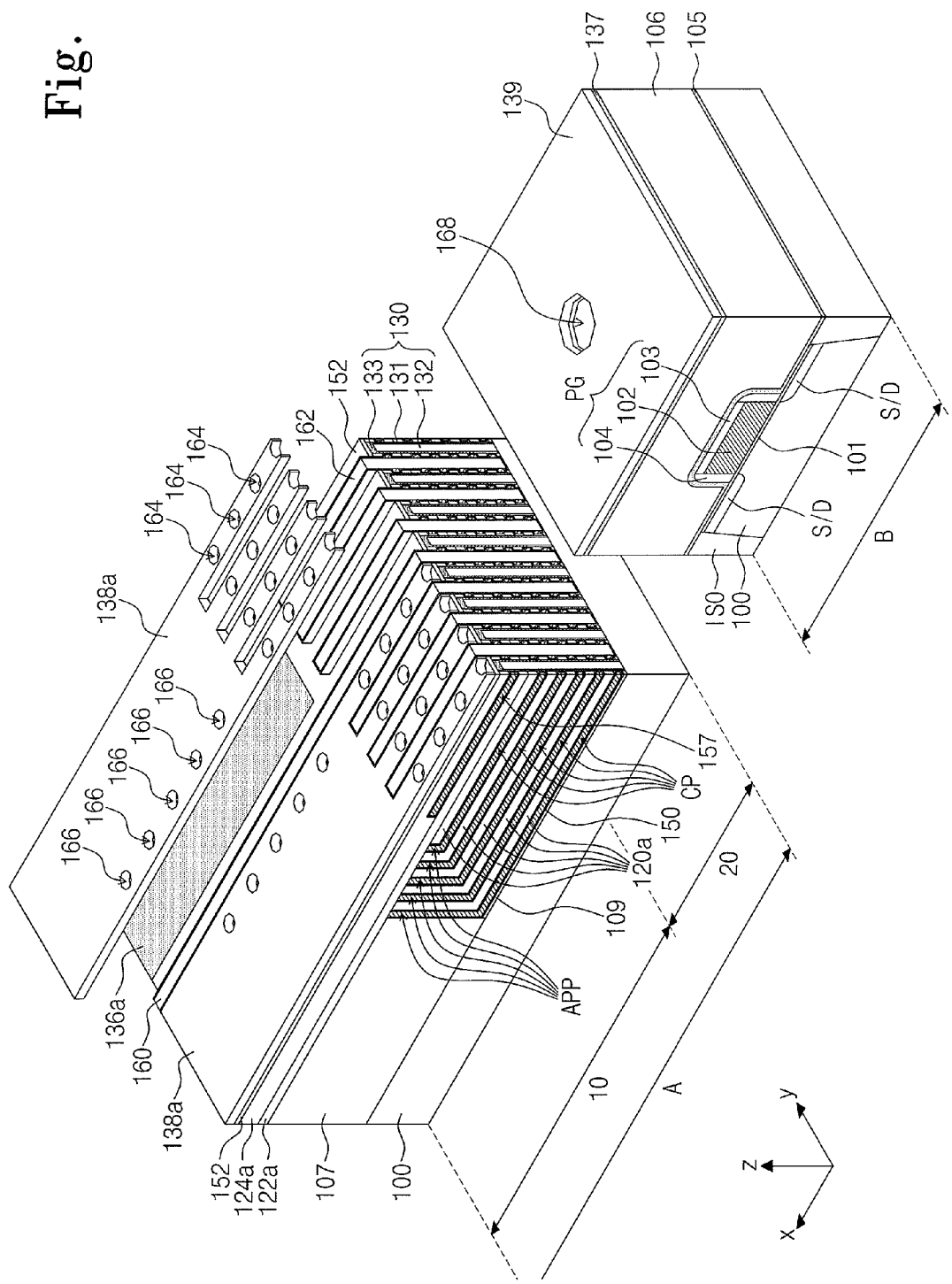

Referring to FIG. 7I, a peripheral contact hole 168 penetrating the peripheral material layers 105, 106, 137, 139 on the peripheral gate pattern PG, and preliminary bit line contact holes 164 and preliminary cell contact holes 166 penetrating the capping insulation pattern 138a may be formed. The peripheral contact hole 168 may expose the peripheral gate electrode 102, the preliminary cell contact holes 166 may be those for exposing the landing sidewall portions LSP (see FIG. 2A), and the preliminary bit line contact holes 164 may be those for exposing the drain portions 133 of the semiconductor pillars 130. The preliminary contact holes 164, 166 may be farmed by patterning the capping insulation pattern 138a using the barrier layer 152 as an etch stop layer. The preliminary contact holes 164, 166 may expose the barrier layer 152. In the case where an additional insulation layer is further formed on the capping insulation pattern 138a, the preliminary contact holes 164, 166 may be formed by, for example, patterning the additional insulation layer and the capping insulation pattern 138a using the barrier layer as an etch stop layer.

In the case where the barrier layer 152 is omitted, and contact holes exposing the landing sidewall portions LSP (see FIG. 2A) and the drain portions 133 and the peripheral contact hole 168 are formed, the landing sidewall portions LSP (see FIG. 2A) and the drain portions 133 may be over-etched due to a height difference between the contact holes and the peripheral contact hole 168, so that the reliability of the semiconductor device may be lowered.

However, according to exemplary embodiments of the inventive concept, since the preliminary contact holes 164, 166 are formed by using the barrier layer 152 including a different material from the peripheral material layers 105, 106, 137, 139 through which the peripheral contact hole 168 penetrates, as an etch stop layer, an over-etch of the landing sidewall portions LSP (see FIG. 2A) and the drain portions 133 which may be caused by a height difference between the peripheral contact hole 168 and the preliminary contact holes 164, 166 may be prevented. Therefore, a high reliability semiconductor device may be realized.

Figure 8:
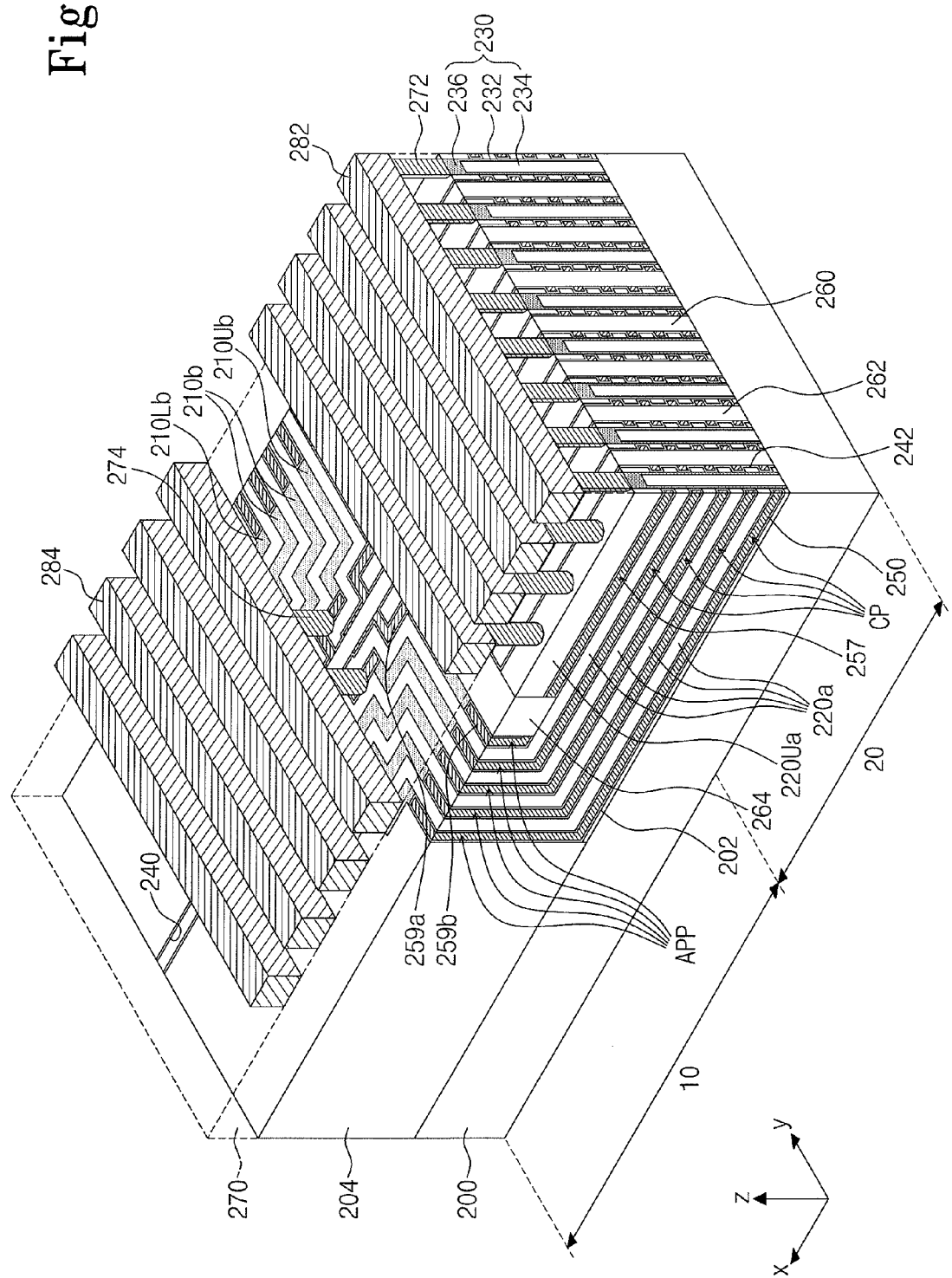
FIGS. 8, 9A and 9B are perspective views illustrating a semiconductor device according to an embodiment of the inventive concept.
Figure 9A:
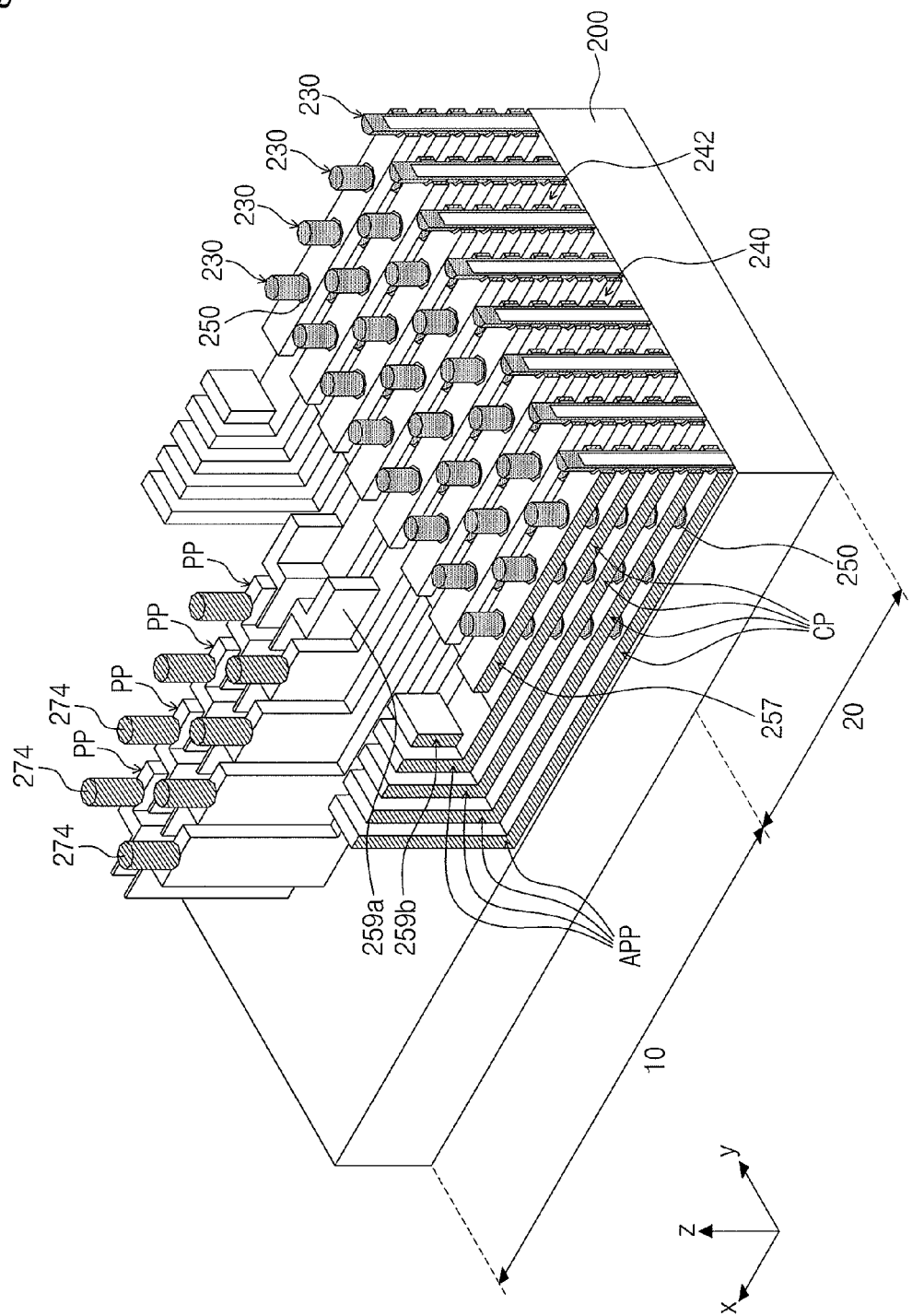
Figure 9B:
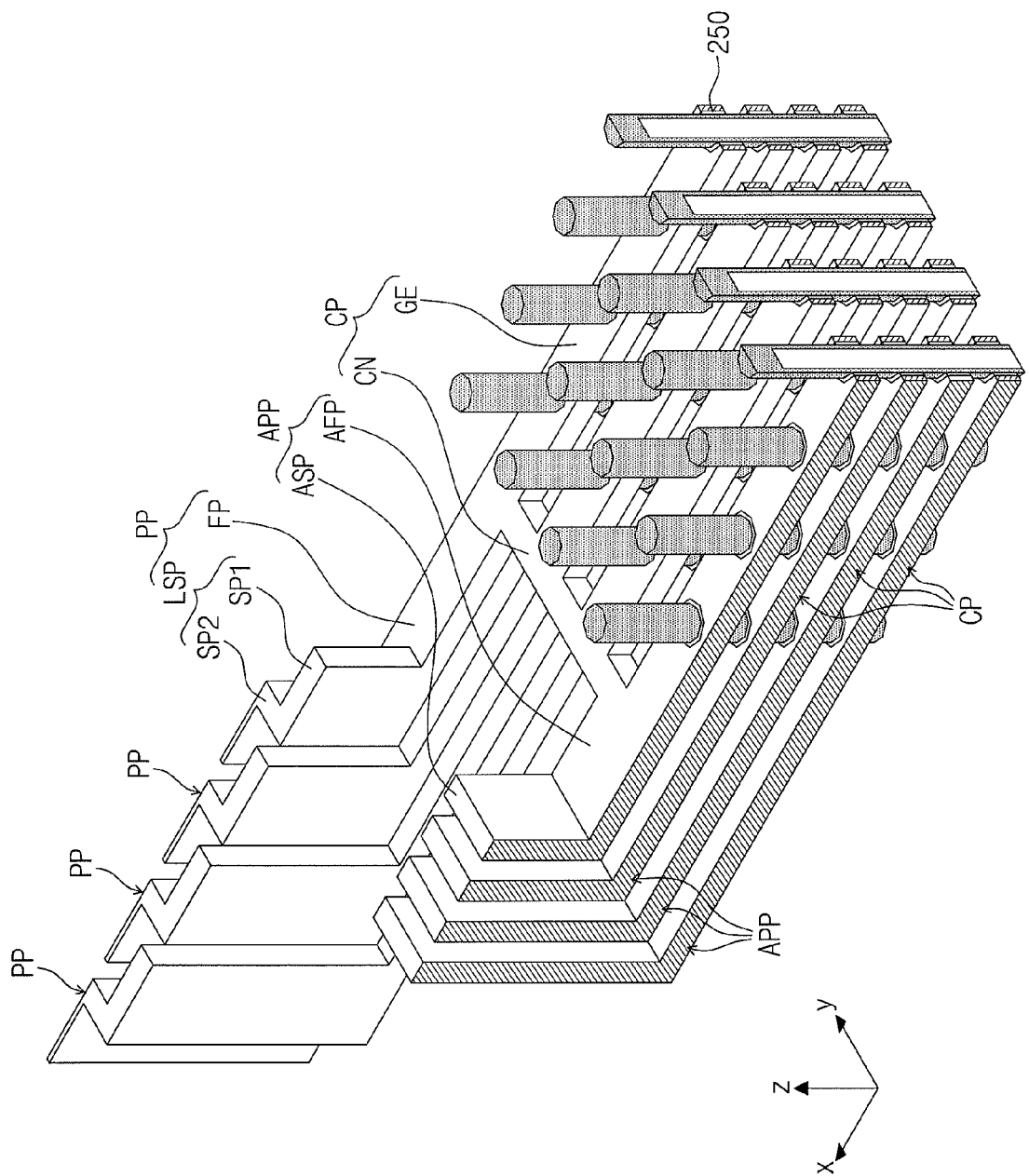

A semiconductor device according to a third embodiment of the inventive concept will now be described. FIGS. 8, 9A and 9B are perspective views illustrating a semiconductor device according to a third embodiment of the inventive concept.

For the convenience of the description, FIG. 9A shows a substrate 200, a semiconductor pillar 230, conductive patterns CP, pad patterns PP, auxiliary pad patterns APP, a string select line 257, floating conductive patterns 259a, 259b, and cell contact plugs 274, and FIG. 9B shows the semiconductor pillar 230, the conductive patterns CP included in one stack structure, pad patterns PP connected to the conductive patterns CP, and the auxiliary pad patterns APP connected to the conductive patterns CP. For the convenience of the recognition, some patterns of the conductive patterns CP, the pad patterns PP, the auxiliary pad patterns APP and the floating conductive patterns 259a, 259b are omitted in FIGS. 9A and 9B.

Referring to FIGS. 8, 9A and 9B, the substrate 200 may include a first region 10 and a second region 20. The first region 10 may be a pad region where pad patterns are disposed, and the second region 20 may be a cell region where three-dimensional cells are disposed. The substrate 200 may be the same substrate as that described with reference to FIGS. 1, 2A and 2B. A pattern structure 204 may be disposed on the substrate 200 within the first region 10. The pattern structure 204 may be the same pattern structure as that described with reference to FIGS. 1, 2A and 2B.

Conductive patterns CP stacked spaced apart from each other may be disposed on the substrate 200 within the second region 20. Each of the conductive patterns CP may include a plurality of gate electrodes GE and a connecting portion CN described with reference to FIGS. 1, 2A and 2B. The plurality of gate electrodes GE may have, for example, a line shape extending in a first direction. A sub-device isolation pattern 262 may be disposed between the gate electrodes GE disposed spaced apart from each other in a second direction. The sub-device isolation pattern 262 may fill a sub-trench 242 between the gate electrodes GE disposed spaced apart from each other. The first direction and the second direction are parallel to a top surface of the substrate 100 and may cross each other. In the drawings, the first direction may be an x-axis direction and the second direction may be a y-axis direction.

Pad patterns PP may extend in the first direction from one end of the conductive patterns CP, respectively. The pad patterns PP may be disposed within the first region 10. Each of the pad patterns PP may include a flat portion FP and a landing sidewall portion LSP which are described with reference to FIGS. 1, 2A and 2B.

Auxiliary pad patterns APP may extend in the first direction from one end of the conductive patterns CP. The auxiliary pad patterns APP may be disposed within the first region 10. The auxiliary pad patterns APP may be spaced apart from the pad patterns PP. Each of the auxiliary pad patterns APP may include an auxiliary flat portion AFP and an auxiliary sidewall portion ASP which are described with reference to FIGS. 1, 2A and 2B.

Insulation patterns 220a, 200Ua may be disposed between the stacked conductive patterns CP. Each of the insulation patterns 220a under the uppermost insulation pattern 220Ua may include an insulation flat portion and an insulation sidewall portion which are described with reference to FIGS. 1, 2A and 2B.

String select lines 257 may be disposed between the uppermost insulation pattern 220Ua and the insulation pattern 220a directly under the uppermost insulation pattern 220Ua. The string select lines 257 may have, for example, a line shape extending in the first direction. The stacked string select lines 257 may be disposed spaced apart from each other in the second direction. The string select lines 257 may be disposed parallel to the gate electrodes GE. The number of the string select lines 257 may be equal to the number of the gate electrodes GE included in each of the conductive patterns CP. The string select lines 257 may be positioned at the same level from the top surface of the substrate 200.

The stacked conductive patterns CP, the string select lines 257 on the stacked conductive patterns CP, and the insulation patterns 220a, 220Ua may define one stack structure. The stack structure may be provided in plurality on the substrate 200. A main-device isolation pattern 260 may be disposed between one pair of stack structures adjacent to each other. The stack structures in one pair may be mirror symmetric to each other from the main-device isolation pattern 260. The main-device isolation pattern 260 may be disposed in a main-trench 240 between the stack structures. The main-device isolation pattern 260 may be disposed on the substrate 200 at one side of the stack structures. The main-device isolation pattern 260 may include, for example, a silicon oxide layer. The stack structures may be disposed spaced apart from each other in the second direction.

A first floating conductive pattern 259a may be disposed between the string select line 257 and the landing sidewall portion LSP, and a second floating conductive pattern 259b may be disposed between the string select line 257 and the auxiliary sidewall portion ASP. The floating conductive patterns 259a and 259b may be electrically isolated from the conductive patterns CP, the pad patterns PP, the auxiliary pad patterns APP and the string select lines 257. The floating conductive patterns 259a and 259b may be provided during the same process as that of forming the string select line, and may include the same material as the string select line.

Bottom surfaces of the floating conductive patterns 259a and 259b may be positioned at the same level as bottom surface of the string select lines 257 from the top surface of the substrate 100. The third direction may be a z-axis direction. The first floating conductive pattern 259a may be adjacent to the main-device isolation pattern 260. A top surface of the first floating conductive pattern 259a may be positioned at the same level as the top surfaces of the landing sidewall portions LSP from the top surface of the substrate 200. A top surface of the second floating conductive pattern 259b may be positioned at the same level as a top surface of the auxiliary sidewall portion ASP from the top surface of the substrate 200.

Sacrificial patterns 210Lb, 210b, 210Ub may be disposed between the pad patterns PP and the auxiliary pad patterns APP and between the first floating conductive pattern 259a and the second floating conductive pattern 259b. Each of the sacrificial patterns 210Lb, 210b under the uppermost sacrificial pattern 210Ub may include a sacrificial flat portion, and a sacrificial sidewall portion extending upward from a top surface of the sacrificial flat portion. The sacrificial flat portion may be disposed between the flat portion FP of the pad pattern PP and the auxiliary flat portion AFP of the auxiliary pad pattern APP. The sacrificial sidewall portion may be disposed between the landing sidewall portion LSP of the pad pattern PP and the auxiliary sidewall portion ASP of the auxiliary pad pattern APP. The uppermost sacrificial pattern 210Ub may be disposed between the first floating conductive pattern 259a and the second floating conductive pattern 259b and may extend in the second direction.

The insulation patterns 220a, 220Ua and the sacrificial patterns 210Lb, 210b, 210Ub may include the same material as the insulation patterns 120a and the sacrificial patterns 110Lb, 110b described with reference to FIGS. 1, 2A and 2B.

A semiconductor pillar 230 may penetrate the stacked gate electrodes GE and the stacked insulation patterns 220a, 220Ua. The semiconductor pillar 230 may extend in the third direction. For example, the semiconductor pillar 230 contacts the substrate 200. The semiconductor pillar 230 may be provided in plurality on the semiconductor substrate 200. The plurality of semiconductor pillars 230 may be arranged, for example, two-dimensionally in the first and second directions. The plurality of semiconductor pillars 230 may penetrate the respective stack structures.

The semiconductor pillar 230 may include a semiconductor portion 232, a filling insulation material 234, and a drain portion 236. The semiconductor portion 232, the filling insulation material 234 and the drain portion 236 may be the semiconductor portion 131, the filling insulation material 132 and the drain portion 133 described with reference to FIGS. 1, 2A and 2B.

An information storage layer 250 may be disposed between the semiconductor pillars 230 and the gate electrodes GE. The information storage layer 250 may be formed in, for example, a multi-layer structure including the tunnel dielectric layer 150a, the charge storage layer 150b and the blocking layer 150c described with reference to FIG. 3.

A common source region may be disposed in the substrate 200 under the main-device isolation pattern 260 and/or the sub-device isolation pattern 262. The common source region may have, for example, a line shape extending in the first direction. The common source region may be a region doped with the second-type dopant.

Cell contact plugs 274 may be provided on the first portions SP1 of the landing sidewall portions LSP of the pad patterns PP. The cell contact plugs 274 may contact the first portions SP1 of the landing sidewall portions LSP. The cell contact plugs 274 may penetrate an interlayer insulation pattern 270 on the stack structures. The widths of each of the cell contact plugs 274 in the first and second directions may be greater than the width of the first portion SP1 in the second direction. A conductive wiring 284 connected to the cell contact plugs 274 may be provided.

A bit line 282 may be electrically connected to the drain portions 233 of the semiconductor pillars 230 through bit line contact plugs 272 penetrating the interlayer insulation layer 270. The bit line 282 extends in the second direction. That is, the bit line 282 crosses the gate electrodes GE. The bit line 282 may be provided in plurality. The bit lines 282 may be parallel to each other. One bit line 282 may be electrically connected to the plurality of drain portions 236 formed in the plurality of semiconductor pillars 230 arranged in the second direction to form one row.

A method of fabricating a semiconductor device according to the third embodiment of the inventive concept will be described. FIGS. 10A to 10G are perspective views for describing a method of fabricating a semiconductor device according to the third embodiment of the inventive concept.

Figure 10A:
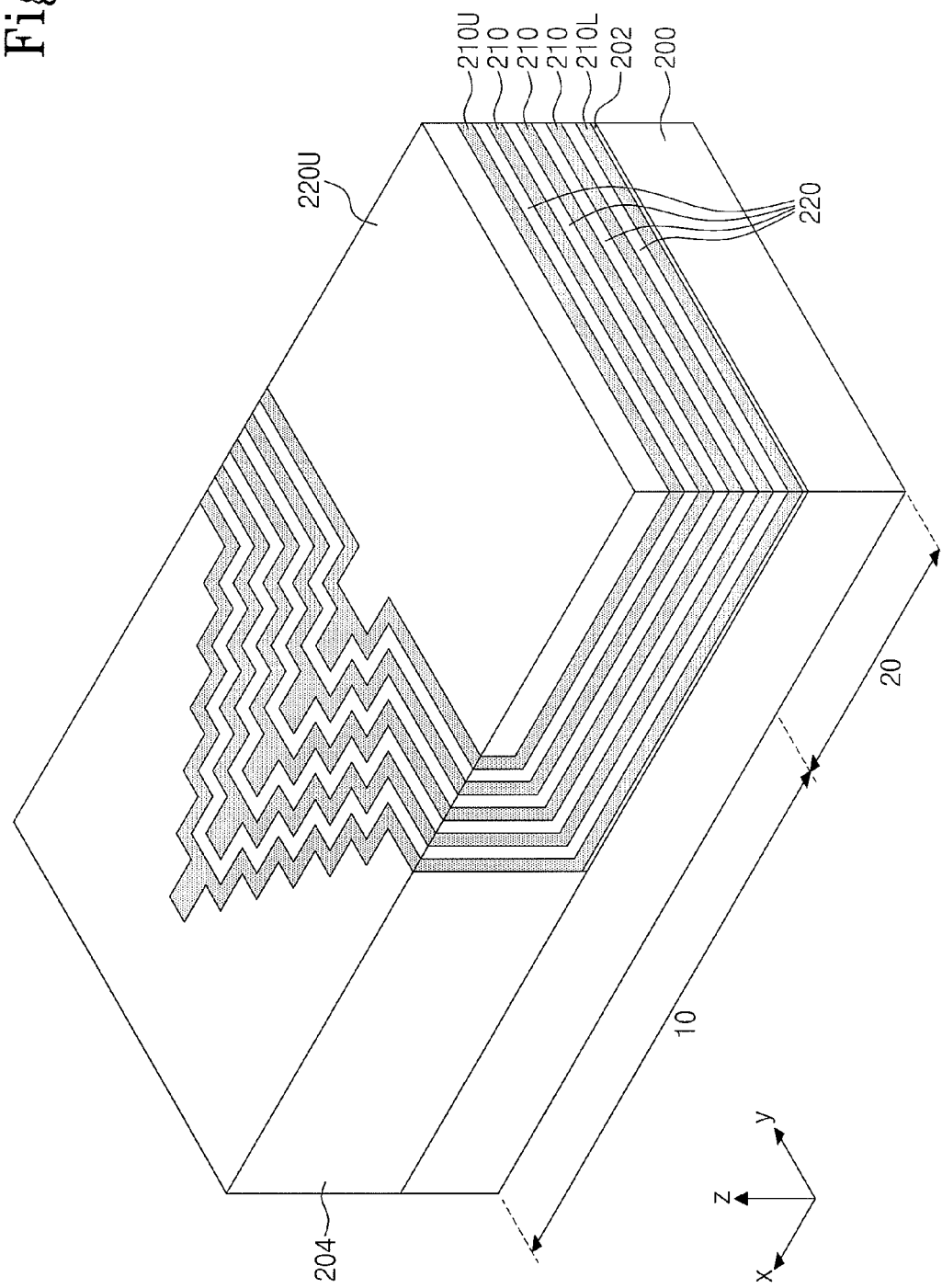
FIGS. 10A to 10G are perspective views for describing a method of fabricating a semiconductor device according to an embodiment of the inventive concept.

Referring to FIG. 10A, a substrate 200 including a first region 10 and a second region 20 is prepared. A pattern structure 204 may be formed on the substrate 200 in the first region 10. The pattern structure 204 may be formed by the process of forming the pattern structure 107 described with reference to FIG. 4A. A buffer dielectric layer 202 covering the top surface of the substrate 200 may be formed. For example, the buffer dielectric layer 202 may include a silicon oxide layer formed by a thermal oxidation process.

First material layers, and second material layers including a different material from the first material layers may be alternatingly and repeatedly stacked on the substrate 200 having the pattern structure 204. The first material layers may be sacrificial layers 210L, 210, 210U, and the second material layers may be insulation layers 220, 220U. For example, after the sacrificial layers 210L, 210, 210U are stacked, a planarization process using a top surface of the pattern structure 204 as an etch stop layer may be performed. The sacrificial layers 210L, 210, 210U and the insulation layers 220, 220U may be formed of the same material as the sacrificial layers 110L, 110 and the insulation layers 120 described with reference to FIGS. 1, 2A and 2B.

The sacrificial layers 210L, 210, 210U may be formed with the same thickness. Unlike this, among the sacrificial layers 210L, 210, 210U, the lowermost and uppermost sacrificial layers 210L and 210U may be formed thicker than the sacrificial layers 210 disposed between the lowermost sacrificial layer 210L and the uppermost sacrificial layer 210U. In this case, the sacrificial layers 210 disposed between the lowermost sacrificial layer 210L and the uppermost sacrificial layer 210U may be formed with the same thickness. The uppermost insulation layer 220U may be formed thicker than the insulation layers 220 under the uppermost insulation layer 220U.

As described with reference to FIG. 4B, each of the sacrificial layers 210L, 210, 210U may include a flat portion parallel to the top surface of the substrate 200, and a sidewall portion extending from one end of the flat portion. As described with reference to FIG. 4B, each of the insulation layers 220 under the uppermost insulation layer 220U may includes a flat portion parallel to the top surface of the substrate 200, and a sidewall portion extending from one end of the flat portion.

Figure 10B:
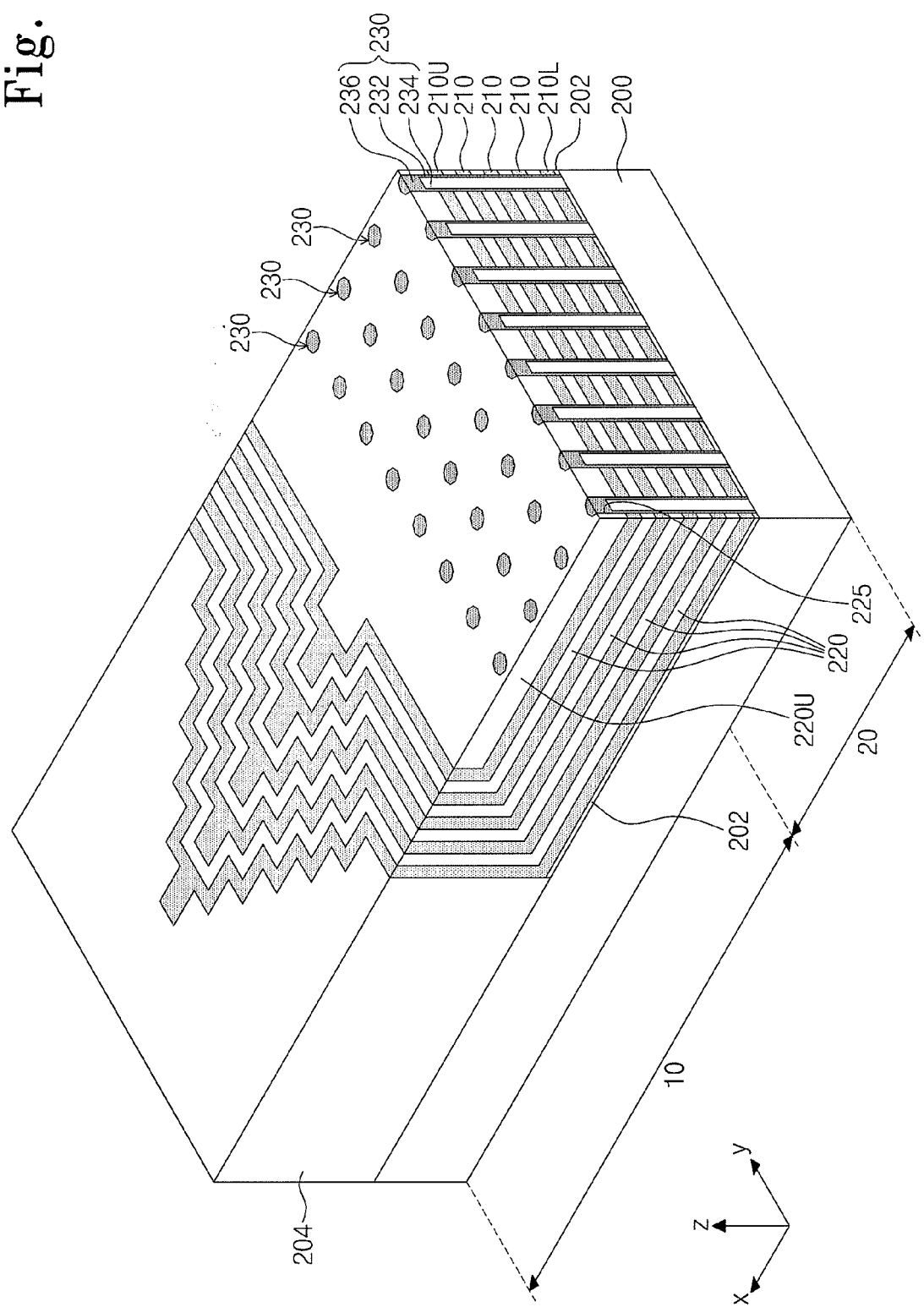

For example, referring to FIG. 10B, channel openings 225 exposing the top surface of the substrate 200 may be formed by continuously patterning the buffer dielectric layer 202, the insulation layers 220, 220U and the sacrificial layers 210L, 210, 210U. The channel openings 225 may penetrate the flat portions of the sacrificial layers 210L, 210, 210U. The channel openings 225 may be formed by the process described with reference to FIG. 4D.

Semiconductor pillars 230 filling the channel openings 225, respectively may be formed. Each of the semiconductor pillars 230 may include a semiconductor portion 232 adjacent to a sidewall of the channel opening 225, a filling insulation material 234 filling a region enclosed by the semiconductor portion 231 in the channel opening 225, and a drain portion 236 filling an upper region of the channel opening 225.

Figure 10C:
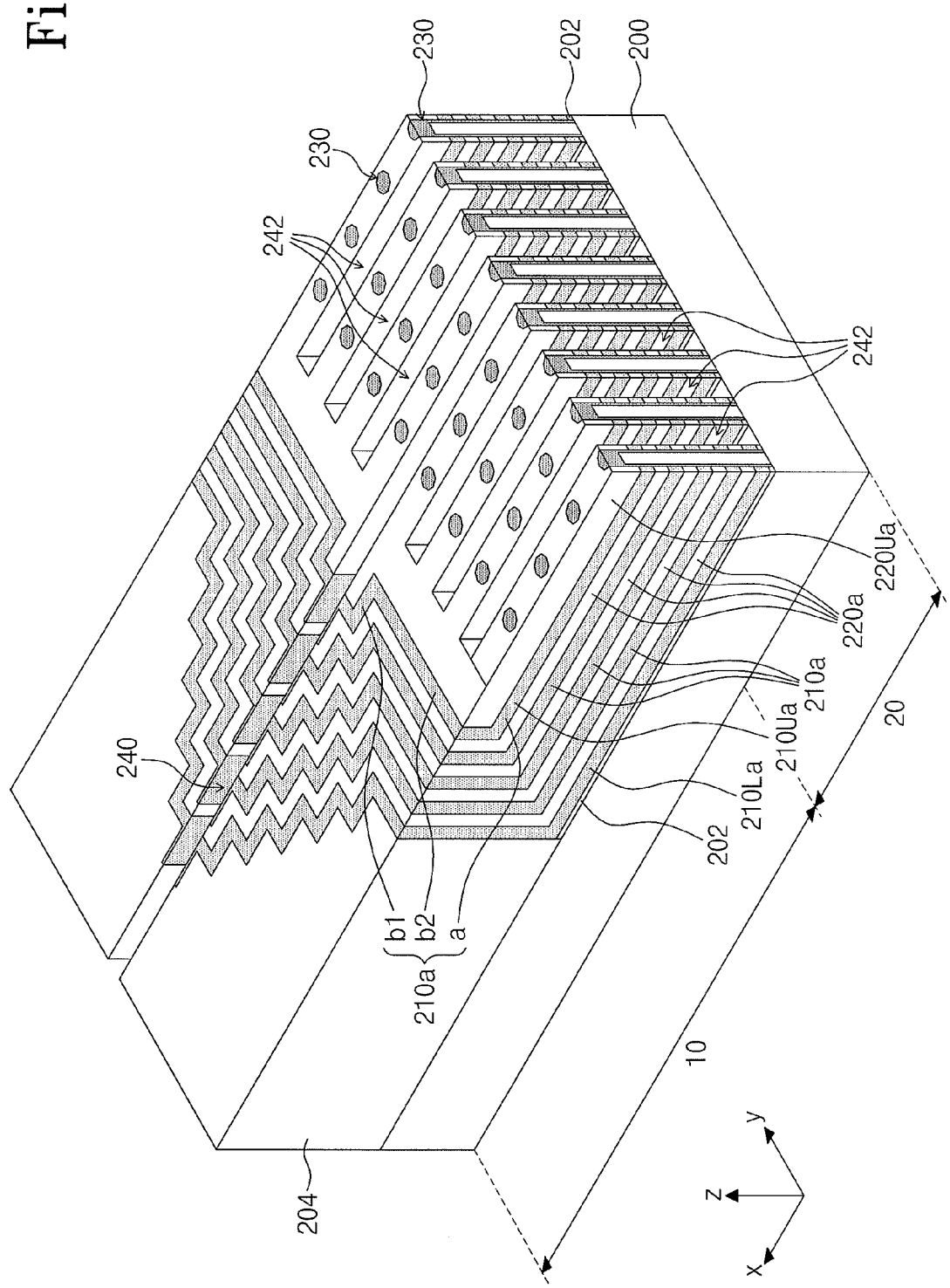

Referring to FIG. 10C, a main-trench 240 and sub-trenches 242 may be formed by continuously patterning the pattern structure 204, the insulation layers 220, 220U and the sacrificial layers 210L, 210, 210U. The main-trench 240 and the sub-trenches 242 may be formed by the process described with reference to FIG. 4F. Before the main-trench 240 and the sub-trenches 242 are formed, a capping insulation layer (not shown) covering the pattern structure 204, the insulation layers 220, 220U and the sacrificial layers 210L, 210, 210U may be formed.

The main-trench 240 may define preliminary stack structures having sacrificial patterns 210La, 210a, 210Ua and insulation patterns 220a, 220Ua which are stacked alternatingly and repeatedly. The main-trench 240 may extend in the first direction, and the preliminary stack structures may be mirror-symmetric to each other about the main-trench 240.

The sub-trenches 242 may extend in the first direction and define some portions of the preliminary stack structures through which the semiconductor pillars 230 penetrate to have a line shape extending in the first direction.

Each of the sacrificial patterns 210La, 210a, 210Ua may include a flat portion 'a' parallel to the top surface of the substrate 200, and a sidewall portion 'b' extending upward from one end of the flat portion 'a'. The sidewall portion 'b' of each of the sacrificial patterns 210La, 210a, 210Ua may include at least one first portion 'b1' extending in the first direction, and at least one second portion 'b2' extending in the second direction.

Sidewalls of the sacrificial patterns 210La, 210a, 210Ua and sidewalls of the insulation patterns 220a, 220Ua may be exposed by the sidewalls of the main-trench 240 and the sub-trenches 242.

Figure 10D:
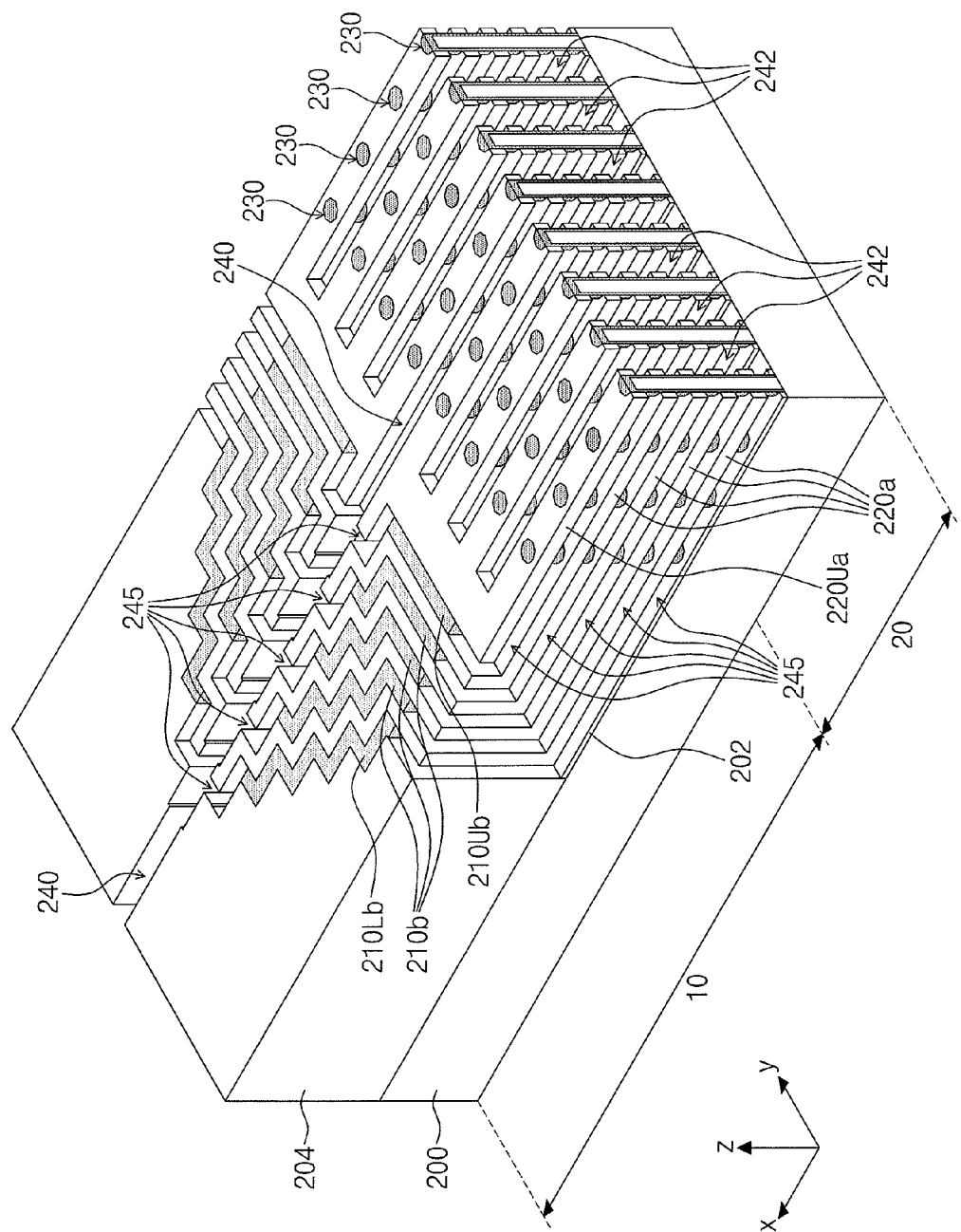

Referring to FIG. 10D, recess regions 245 may be formed by, for example, performing a selective etching process such that some of the sacrificial patterns 210La, 210a, 210Ua exposed by the main-trench 240 and the sub-trenches 242 is removed and the other is left.

First portions of sidewall portions of the sacrificial patterns 210La, 210b, 210Ua exposed by the main-trench 240 may be at least removed. After the selective etching process, the remaining sacrificial patterns 210La, 210b, 210Ua may be left. The selective etching process may be the selective etching process described with reference to FIG. 4G. The buffer dielectric layer 202 which is thinner than the insulation patterns 220a, 220Ua may be removed during the selective etching process. Unlike this, the buffer dielectric layer 202 may be left. Hereinafter, for the convenience of the description, a case where the buffer dielectric layer 202 is left will be described.

The recess regions 245 may expose some portions of the sidewall of the semiconductor pillar 230 contacting the sacrificial patterns 110La, 110a, 110Ua, respectively.

Figure 10E:
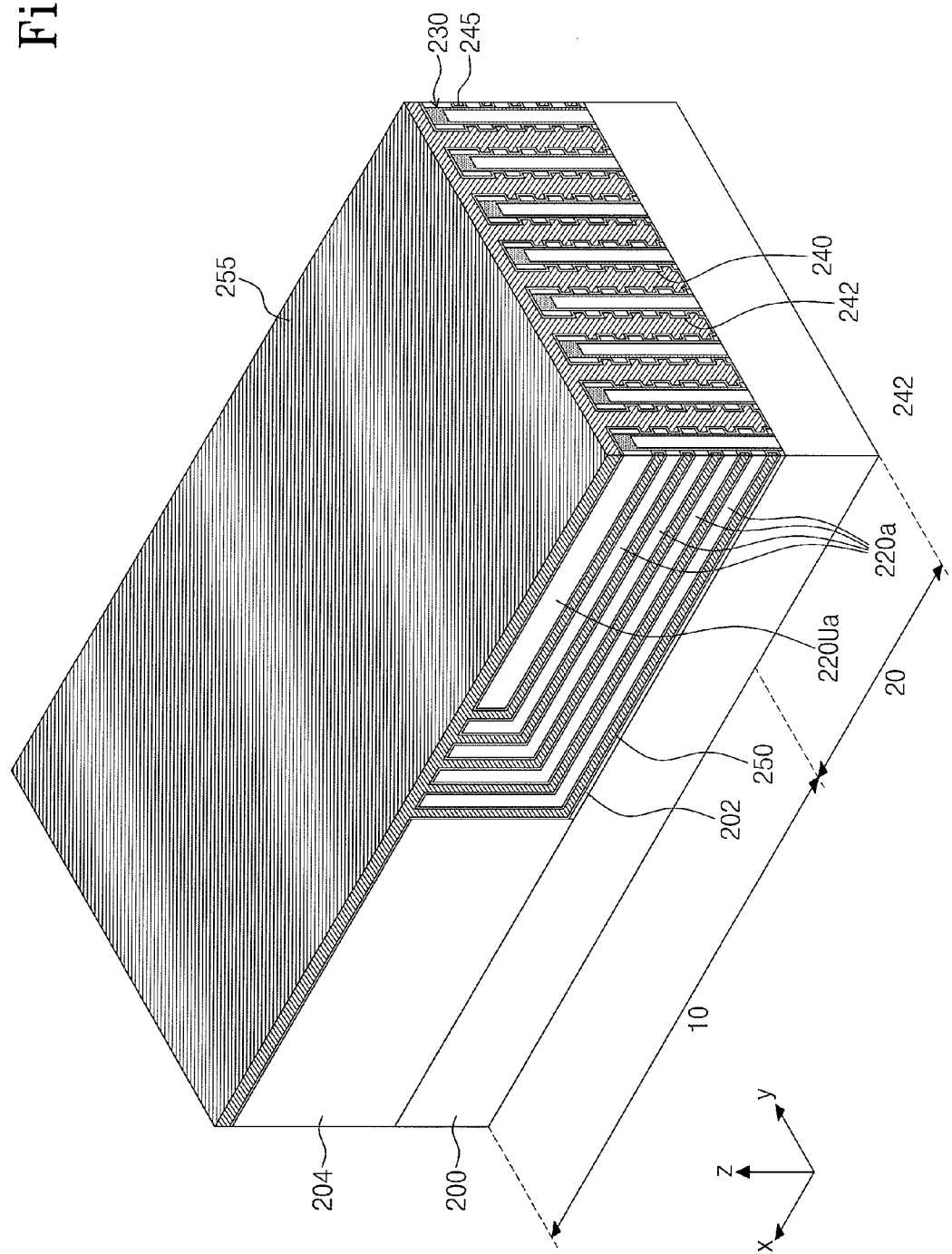

Referring to FIG. 10E, after the recess regions 245 are formed, an information storage layer 250 may be formed on the substrate 200. The information storage layer 250 may be formed by the process described with reference to FIG. 4G. The information storage layer 250 may be formed with a substantially uniform thickness along inner surfaces of the recess regions 245. The information storage layer 250 may fill some portions of the recess regions 245. The forming of the information storage layer 250 may include sequentially forming the tunnel dielectric layer 150a, the charge storage layer 150b, and the blocking layer 150c, which is described with reference to FIG. 3.

After the information storage layer 250 is formed, a gate conductive layer 255 may be formed over the substrate 200 by the process described with reference to FIG. 4G. The gate conductive layer 255 may fill the recess regions 245. The gate conductive layer 255 may fill some or the entire regions of the main- and sub-trenches 240 and 242. The gate conductive layer 255 may be electrically isolated by the information storage layer 250 from the semiconductor pillar 230 and the substrate 200.

Figure 10F:
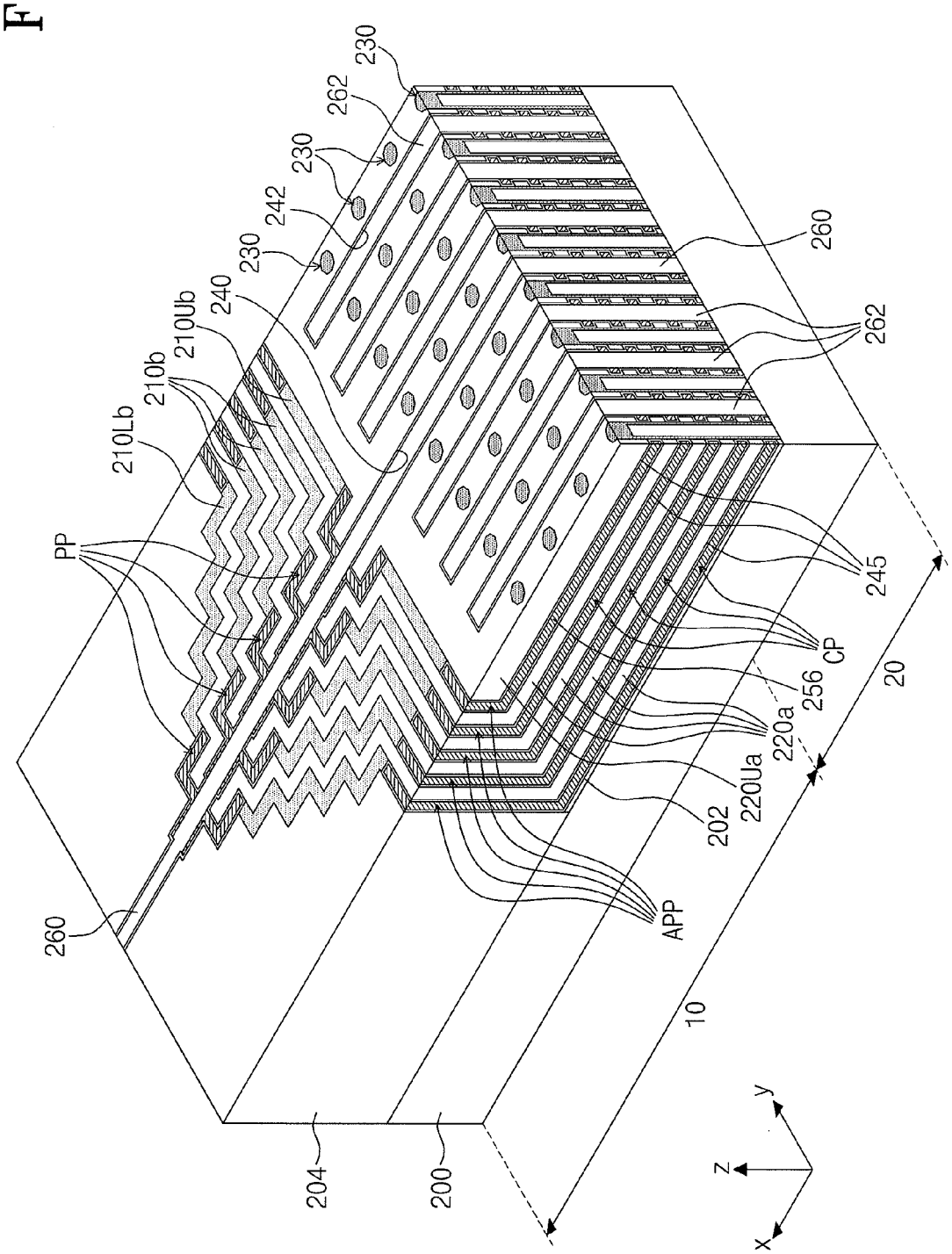

Referring to FIG. 10F, after the gate conductive layer 255 is formed, the gate conductive layer 255 positioned outside the recess regions 245 is removed, so that conductive patterns CP, pad patterns PP, auxiliary pad patterns APP, and a preliminary string select line 256 may be formed in the recess regions 245. The gate conductive layer 255 positioned outside the recess regions 245 may be removed by, for example, a wet etching and/or dry etching process, etc. Main- and sub-device isolation patterns 260 and 262 filling the main- and sub-trenches 240 and 242 may be formed, respectively. The main- and sub-device isolation patterns 260 and 262 may be formed by the process described with reference to FIG. 4I.

Figure 10G:
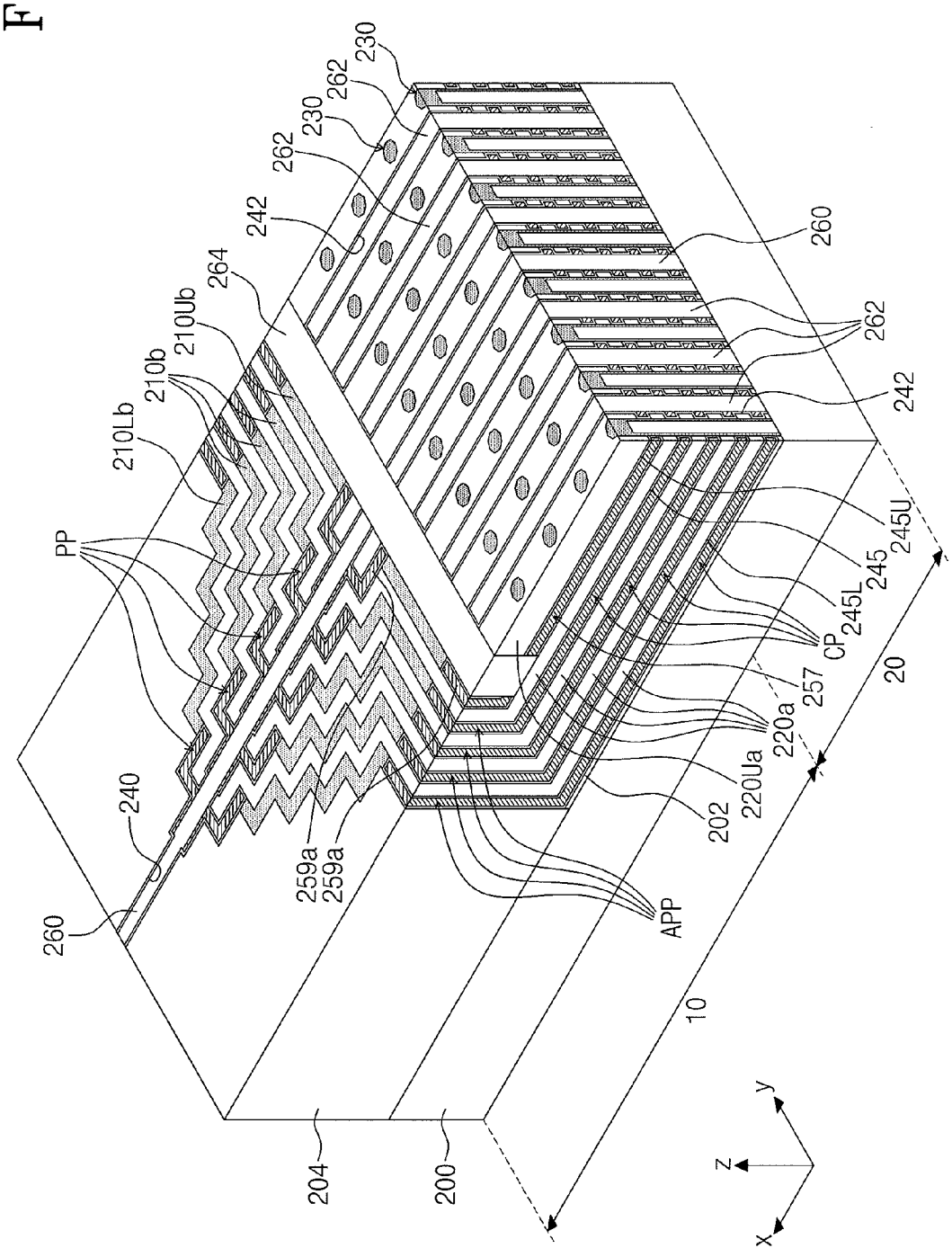

Referring to FIG. 10G, the preliminary string line 256 and the uppermost insulation pattern 220Ua may be patterned to form a string select line 257 extending in the first direction, and floating conductive patterns 259a, 259b. An insulation material 264 may be formed between the floating conductive patterns 259a, 259b and the string select line 257.

The stacked conductive patterns CP, the string select lines 257 on the stacked conductive patterns CP, and the insulation patterns 220a, 220Ua may define one stack structure.

Continuously referring to FIGS. 8, 9A and 9B, an interlayer insulation layer 270 may be formed on the stack structure. Bit line contact plugs 272 and cell contact plugs 274 penetrating the interlayer insulation layer 270 may be formed. The bit line contact plug 272 may be connected to the drain portion 236 of the semiconductor pillar 230. The cell contact plugs 274 may be connected to the first portions SP1 of the landing sidewall portions LSP, respectively. The bit line contact plug 272 and the cell contact plug 274 may be formed by, for example, forming contact holes penetrating the interlayer insulation layer 270 to expose the drain portions 236 and the first portions SP1 of the landing sidewall portions LSP and filling the contact holes with a conductive layer. A bit line 282 connected to the bit line contact plugs 272 and extending in the second direction, and a conductive wiring 284 connected to the cell contact plugs 274 may be formed.

Figure 11:
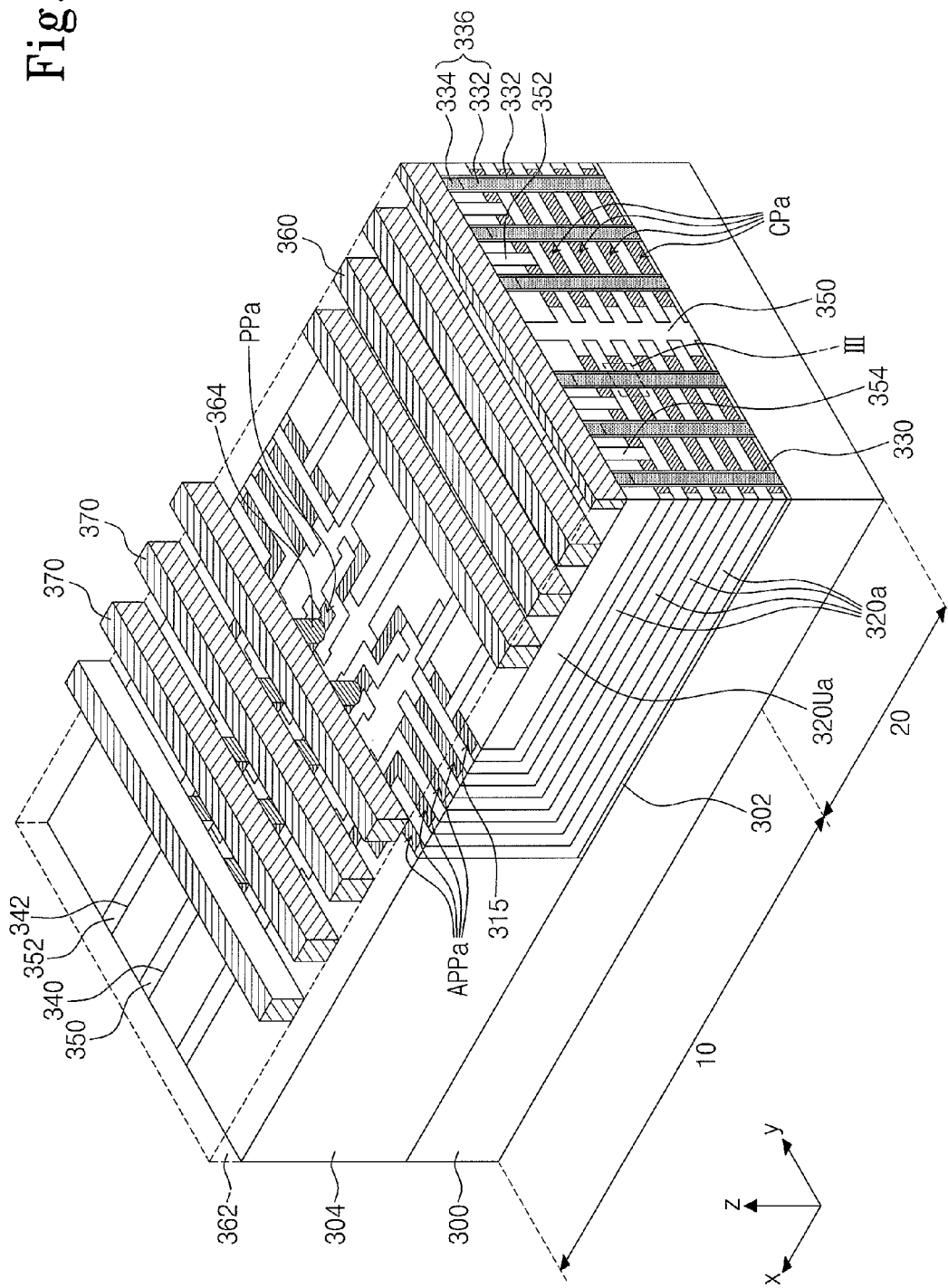
FIGS. 11, 12A and 12B are perspective views illustrating a semiconductor device according to an embodiment of the inventive concept.
Figure 12A:
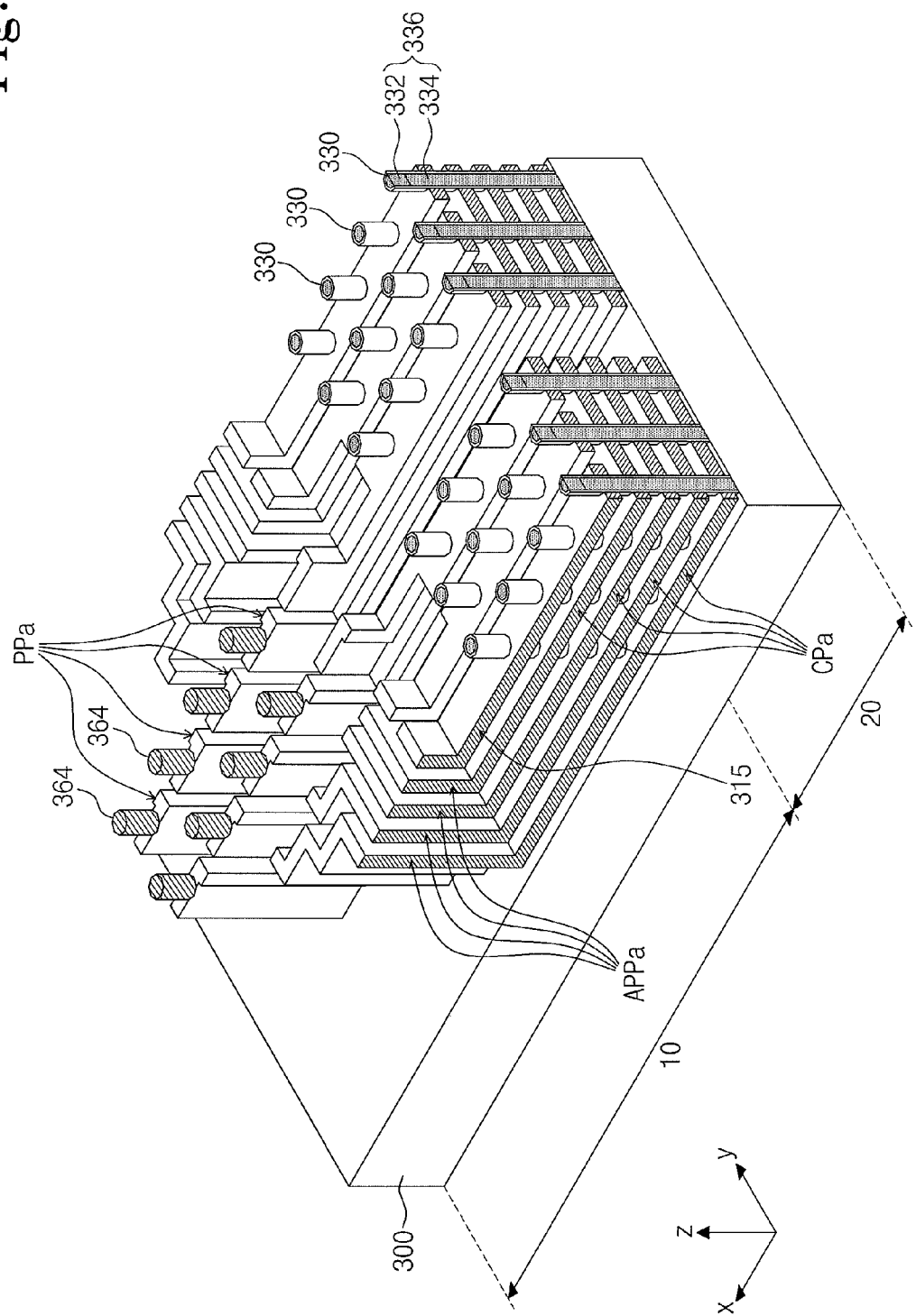
Figure 12B:
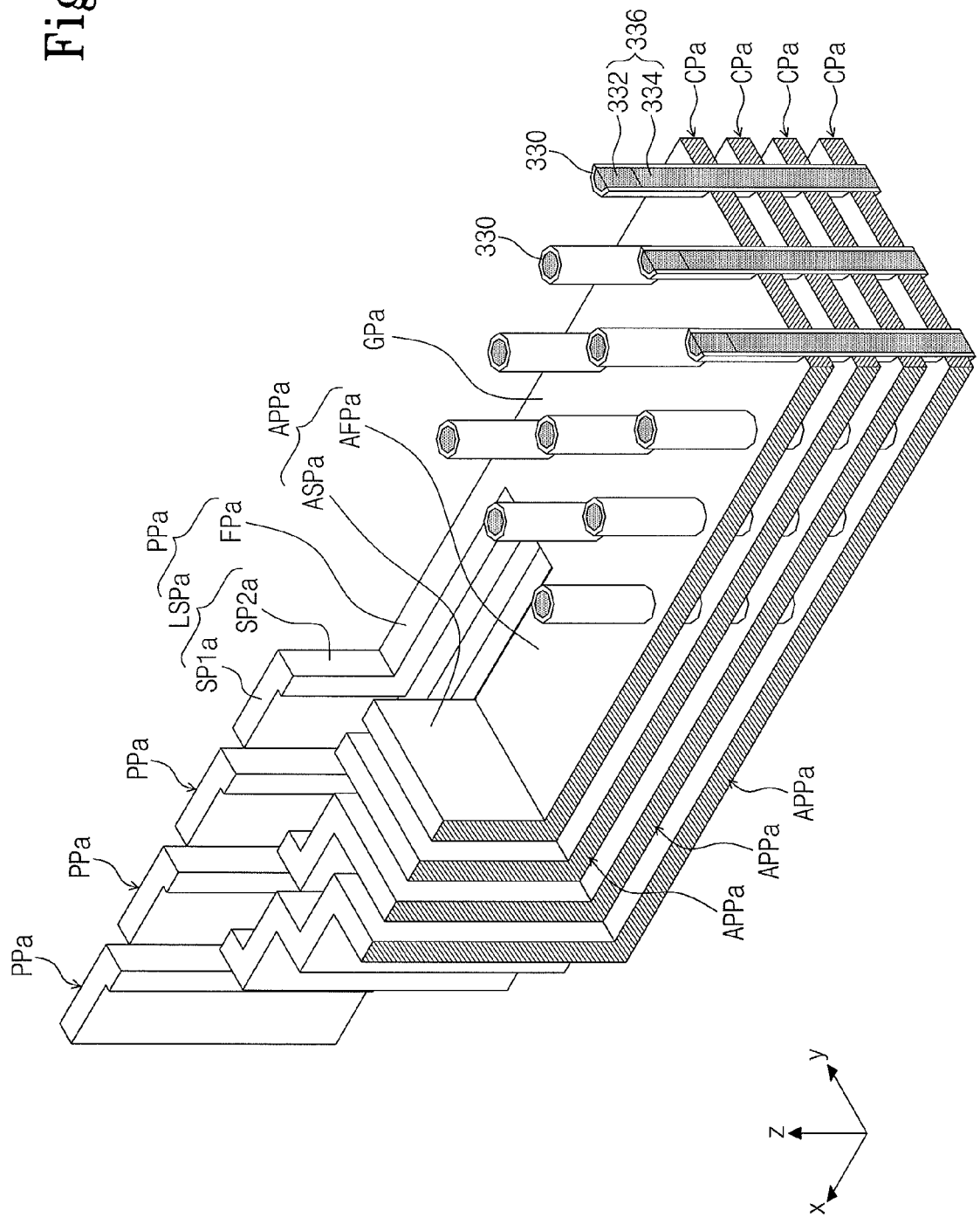

A semiconductor device according to a fourth embodiment of the inventive concept will now be described. FIGS. 11, 12A and 12B are perspective views illustrating a semiconductor device according to a fourth embodiment of the inventive concept. For the convenience of the description, FIG. 12A illustrates conductive patterns CPa, pad patterns PPa, auxiliary pad patterns APPa, a string select line 315, a substrate 300, a semiconductor pillar 336, and cell contact plugs 364, and FIG. 12B illustrates semiconductor pillars 336, conductive patterns CPa included in one stack structure, pad patterns PPa connected to the conductive patterns CPa, and auxiliary pad patterns APPa connected to the conductive patterns CPa. For the convenience of the recognition, some patterns of the conductive patterns CPa, the pad patterns PPa and the auxiliary pad patterns APPa are omitted.

Referring to FIGS. 11, 12A and 12B, the substrate 300 may include a first region 10 and a second region 20. The first region 10 may be a pad region where pad patterns are disposed, and the second region 20 may be a region where three-dimensional cells are disposed. The substrate 300 may be the substrate 100 described with reference to FIGS. 1, 2A and 2B. A pattern structure 304 may be disposed on the substrate 300 within the first region 10. The pattern structure 304 may be the same as the pattern structure 106 described with reference to FIGS. 1, 2A and 2B.

Conductive patterns CPa stacked spaced apart from each other may be disposed on the substrate 300 within the second region 20. Each of the conductive patterns CPa may have a flat plate shape extending in the first and second directions, respectively. The first direction and the second direction are parallel to the top surface of the substrate 300 and may cross each other. In the drawings, the first direction may be an x-axis direction and the second direction may be a y-axis direction.

Pad patterns PPa may extend in the first direction from sidewalls of the conductive patterns CPa, respectively. Among the stacked conductive patterns CPa, the pad pattern PPa connected to the conductive pattern CPa positioned at a relatively low level may extend further in the first direction than the pad pattern PPa connected to conductive pattern CPa positioned at a relatively high level.

Each of the pad patterns PPa may include a flat portion FPa, and a landing sidewall portion LSPa extending upward from a top surface of the flat portion FPa. The flat portion FPa of any one of the pad patterns PPa and the conductive pattern CP connected to the any one of the pad patterns PPa may be positioned at the same level from the top surface of the substrate 300, and may have the same thickness. Among the conductive patterns CPa stacked on the substrate 300, the flat portion FPa connected to the conductive pattern CPa positioned at a relatively low level may have a greater length in the first direction than the flat portion FPa connected to the conductive pattern CPa positioned at a relatively high level. Therefore, the flat portions FPa respectively connected to the conductive patterns CPa stacked on the substrate 300 may have, for example, a shape of a terraced structure in which the widths of the flat portions FPa decrease gradually away from the top surface of the substrate 300. The stacked flat portions FPa may have, for example, a terraced structure descending toward the first region 10 from the second region 20.

Top surfaces of the landing sidewall portion LSPa may be positioned at the same level from the top surface of the substrate 300. Among the conductive patterns CPa stacked on the substrate 300, the landing sidewall portion LSPa extending from the flat portion FPa connected to the conductive pattern CPa positioned at a relatively low level may have a greater length in the third direction than the landing sidewall portion LSPa extending from the flat portion FPa connected to the conductive pattern CPa positioned at a relatively high level.

Each of the landing sidewall portions LSPa may include a first portion SP1a extending in the first direction, and a second portion SP2a extending in the second direction. The width of the first portion SP1a of the landing sidewall portion LSPa in the first direction may be less than the width of the flat portion FPa in the first direction and more than the thickness of the conductive pattern CPa. The width of the first portion SP1a of the landing sidewall portion LSPa in the second direction may be less than the width of the flat portion FPa in the second direction. The width of the second portion SP2a of the landing sidewall portion LSPa in the second direction may be equal to the width of the flat portion FPa in the second direction. The first portion SP1a may be relatively more distant from the conductive pattern CP than the second portion SP2a.

In a plane view, top surfaces of the first portions SP1a of the landing sidewall portions LSPa connected to the stacked conductive patterns CPa may be arranged in the first direction to form one row. In the one row, the first portions SP1a may be spaced apart from each other. The top surfaces of the respective first portions SP1a may have, for example, a substantially rectangular shape having a long-side in the first direction. A space between the top surfaces of the first portions SP1a adjacent to each other in the first direction may be shorter than the lengths of the long-sides of the top surfaces of the first portions SP1a. The area of the top surfaces of the first portions SP1a may be larger than that of the top surfaces of the second portions SP2a. The areas of the top surfaces of the landing sidewall portions LSPa may be substantially equal to each other. The length of each of short-sides of the top surfaces of the first portions SP1a may be substantially equal to the thickness of each of the conductive patterns CPa. In one pad patterns PPa, the width of the first portion SP1a in the second direction may be equal to that of the second portion SP2a in the first direction.

Auxiliary pad patterns APPa may extend in the first direction from the sidewalls of the conductive patterns CPa. The auxiliary pad patterns APPa may be spaced apart from the pad patterns PPa. A sub-trench 342 may be defined between the pad pattern PPa and the auxiliary pad pattern APPa. A sub-device isolation pattern 352 may be disposed in the sub-trench 342. The sub-device isolation pattern 352 may be formed of an insulation material. The sub-device isolation pattern 352 may be disposed between the pad pattern PPa and the auxiliary pad pattern APPa. Among the stacked conductive patterns CPa, the auxiliary pad pattern APPa connected to the conductive pattern CPa positioned at a relatively low level may extend further in the first direction than the auxiliary pad pattern APPa connected to the conductive pattern CPa positioned at a relatively high level.

Each of the auxiliary pad patterns APPa may include an auxiliary flat portion AFPa, and an auxiliary sidewall portion ASPa extending upward from a top surface of the auxiliary flat portion AFPa. The auxiliary flat portion AFPa may extend in the first direction from some of the sidewall of the conductive pattern CPa. Among the conductive patterns CPa stacked on the substrate 300, the auxiliary flat portion AFPa connected to the conductive pattern CPa positioned at a relatively low level may have a greater length in the first direction than the auxiliary flat portion AFPa connected to the conductive pattern CPa positioned at a relatively high level. Therefore, the flat portions FPa respectively connected to the conductive patterns CPa stacked on the substrate 300 may have, for example, a shape of a terraced structure in which the widths of the flat portions FP decrease away from the substrate 300. The stacked auxiliary flat portions AFPa may have, for example, a terraced structure descending toward the first region 10 from the second region 20. Top surfaces of the auxiliary sidewall portions ASPa may be positioned at the same level from the top surface of the substrate 300. Among the auxiliary sidewall portions ASPa, at least one may include a first portion extending in the first direction, and a second portion extending in the second direction.

Any one of the conductive patterns CPa, the pad pattern PPa connected to the any one of the conductive patterns CPa, and the auxiliary pad pattern APPa connected to the any one of the conductive patterns CPa may be connected to one another without any boundary surface to form one body.

Insulation patterns 320a, 320Ua may be disposed between the stacked conductive patterns CPa. Each of the insulation patterns 320a under the uppermost insulation pattern 320Ua may include an insulation flat portion and an insulation sidewall portion. The insulation flat portion may be parallel to the top surface of the substrate 300, and the insulation sidewall portion may extend upward from one end of the insulation flat portion. The insulation flat portions may be disposed between the stacked conductive patterns CPa, between the stacked flat portions FPa, and between the stacked auxiliary flat portions AFPa. The insulation sidewall portions may be disposed between the landing sidewall portions LSPa connected to the stacked conductive patterns CPa, and between the auxiliary sidewall portions connected to the stacked conductive patterns CPa.

String select lines 315 may be disposed on the uppermost conductive pattern CPa. The string select lines 315 may be disposed spaced apart from each other in the second direction. The string select lines 315 may be positioned at the same level from the top surface of the substrate 300. The string select lines 315 adjacent to each other in the second direction may be isolated by an insulation material 354 disposed therebetween. The insulation material 354 may be disposed on the insulation pattern 320a positioned directly under the string select lines 315. Each of the string select lines 315 may include a flat portion parallel to the substrate 300, and a sidewall portion extending upward from one end of the flat portion. The flat portion of the string select line 315 may have, for example, a line shape extending in the first direction.

The insulation patterns 320a, 320Ua may include, for example, an oxide. For example, the insulation patterns 320a, 320Ua may include a silicon oxide. The conductive patterns CPa, the pad patterns PPa, the auxiliary pad patterns APPa and the string select lines 315 may include a conductive material. For example, the conductive patterns CPa, the pad patterns PPa, the auxiliary pad patterns APPa and the string select lines 315 may include at least one of metals (e.g., tungsten, aluminum, titanium, tantalum, etc.), conductive metal nitrides (e.g., titanium nitride, tantalum nitride, etc.), and doped semiconductor materials (e.g., doped silicon, doped germanium, doped silicon germanium, etc.).

The stacked conductive patterns CPa, the string select lines 315 on the stacked conductive patterns CPa, and the insulation patterns 320a, 320Ua between the stacked conductive patterns CPa and the string select lines 315 may define one stack structure. The stack structure may be provided in plurality on the substrate 300. A main-device isolation pattern 350 may be disposed between one pair of stack structures adjacent to each other. The stack structures in one pair may be mirror symmetric to each other from the main-device isolation pattern 350. The main-device isolation pattern 350 may be disposed in a main-trench 340 between the stack structures. The main-device isolation pattern 350 may be disposed on the substrate 300 at one side of the stack structures. The main-device isolation pattern 350 may be formed of an insulation material. The stack structures may be disposed spaced apart from each other in the second direction.

An information storage layer 330 covering a sidewall of a channel opening 325 penetrating the string select line 315, the stacked conductive patterns under the string select line 315 and the insulation patterns 320a, 320Ua may be disposed. An inner space enclosed by the information storage layer 330 in the channel opening 325 may be filled with the semiconductor pillar 336. By doing so, the information storage layer 330 may be disposed between the conductive patterns CPa and the semiconductor pillar 336.

The channel opening 325 and the semiconductor pillar 336 may be provided in plurality. The semiconductor pillar 336 may extend in the third direction. The third direction may correspond to a z-axis direction. For example, the semiconductor pillar 336 contacts the substrate 300. The plurality of semiconductor pillars 336 may, for example, be arranged two-dimensionally in the first and second directions. The semiconductor pillar 336 may penetrate the respective stack structures. Each of the semiconductor pillars 336 may include a semiconductor portion 332 filling the channel opening 325, and a drain portion 334. The drain portion 334 may be a region corresponding to an upper portion of the semiconductor portion 332 doped with, for example, a second-type dopant. The semiconductor pillar 336 may include, for example, a single crystalline or polycrystalline semiconductor. Unlike the drawings, the semiconductor pillar may be formed, for example, in a cylindrical shape including a semiconductor portion conformally covering the inner wall of the channel opening 325, and a filling insulation material filling an inner space enclosed by the semiconductor portion in the channel opening.

Figure 13:
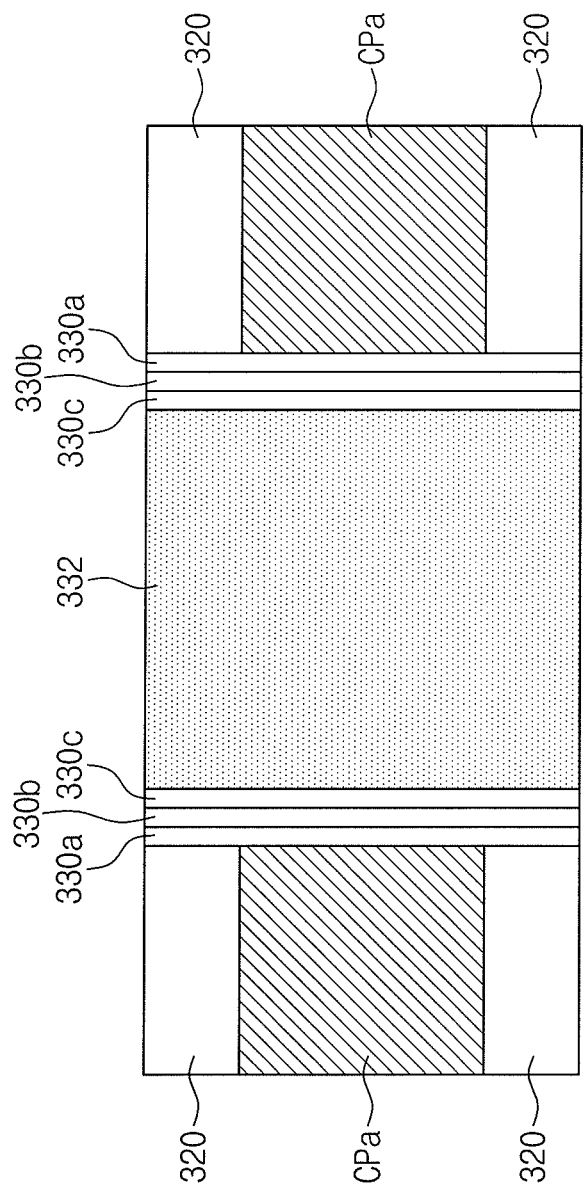
FIG. 13 is an enlarged view of portion III of FIG. 11 for describing an information storage layer included in a semiconductor device according to an embodiment of the inventive concept.

The information storage layer 330 may be formed, for example, in a multi-layer structure, which will be described with reference to FIG. 13. FIG. 13 is an enlarged view of portion III of FIG. 11 for describing an information storage layer included in a semiconductor device according to the fourth embodiment of the inventive concept.

The information storage layer 330 may include a blocking layer 330a, a charge storage layer 330b and a tunnel dielectric layer 330c. The blocking layer 330a may be formed to cover the sidewall of the channel opening 325. The charge storage layer 330b may be disposed between the blocking layer 330a and the semiconductor pillar 336. The tunnel dielectric layer 330c may be disposed between the charge storage layer 330b and the semiconductor pillar 336. The blocking layer 330a, the charge storage layer 330b and the tunnel dielectric layer 330c may include the same material as the blocking layer 150c, the charge storage layer 150b and the tunnel dielectric layer 150a described with reference to FIG. 3, respectively.

A common source region may be disposed in the substrate 300 under the stack structures. The common source region may be a region doped with, for example, the second-type dopant. The lowermost conductive pattern CPa may control an electrical connection between the common source region and the semiconductor pillar 336. The common source region may be disposed in a flat plate shape in the substrate 300.

Cell contact plugs 364 may be provided on the first portions SP1a of the landing sidewall portions LSPa. The cell contact plugs 364 may contact the first portions SP1a of the landing sidewall portions LSPa, respectively. The cell contact plugs 364 may penetrate an interlayer insulation layer 362 covering the stack structures. The widths of the cell contact plug 364 in the first and second directions may be greater than the width of the first portion SP1a of the landing sidewall portion LSPa in the second direction. Conductive wirings 370 connected to the cell contact plug 364 may be provided.

A bit line 360 may be electrically connected to the drain portions 334 of the semiconductor pillars 336. The string select line 315 may control an electrical connection between the bit line 360 and the vertical type cell string. The bit line 360 extends in the second direction. The bit line 360 may be provided in plurality. The bit lines 360 may be parallel to each other. One bit line 360 may be electrically connected to the plurality of drain portions 334 formed in the plurality of semiconductor pillars 336 arranged in the second direction to form one row. Alternatively, the bit line 360 may be connected to the drain portions 334 by a plug penetrating the interlayer insulation layer 362.

A method of fabricating a semiconductor device according to the fourth embodiment of the inventive concept will be described. FIGS. 14A to 14F are perspective views for describing a method of fabricating a semiconductor device according to the fourth embodiment of the inventive concept.

Figure 14A:
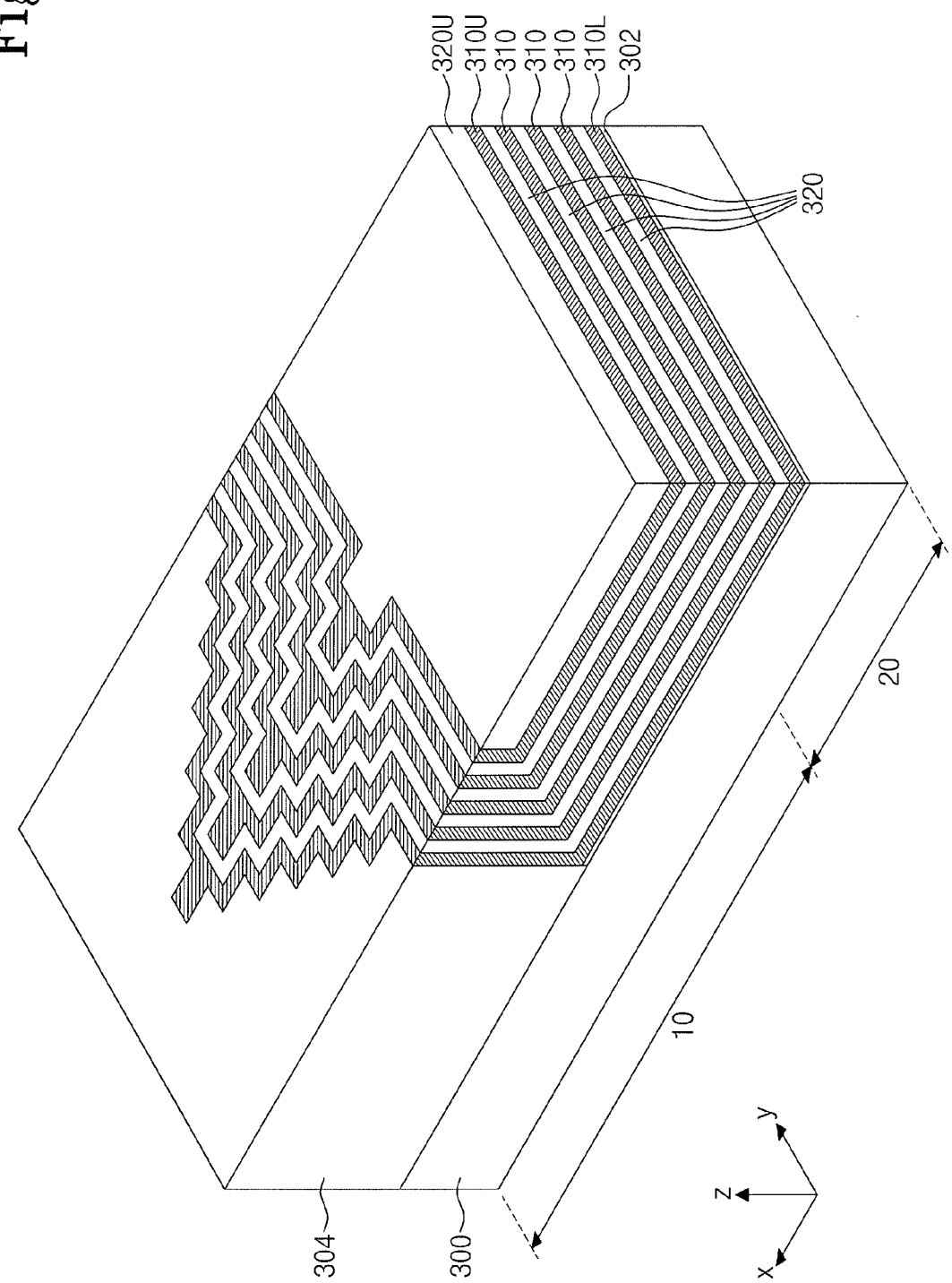
FIGS. 14A to 14F are perspective views for describing a method of fabricating a semiconductor device according to an embodiment of the inventive concept.

Referring to FIG. 14A, a substrate 300 including a first region 10 and a second region 20 is prepared. A pattern structure 304 may be formed on the substrate 300 in the first region 10. The pattern structure 304 may be formed by the process of forming the pattern structure 107 described with reference to FIG. 4A. A buffer dielectric layer 302 covering the top surface of the substrate 300 may be formed. For example, the buffer dielectric layer 302 may include a silicon oxide layer formed by a thermal oxidation process. A common source region may be formed in the substrate 300 by, for example, using the buffer dielectric layer 302 as an ion implantation mask. The common source region may be a region doped with a second-type dopant. The common source region may be disposed in, for example, a flat plate shape under the top surface of the substrate 300.

After the pattern structure 304 is formed, first material layers, and second material layers including a different material from the first material layers may be alternatingly and repeatedly stacked on the substrate 300. The first material layers may be conductive layers 310L, 310, 310U, and the second material layers may be insulation layers 320, 320U. For example, after the conductive layers 310L, 310, 310U are stacked, a planarization process using a top surface of the pattern structure 304 as an etch stop layer may be performed.

The conductive layers 310L, 310, 310U may be formed of the same material. The lowermost and uppermost conductive layers 310L and 310U may be formed thicker than the conductive layers 310 therebetween. The conductive layers 310 between the lowermost and uppermost conductive layers 310L and 310U may be formed with the same thickness. The insulation layers 320, 320U may be formed of the same material. Among the insulation layers 320, 320U, the uppermost insulation layer 320U may be formed thicker than the insulation layers 320 under the uppermost insulation layer 320U. The insulation layers 320 under the uppermost insulation layer 320U may be formed with the same thickness.

Each of the conductive layers 310L, 310, 310U may includes a flat portion parallel to the top surface of the substrate 300, and a sidewall portion extending from one end of the flat portion. The sidewall portion may include at least one first portion extending in the first direction, and at least one second portion extending in the second direction. Among the stacked conductive layers 310L, 310, 310U, the number of the first and second portions of the conductive layers positioned at a relatively low level may be greater than the number of the first and second portions of the conductive layers positioned at a relatively high level.

Each of the insulation layers 320 under the uppermost insulation layer 320U may include a flat portion parallel to the top surface of the substrate 300, and a sidewall portion extending from one end of the flat portion. The sidewall portion of the insulation layer 320 may include at least one first portion extending in the first direction, and at least one second portion extending in the second direction. Among the stacked insulation layers 320, the number of the first and second portions of the insulation layers positioned at a relatively low level may be greater than the number of the first and second portions of the sacrificial layers positioned at a relatively high level.

Figure 14B:
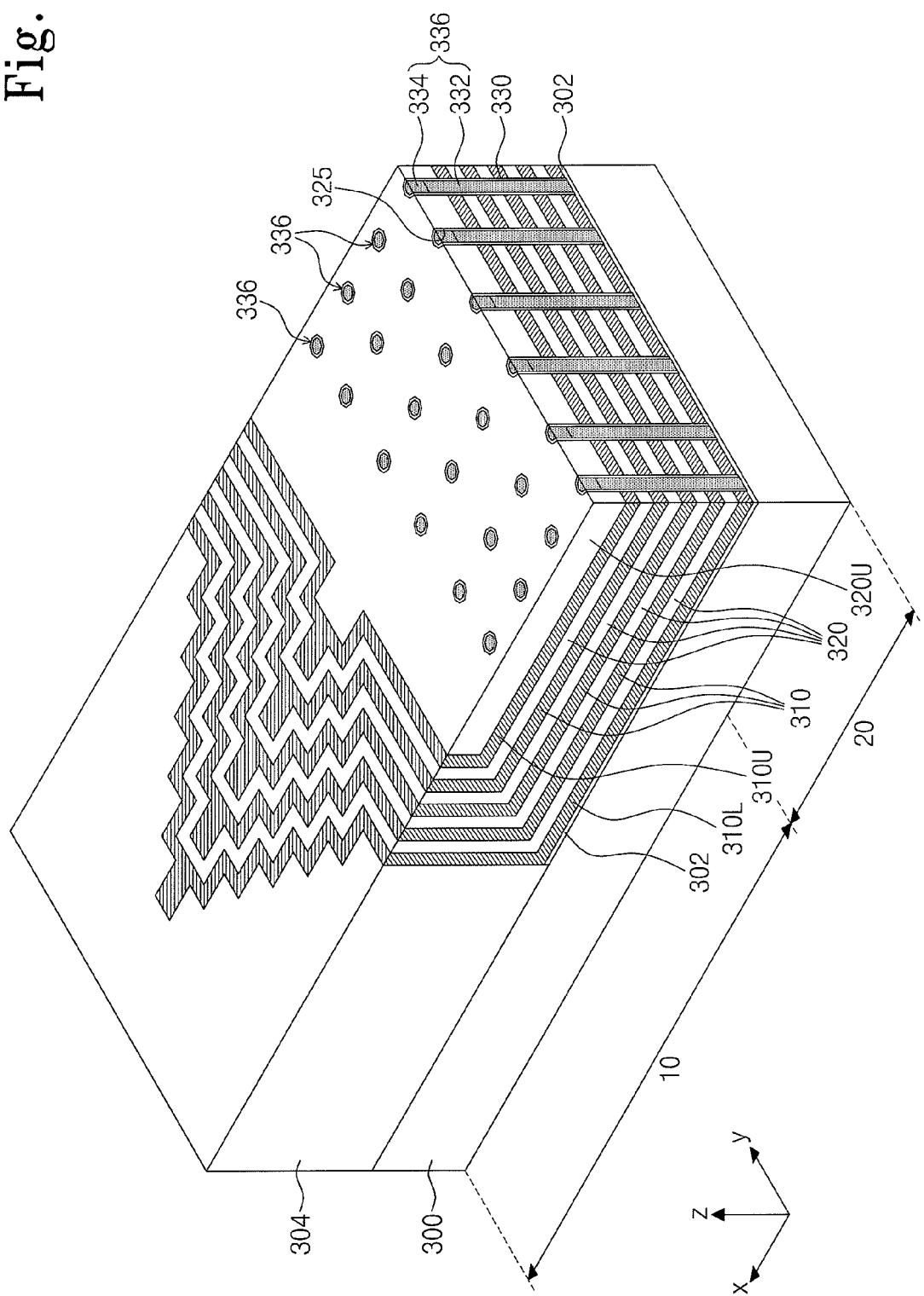

Referring to FIG. 14B, channel openings 325 exposing the top surface of the substrate 300 may be formed by, for example, continuously patterning the buffer dielectric layer 302, the insulation layers 320, 320U and the conductive layers 310L, 310, 310U. The channel openings 325 may be formed by, for example, patterning the flat portions of the insulation layers 320, 320U and the flat portions of the conductive layers 310L, 310, 310U. The channel openings 325 may be formed by, for example, using an anisotropic etching process. The channel openings 325 may have, for example, a hole shape. The channel openings 325 may be spaced apart from one another. The channel openings 325 may be arranged, for example, two-dimensionally in the first direction and the second direction. The channel openings 325 may have, for example, a circular, elliptical, or polygonal shape in plan view.

An information storage layer 330 conformally covering the sidewall of the channel opening 325 may be formed. The information storage layer 330 may be formed by, for example, forming a preliminary information storage layer covering the sidewall and a bottom of the channel opening 325 to form a spacer which covers a portion of the preliminary information storage layer covering the sidewall of the channel opening 325 but does not cover a portion of the preliminary information storage layer covering the bottom of the channel opening 325, and removing some of the exposed preliminary information storage layer using the spacer as an etch stop layer. The spacer may be formed by, for example, forming a spacer layer covering the sidewall and bottom of the channel opening 325 and anisotropically etching the spacer layer. The spacer layer may include, for example. a semiconductor material. The preliminary information storage layer may be formed by, for example. sequentially forming the blocking layer 330a, the charge storage layer 330b and the tunnel dielectric layer 330c described with reference to FIG. 13.

Semiconductor pillars 336 filling an inner space enclosed by the information storage layer 330 in the channel openings 325 may be formed. The semiconductor pillars 336 may be formed by, for example, forming a semiconductor material filling the inner space and implanting a second-type dopant into an upper portion of the filled semiconductor material.

Figure 14C:
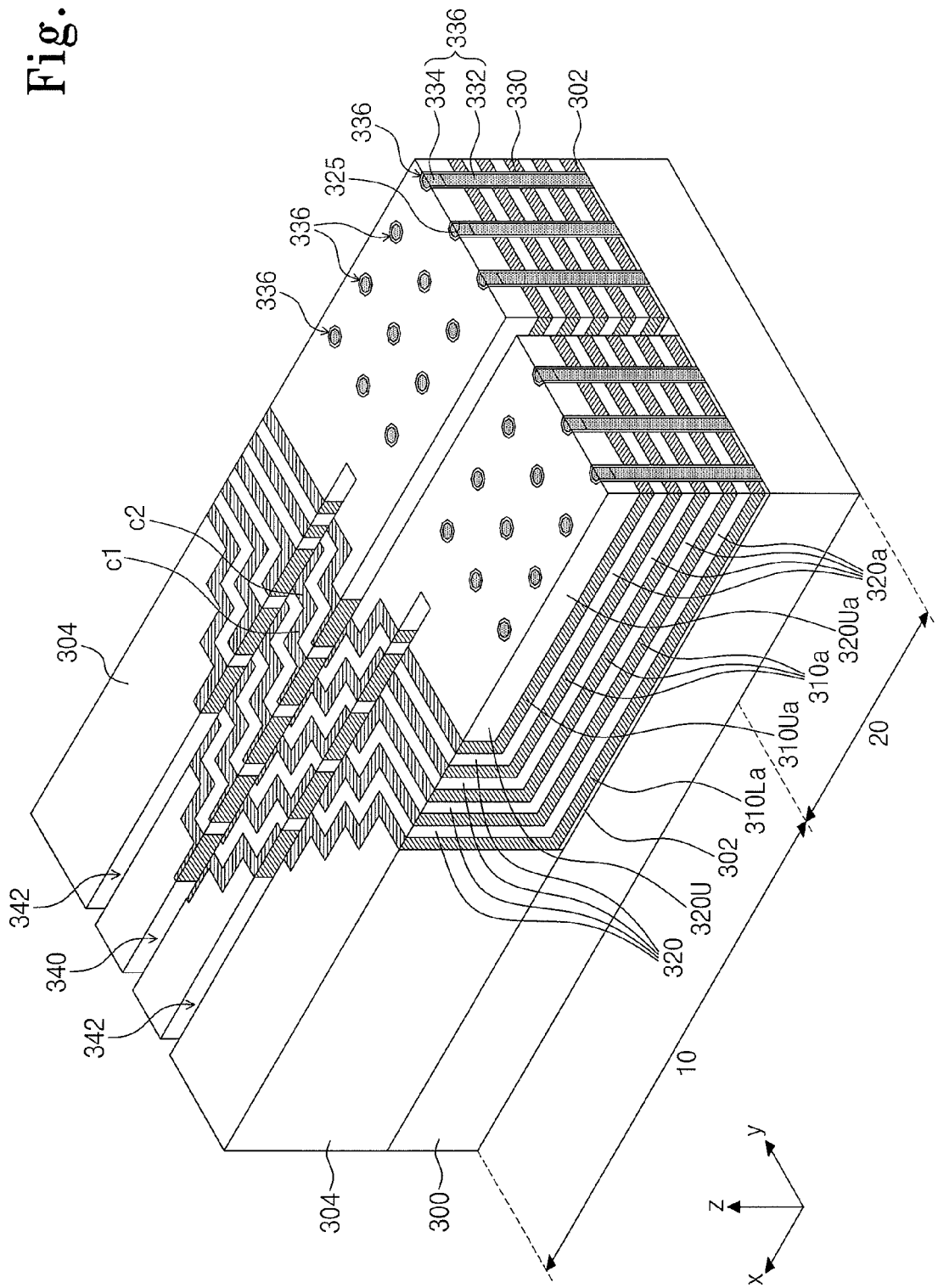

Referring to FIG. 14c, a main-trench 340 and sub-trenches 342 may be formed by, for example, continuously patterning the pattern structure 304, the insulation layers 320, 320U and the conductive layers 310L, 310, 310U. The length of the main-trench 320 in the first direction may be longer than the length of the sub-trench 342. The main-trench 340 and the sub-trenches 342 may be formed by, for example, an anisotropic etching process using a dry and/or wet etching process. In the case where the semiconductor pillars 336 arranged in the first direction form one row, the main-trench 340 may be disposed between the rows adjacent to each other.

The main-trench 340 may define preliminary stack structures having preliminary conductive patterns 310La, 310a, 310Ua and insulation patterns 320a, 320Ua which are stacked alternatingly and repeatedly. The main-trench 340 may extend in the first direction, and the preliminary stack structures may be mirror-symmetric to each other about the main-trench 340. Each of the preliminary conductive patterns 310La, 310a, 310Ua and the insulation patterns 320a included in the preliminary stack structure may include a flat portion parallel to the top surface of the substrate 300, and a sidewall portion extending upward from one end of the flat portion.

Each of sidewall portions of the preliminary conductive patterns 310La, 310a, 310Ua adjacent to the main-trench 340 may include a first portion 'c1' extending in the first direction, and a second portion 'c2' extending in the second direction. In a plane view, top surfaces of the first portions 'c1' of the sidewall portions of the preliminary conductive patterns 310La, 310a, 310Ua adjacent to the main-trench 340 may have, for example, a substantially rectangular shape having a long-side in the first direction. The long-side of the top surfaces of the first portions 'c1' may be longer than the distance between the top surface of the first portions 'c1' adjacent to each other.

The sidewalls of the preliminary conductive patterns 310La, 310a, 310Ua and the insulation patterns 320a, 320Ua may be exposed by the sidewalls of the main- and sub-trenches 340 and 342. Before the main- and sub-trenches 340 and 342 are formed, a capping insulation layer (not shown) covering the conductive layers 310L, 310, 310U and the insulation layers 320, 320U may be formed.

Figure 14D:
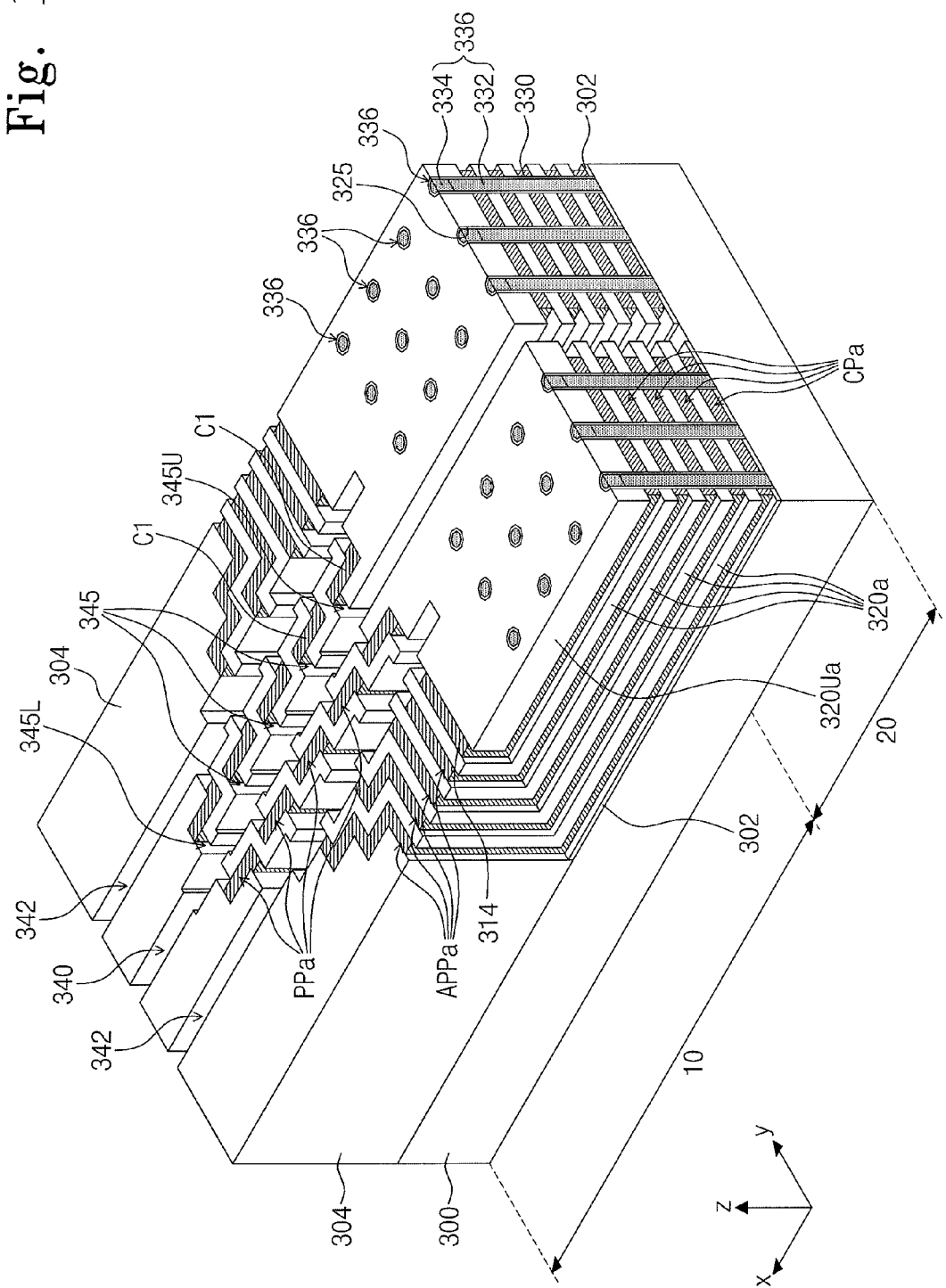

For example, referring to FIG. 14D, a selective etching process may be performed such that some portions of the preliminary conductive patterns 310La, 310a, 310Ua exposed by the main- and sub-trenches 340 and 342 are etched to form recess regions 345L, 345, 345U and the remaining portions of the preliminary conductive patterns 310La, 310a, 310Ua are left. After the selective etching process, at least the first portions 'c1' of the preliminary conductive patterns 310La, 310a, 310Ua may be left. The preliminary conductive patterns 310La, 310a left under the uppermost preliminary conductive pattern 310Ua may be defined as the conductive patterns CPa, the pad patterns PP and the auxiliary pad patterns APPa described with reference to FIGS. 11, 12A and 12B. The left uppermost preliminary conductive pattern 310Ua may be defined as a preliminary string select line 314.

The selective etching process may be, for example, an isotropic etching process. The selective etching process may be performed by, for example, a wet etching and/or an isotropic dry etching, etc. The etch rate of the preliminary conductive patterns 310La, 310a, 310Ua by the selective etching process may be greater than the etch rate of the insulation patterns 320a, 320Ua by the selective etching process. Therefore, after the selective etching process is performed, the insulation patterns 320a, 320Ua may be left. After the selective etching process, the semiconductor pillars 336 may not be exposed.

Figure 14E:
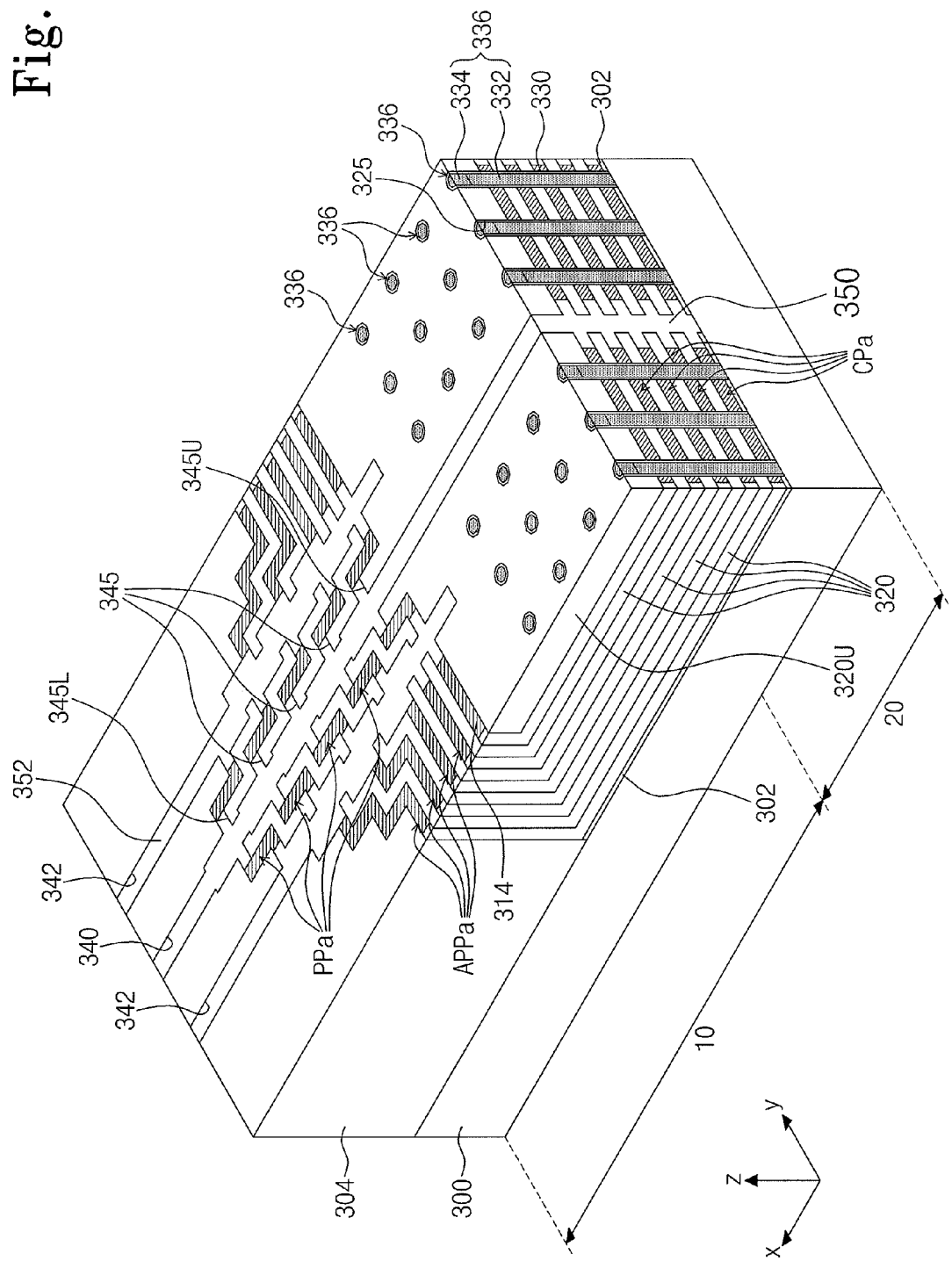

Referring to FIG. 14E, the main-trench 340, the sub-trenches 342 and the recess regions 345L, 345, 345U may be filled with an insulation material. The main-trench 340, and portions of the recess regions 345L, 345, 345U connected to the main-trench 340 may be filled with a main-device isolation pattern 350. The sub-trenches 342, and portions of the recess regions 345L, 345, 345U connected to the sub-trenches 342 may be filled with a sub-device isolation pattern 352. The main- and sub-device isolation patterns 350 and 352 may be formed of, for example, a silicon oxide.

Figure 14F:
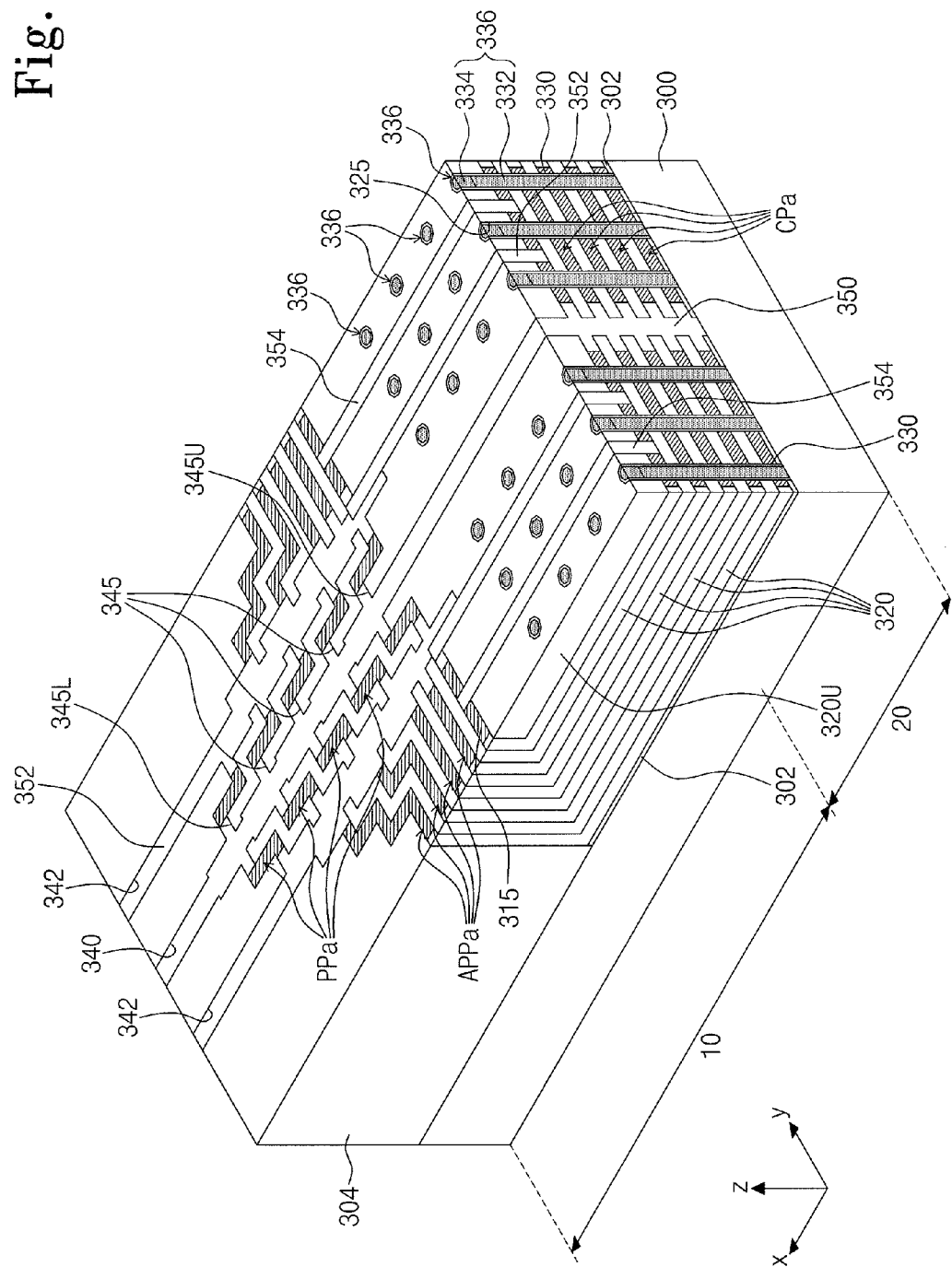

Referring to FIG. 14F, the preliminary string select line 314 and the uppermost insulation pattern 320Ua may be patterned to form string select lines 315 extending in the first direction. An insulation material 354 may be disposed between the string select lines 315 spaced apart from each other in the second direction. By doing so, the stacked conductive patterns CPa, the string select lines 315 on the stacked conductive patterns CPa, and the insulation patterns 320a, 320Ua between the stacked conductive patterns and the string select lines 315 may define one stack structure.

Continuously referring to FIGS. 11, 12A and 12B, a bit line 360 electrically connected to the drain portions 334 and extending in the second direction may be formed. The bit line 360 may be provided in plurality. One bit line 360 may be electrically connected to the plurality of drain portions 334 respectively formed in the semiconductor pillars 336 arranged in the second direction to form one row.

An interlayer insulation layer 362 may be formed on the stack structure and the bit lines 360. The interlayer insulation layer 362 may include, for example, a silicon oxide. Contact holes penetrating the interlayer insulation layer 362 to expose the first portions SP1 of the landing sidewall portions LSPa of the pad patterns PPa may be formed, and cell contact plugs 364 may be formed by filling the contact holes. Conductive wirings 370 connected to the cell contact plugs 364 may be formed.

Figure 15:
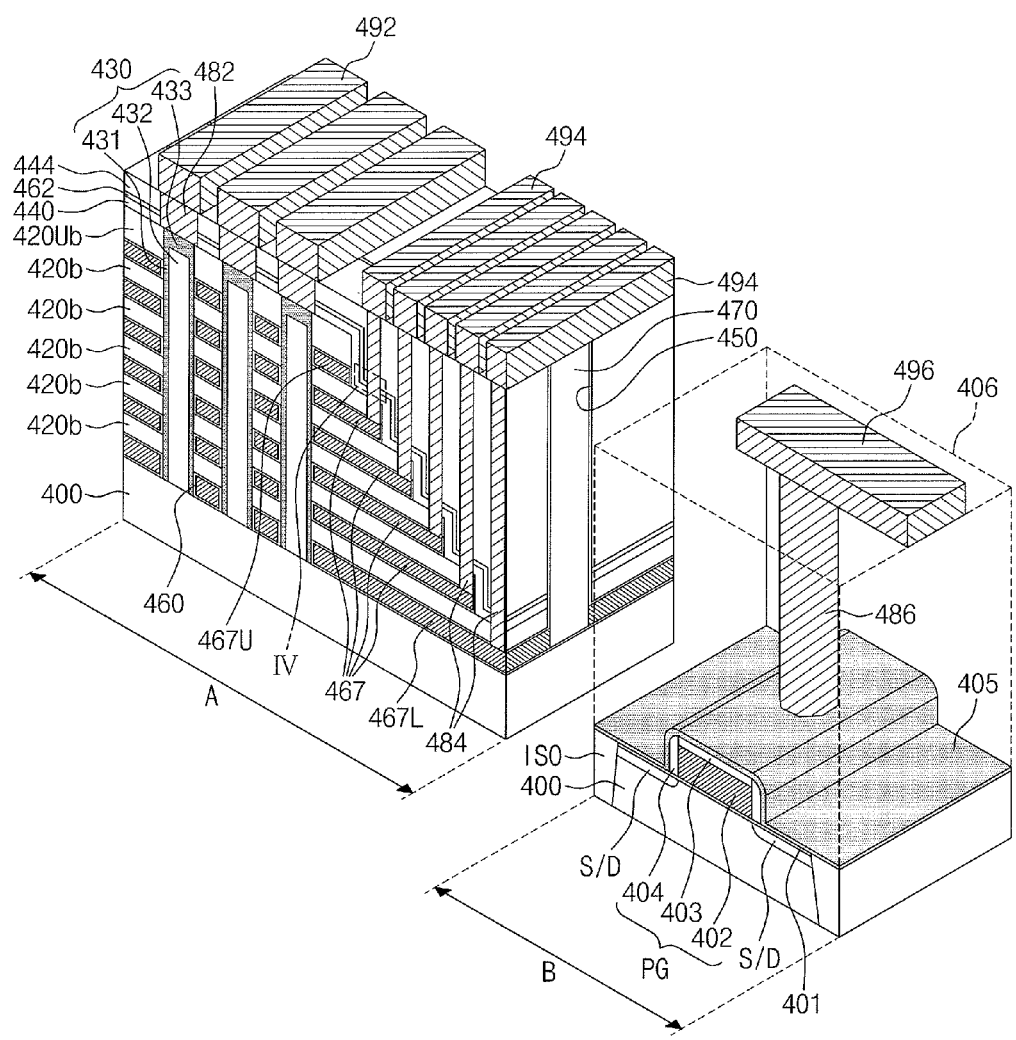
FIG. 15 is a perspective view illustrating a semiconductor device according to an embodiment of the inventive concept.

A semiconductor device according to a fifth embodiment of the inventive concept will be described. FIG. 15 is a perspective view illustrating a semiconductor device according to a fifth embodiment of the inventive concept.

Referring to FIG. 15, a substrate 400 may include a cell array region A and a peripheral region B. The cell array region A is a region where a three-dimensional cell array is disposed, and the peripheral region B is a region where a peripheral circuit is formed. The substrate 400 may be, for example, a semiconductor substrate.

Conductive patterns 467L, 467, 467U and insulation patterns 420b, 420Ub may be alternatingly and repeatedly stacked on the substrate in the cell region A. The conductive patterns 467L, 467, 467U and the insulation patterns 420b, 420Ub stacked alternatingly may constitute one stack structure. The plurality of stack structures may be provided on the substrate 400. The stack structures may extend in a first direction parallel to a top surface of the substrate 400. The stack structures may be spaced apart from each other a second direction. The first direction and the second direction are parallel to the top surface of the substrate 400 and may cross each other. The first direction may be an x-axis direction and the second direction may be a y-axis direction.

Semiconductor pillars 430 penetrate the conductive patterns 467L, 467, 467U and the insulation patterns 420b, 420Ub stacked alternatingly and repeatedly. The semiconductor pillars 430 may extend in a third direction vertical to the substrate 400. The third direction may be a z-axis direction. The semiconductor pillar 430 may contact the substrate 400. The semiconductor pillar 430 may be provided in plurality on the semiconductor substrate 400. The plurality of semiconductor pillars 430 may be arranged, for example, two-dimensionally in the first and second directions. The plurality of semiconductor pillars 430 may penetrate the respective stack structures. The semiconductor pillars 430 penetrating the respective stack structures may be spaced apart from each other. The semiconductor pillar 430 may include a semiconductor portion 431 adjacent to a sidewall of a channel opening 425 penetrating the stack structure, a filling insulation material 432 filling a region enclosed by the semiconductor portion 431 in the channel opening 425, and a drain portion 433 filling an upper region of the channel opening 425. The semiconductor portion 431 and the drain portion 433 may include, for example, a single crystalline or polycrystalline semiconductor. The drain portion 433 may be, for example, a region doped with a second-type dopant.

An information storage layer 460 may be disposed between the semiconductor pillars 130 and the conductive patterns 467L, 467, 467U. The information storage layer 460 may be a multi-layer including the tunnel dielectric layer 150a, the charge storage layer 150b and the blocking layer 150c.

A device isolation pattern 470 including an insulation material may be disposed between the plurality of stack structures. A common source region may be disposed in the substrate 400 between the plurality of stack structures. The common source region may have, for example, a line shape extending in the first direction. The common source region may be a region doped with the second-type dopant. The lowermost conductive pattern CP may control an electrical connection between the common source region and the semiconductor pillar 430.

The conductive patterns 467L, 467, 467U and the insulation patterns 420b, 420Ub may be formed in, for example, a stepwise structure. For example, among the conductive patterns 467L, 467, 467U, the conductive pattern positioned at a relatively low level may have a greater length in the first direction than that positioned at a relatively high level. Among the insulation patterns 420b, 420Ub, the insulation pattern positioned at a relatively low level may have a greater length in the first direction than that positioned at a relatively high level. That is, among the conductive patterns 467L, 467, 467U, the conductive pattern positioned at a relatively low level may include a portion which does not overlap the conductive pattern positioned at a relatively high level. Among the insulation patterns 420b, 420Ub, the insulation pattern positioned at a relatively low level may include a portion which does not overlap the insulation pattern positioned at a relatively high level.

Each of the conductive patterns 467L, 467 under the uppermost conductive pattern 467U may include a contact extending portion which is not covered by the conductive pattern positioned at a relatively high level.

The conductive patterns 467L, 467, 467U may include, for example, at least one of metals (e.g., tungsten, aluminum, titanium, tantalum, etc.), conductive metal nitrides (e.g., titanium nitride, tantalum nitride, etc.), and doped semiconductor materials (e.g., doped silicon, doped germanium, doped silicon germanium, etc.). The insulation patterns 420b, 420Ub may include, for example, a silicon oxide, a silicon nitride and/or a silicon oxynitride.

A capping insulation layer 440, a barrier layer 462 and an interlayer insulation layer 444 may be sequentially stacked on the stack structure including the conductive patterns 467L, 467, 467U and the insulation patterns 420b, 420Ub having the stepwise structure. The capping insulation layer 440 and the barrier layer 462 may cover the conductive patterns 467L, 467, 467U and the insulation patterns 420b, 420Ub having the stepwise structure conformally. Therefore, the capping insulation layer 440 and the barrier layer 462 may have a stepwise structure in a section in the second direction. The interlayer insulation layer 444 may have a top surface parallel to the top surface of the substrate 100.

Figure 16:
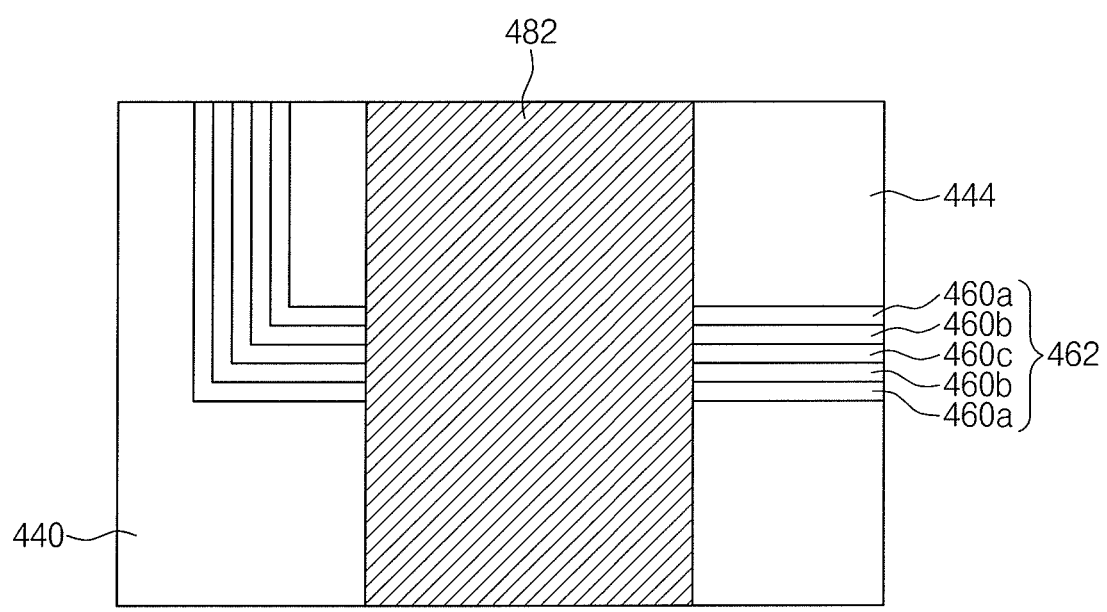
FIG. 16 is an enlarged view of portion IV of FIG. 15 for describing a barrier layer included in a semiconductor device according to an embodiment of the inventive concept.

The barrier layer 462 may include the same material as the information storage layer 460. This will be described with reference to FIG. 16. FIG. 16 is an enlarged view of portion IV of FIG. 15 for describing a barrier layer included in a semiconductor device according to the fifth embodiment of the inventive concept.

Referring to FIG. 16, the barrier layer 462 may include a tunnel dielectric layer 460a, a charge storage layer 460b, a blocking layer 460c and a tunnel dielectric layer 460a stacked sequentially on the capping insulation layer 440. The tunnel dielectric layer 460a, the charge storage layer 460b and the blocking layer 460c may include the same material as the tunnel dielectric layer 150a, the charge storage layer 150b and the blocking layer 150c, respectively.

Referring to FIG. 15 again, a bit line contact plug 482 penetrating the interlayer insulation layer 444, the barrier layer 462 and the capping insulation layer 440 and connected to the drain portion 433 may be provided. A bit line 492 connected to the bit line contact plug 482 and extending in the second direction may be provided. In the case where the semiconductor pillars 430 arranged in the second direction form one column, one bit line 492 may be connected to the drain portions 433 of the semiconductor pillars 430 included in the column.

Cell contact plugs penetrating the interlayer insulation layer 444, the barrier layer 462, the capping insulation layer 440, the insulation patterns 420b and the information storage layer 460 and connected to the conductive patterns 467L, 467 may be provided. Among the conductive patterns 467L, 467, the cell contact plug 482 connected to the conductive pattern positioned at a relatively low level may have a greater length in the third direction than the cell contact plug 482 connected to the conductive pattern positioned at a relatively high level. A conductive wiring 494 connected to the cell contact plug 482 may be provided.

A peripheral device isolation pattern ISO may be formed in the substrate 400 within the peripheral region B to define a peripheral active region in the peripheral region B. The peripheral active region may be a portion of the substrate 400 enclosed by the peripheral device isolation pattern ISO. The peripheral active region may include a channel region, and a channel may be formed in the channel region during an operation of the semiconductor device.

A peripheral gate insulation layer 401 may be disposed on the peripheral active region. The peripheral gate insulation layer 401 may include, for example, a silicon oxide layer. A peripheral gate pattern PG may be disposed on the peripheral gate insulation layer 401. The peripheral gate insulation pattern PG may include a peripheral gate electrode 402 on the peripheral gate insulation layer 401, a peripheral gate gapping pattern 403 on the peripheral gate electrode 402, and a peripheral spacer on both sidewalls of the peripheral gate electrode 402. A peripheral source/drain S/D may be disposed in the peripheral active region at both sides of the peripheral gate pattern PG. The peripheral source/drain S/D may be, for example, a region doped with a second-type dopant.

A peripheral etch stop layer 405 and a peripheral interlayer insulation layer 406 may be sequentially stacked on the peripheral gate pattern PG. The peripheral etch stop layer 405 and the peripheral interlayer insulation layer 406 may be formed of different materials. For example, the peripheral etch stop layer 405 may include a silicon nitride layer, and the peripheral interlayer insulation layer 406 may include a silicon oxide layer.

A peripheral contact plug 486 penetrating the peripheral etch stop layer 405 and the peripheral interlayer insulation layer 406 on the peripheral gate pattern PG and connected to the peripheral gate electrode of the peripheral gate pattern PG may be disposed. A peripheral conductive wiring 496 connected to the peripheral contact plug 486 may be disposed on the peripheral interlayer insulation layer 406.

A method of fabricating a semiconductor device according to the fifth embodiment of the inventive concept will be described. FIGS. 17A to 17G are perspective views for describing a method of fabricating a semiconductor device according to the fifth embodiment of the inventive concept.

Figure 17A:
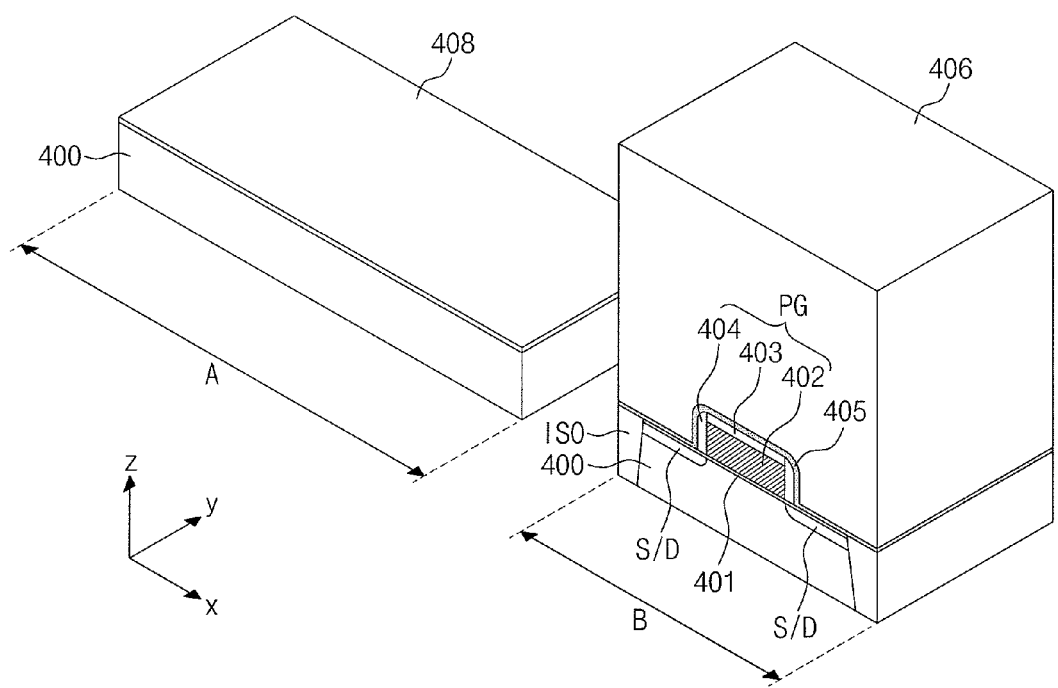
FIGS. 17A to 17I are perspective views for describing a method of fabricating a semiconductor device according to an embodiment of the inventive concept.

Referring to FIG. 17A, a substrate 400 including a cell region A and a peripheral region B spaced apart from each other is provided. A peripheral device isolation pattern ISO may be formed on the substrate 400 in the peripheral region B to define a peripheral active region. The peripheral device isolation pattern ISO may be formed by, for example, etching the substrate 400 to form a trench and filling the trench with an insulation material. A peripheral gate insulation layer 401 may be formed on the peripheral active region. For example, the peripheral gate insulation layer 401 may include a silicon oxide layer formed by a thermal oxidation process. A peripheral gate pattern PG including a peripheral gate electrode 402, a peripheral gate capping pattern 403 and a peripheral spacer 404 may be formed on the peripheral gate insulation layer 401. A peripheral etch stop layer 405 and a peripheral interlayer insulation layer 406 covering the peripheral gate pattern PG may be sequentially formed.

A buffer dielectric layer 408 may be formed on the substrate 400 in the cell region A. The buffer dielectric layer 408 may include, for example, a silicon oxide layer formed by a thermal oxidation process.

Figure 17B:
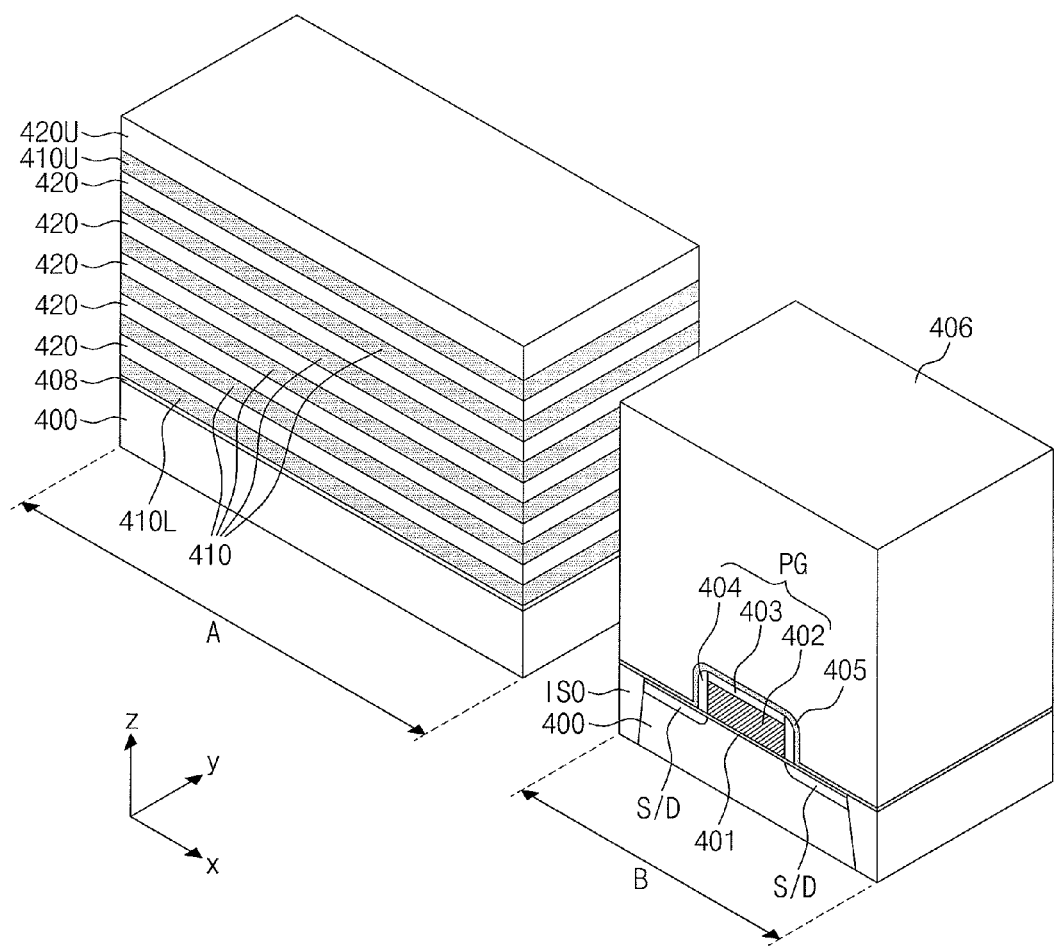

Referring to FIG. 17B, first material layers, and second material layers including a different material from the first material layers may be alternatingly and repeatedly stacked on the substrate 400 within the cell region A. The first material layers may be sacrificial layers 410L, 410, 410U, and the second material layers may be insulation layers 420, 420U. The sacrificial layers 410L, 410, 410U and the insulation layers 420, 420U may include the same material as the sacrificial layers 110L, 110 and the insulation layers 120 described with reference to FIG. 4B, respectively.

The sacrificial layers 410L, 410, 410U may be formed with the same thickness. Unlike this, among the sacrificial layers 410L, 410, 410U, the lowermost sacrificial layer 410L and the uppermost sacrificial layer 410U may be formed thicker than the sacrificial layers 410 therebetween. In this case, the sacrificial layers 410 between the lowermost sacrificial layer 410L and the uppermost sacrificial layer 410U may be formed with the same thickness. Among the insulation layers 420, 420U, the uppermost insulation layer 420U may be formed thicker than the insulation layers 420 thereunder. The insulation layers 420 under the uppermost insulation layer 420U may be formed with the same thickness.

For example, after the sacrificial layers 410L, 410, 410U and the insulation layers 420, 420U are formed, a planarization process using the peripheral interlayer insulation layer 406 as an etch stop layer may be performed.

Figure 17C:
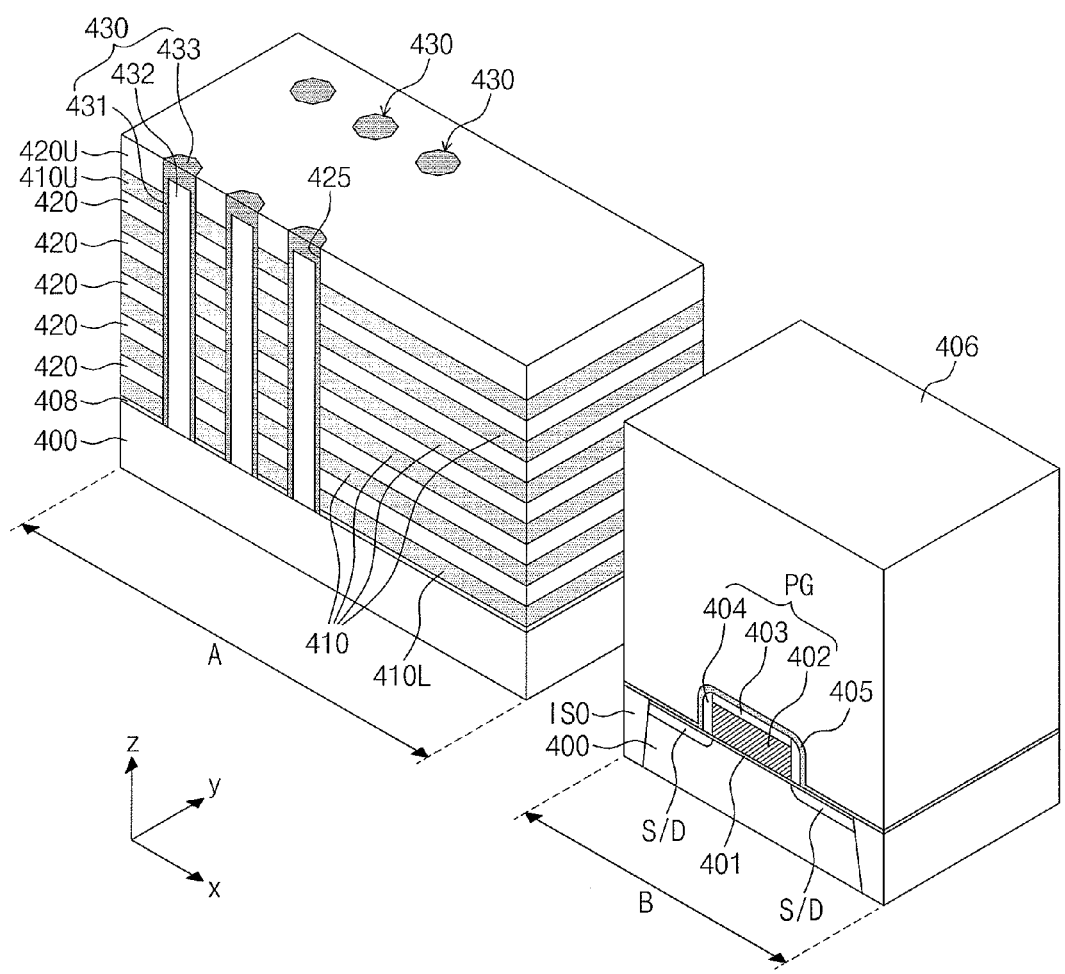

Referring to FIG. 17C, channel openings 425 exposing the top surface of the substrate 400 may be formed by, for example, continuously patterning the buffer dielectric layer 408, the insulation layers 420U, 420 and the sacrificial layers 410U, 410, 410L. The channel openings 425 may be formed by the process described with reference to FIG. 4C. Semiconductor pillars 430 filling the channel openings 425 respectively may be formed. Each of the semiconductor pillars 430 may include a semiconductor portion 431 adjacent to a sidewall of the channel opening 425, a filling insulation material 432 filling a region enclosed by the semiconductor portion 431 in the channel opening 425, and a drain portion 433 filling an upper region of the channel opening 425. The semiconductor portion 431 and the drain portion 433 may include, for example, a single crystalline or polycrystalline semiconductor. The drain portion 433 may be, for example, a region doped with a second-type dopant.

Figure 17D:
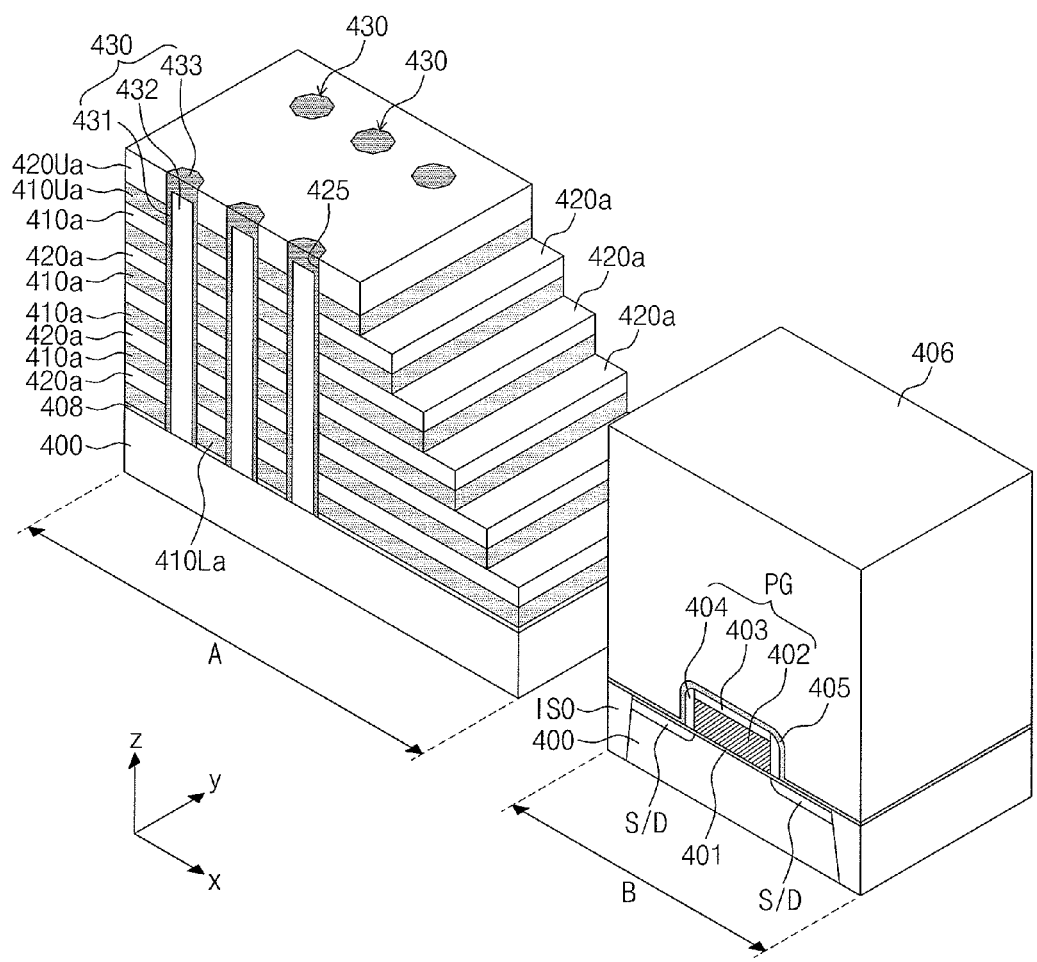

Referring to FIG. 17D, sacrificial patterns 410La, 410a, 410Ua and insulation patterns 420a, 420Ua having, for example, a stepwise structure may be formed by, for example, continuously patterning the sacrificial layers 410L, 410, 410U and the insulation layers 420, 420U. For example, among the sacrificial patterns 410La, 410a, 410Ua, the sacrificial pattern positioned at a relatively low level may have a greater length in the first direction than the sacrificial pattern positioned at a relatively high level, and among the insulation patterns 420a, 420Ua, the insulation pattern positioned at a relatively low level may have a greater length in the first direction than the insulation pattern positioned at a relatively high level. Some portions of top surfaces of the insulation patterns 420a and sidewalls of the sacrificial patterns 410La, 410a, 410Ua may be exposed.

Figure 17E:
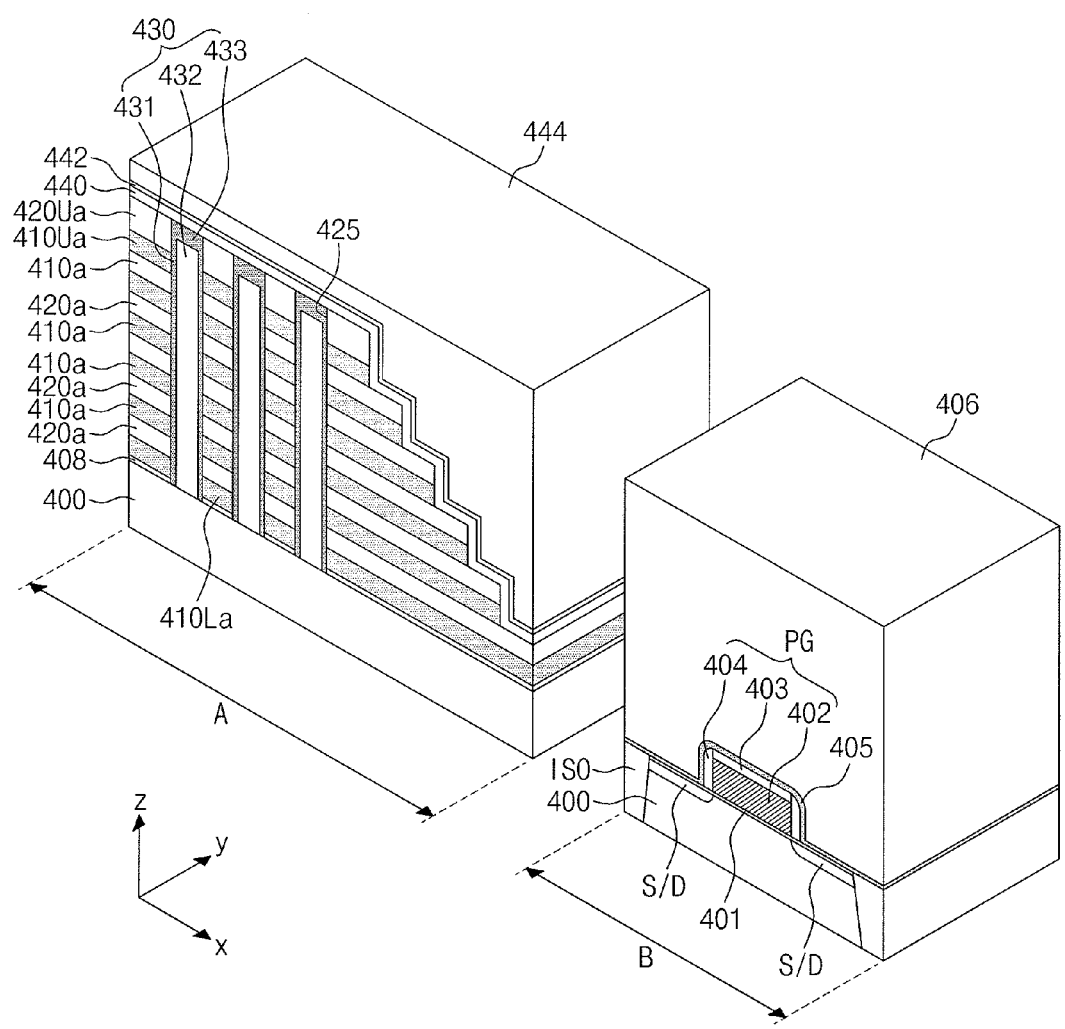

Referring to FIG. 17E, a capping insulation layer 440, an additional sacrificial layer 442 and an interlayer insulation layer 444 may be sequentially framed on the sacrificial pattern 410La, 410a, 410Ua and the insulation patterns 420a, 420Ua having the stepwise structure, and then, for example, a planarization process using the peripheral interlayer insulation layer 406 as an etch stop layer may be performed. The additional sacrificial layer 442 may include a material having an etch selectivity with respect to the capping insulation layer 440 and the interlayer insulation layer 444. For example, in the case where the capping insulation layer 440 and the interlayer insulation layer 444 are formed of a silicon oxide layer, the additional sacrificial layer 442 may be formed of a silicon nitride layer or a silicon oxynitride layer.

Figure 17F:
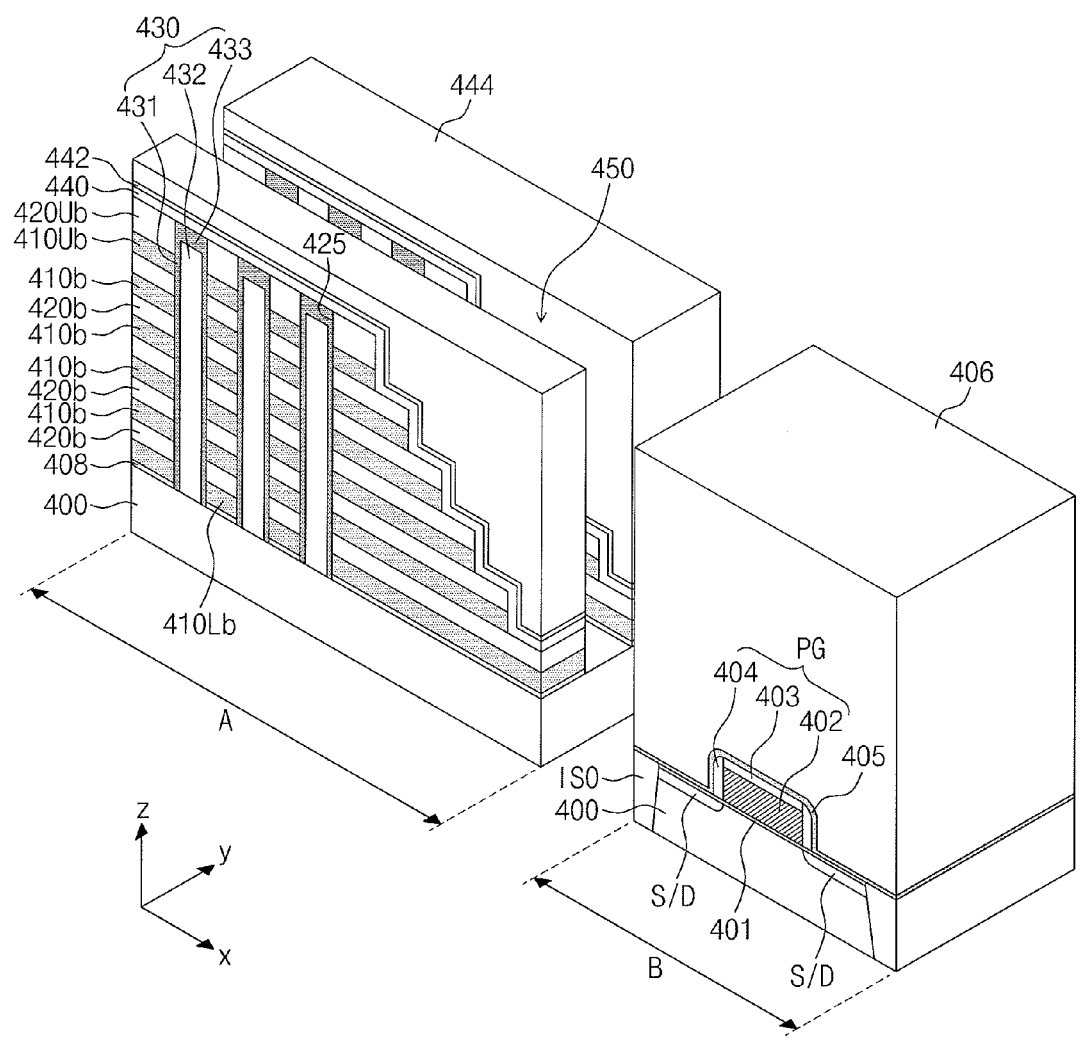

Referring to FIG. 17F, a trench 450 exposing the top surface of the substrate 100 may be formed by, for example, patterning the interlayer insulation layer 444, the additional sacrificial layer 442, the capping insulation layer 440, the sacrificial patterns 410La, 410a, 410Ua and the insulation patterns 420a, 420Ua. The trench 450 may extend in the first direction. The patterned sacrificial patterns 410Lb, 410b, 410Ub and the patterned insulation patterns 420b, 420Ub may be formed in, for example, a line shape extending in the first direction.

The semiconductor pillars 430 arranged in the first direction form one row and the semiconductor pillars 430 arranged in the second direction form one column. The plurality of rows and the plurality of columns may be arranged on the substrate 400. The trench 450 may be disposed between the rows in one pair adjacent to each other. The plurality of semiconductor pillars 430 included in one row may penetrate one stack structure including the sacrificial patterns 410Lb, 410b, 410Ub and the insulation patterns 420b, 420Ub stacked alternatingly and repeatedly.

Figure 17G:
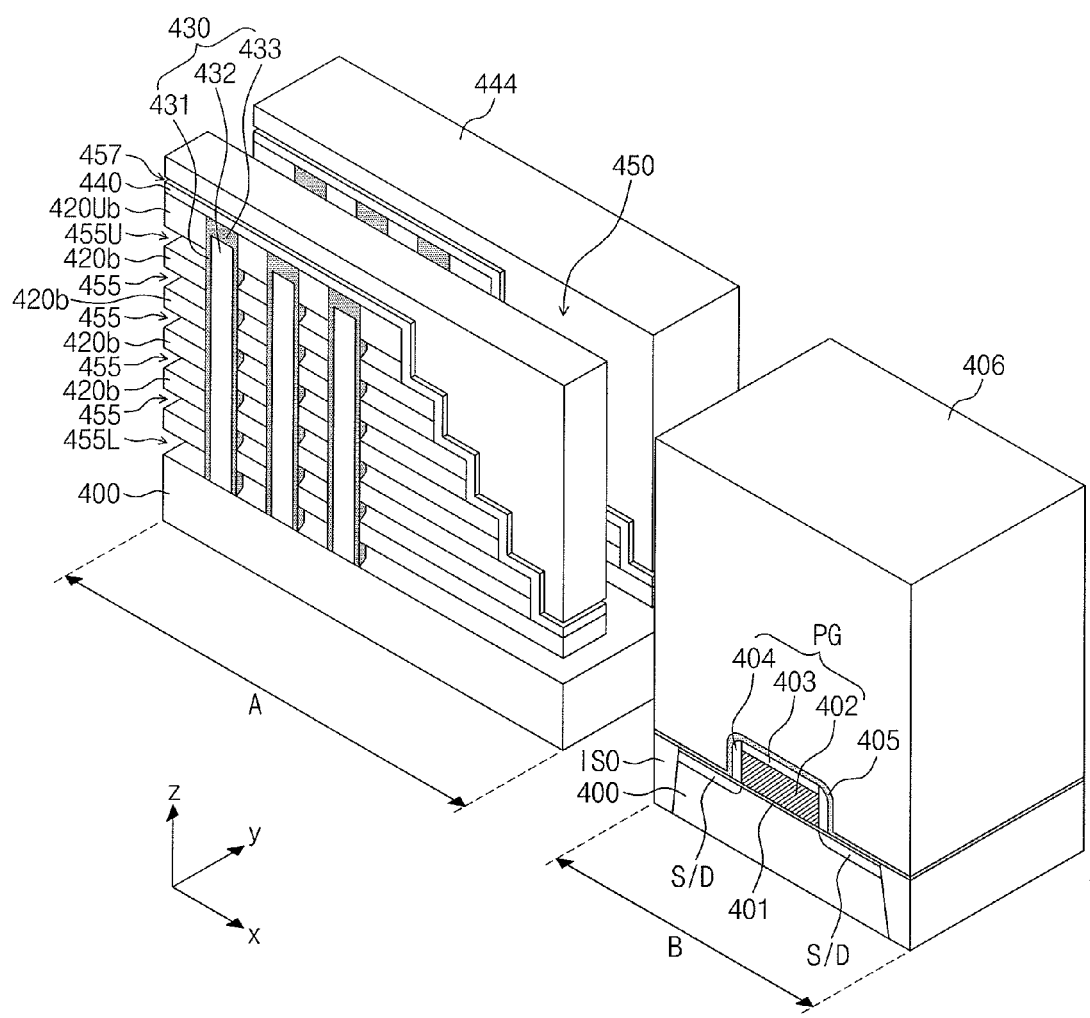

Referring to FIG. 17G, recess regions 455L, 455, 455U and an additional recess region 457 may be respectively formed by, for example, performing a selective etching process to remove the sacrificial patterns 410Lb, 410b, 410Ub and the additional sacrificial layer 442 exposed to the trench 450. The recess regions 455L, 455, 455U may be spaces left after the sacrificial patterns 410Lb, 410b, 410Ub are removed. Due to this, among the recess regions 455L, 455, 455U, the recess region positioned at a relatively low level may have a greater length in the first direction than the recess region positioned at a relatively high level. The additional recess region 457 may be a space left after the sacrificial etch stop layer 442 is removed.

The selective etching process may be, for example, an isotropic etching process. The selective etching process may be performed by, for example, a wet etching and/or an isotropic dry etching, etc. The etch rate of the sacrificial patterns 410Lb, 410b, 410Ub by the selective etching process may be greater than the etch rate of the insulation patterns 420b, 420Ub and the semiconductor pillars 430 by the selective etching process. Therefore, after the selective etching process is performed, the insulation patterns 420b, 410Ub and the semiconductor pillar 430 may be left. The recess regions 455L, 455, 455U may expose some portions of the sidewall of the semiconductor pillar 430 contacting the sacrificial patterns 410Lb, 410b, 410Ub, respectively. The buffer dielectric layer 408 which is thinner than the insulation patterns 420b, 420Ub may be removed during the selective etching process.

Figure 17H:
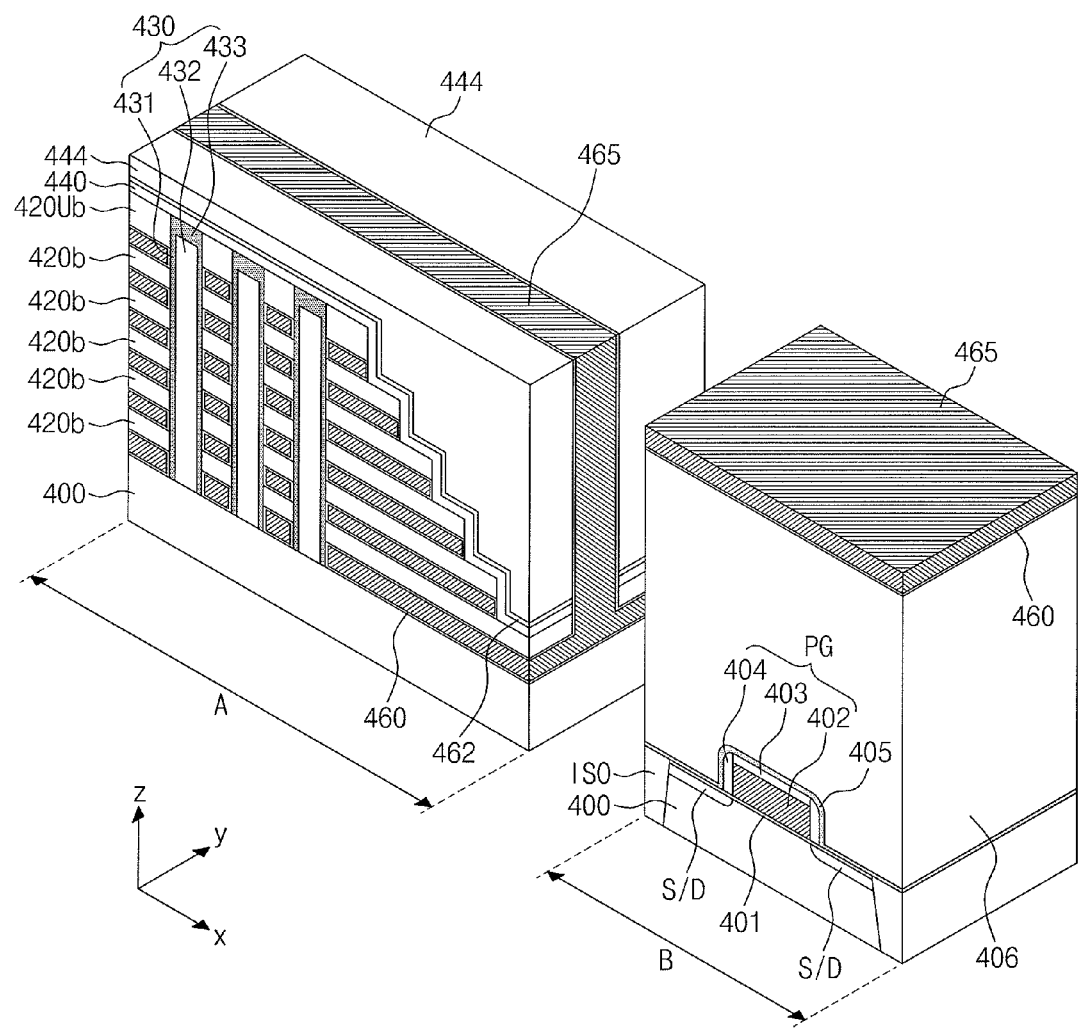

Referring to FIG. 17H, after the recess regions 455L, 455, 455U are formed, an information storage layer 460 may be formed on the substrate 400. The information storage layer 460 may be formed with the substantially uniform thickness along inner surfaces of the recess regions 455L, 455, 455U. The information storage layer 460 may fill the recess regions 455L, 455, 455U. The forming of the information storage layer 460 may include sequentially forming the tunnel dielectric layer 150a, the charge storage layer 150b, and the blocking layer 150c, which is described with reference to FIG. 3.

The information storage layer 460 may be formed in the additional recess region 457 to form a barrier layer 462. The barrier layer 462 may be formed in a multi-layer structure including a tunnel dielectric layer 460a, a charge storage layer 460b, a blocking layer 460c as described with reference to FIG. 16.

After the information storage layer 460 is formed, a gate conductive layer 465 may be formed over the substrate 400. The gate conductive layer 465 may fill the recess regions 455, 455U. The gate conductive layer 465 may fill some or the entire region of the trench 450. The gate conductive layer 465 may be electrically isolated by the information storage layer 460 from the semiconductor pillar 430 and the substrate 400. The gate conductive layer 465 may be formed by, for example, the process described with reference to FIG. 4G.

Figure 17I:
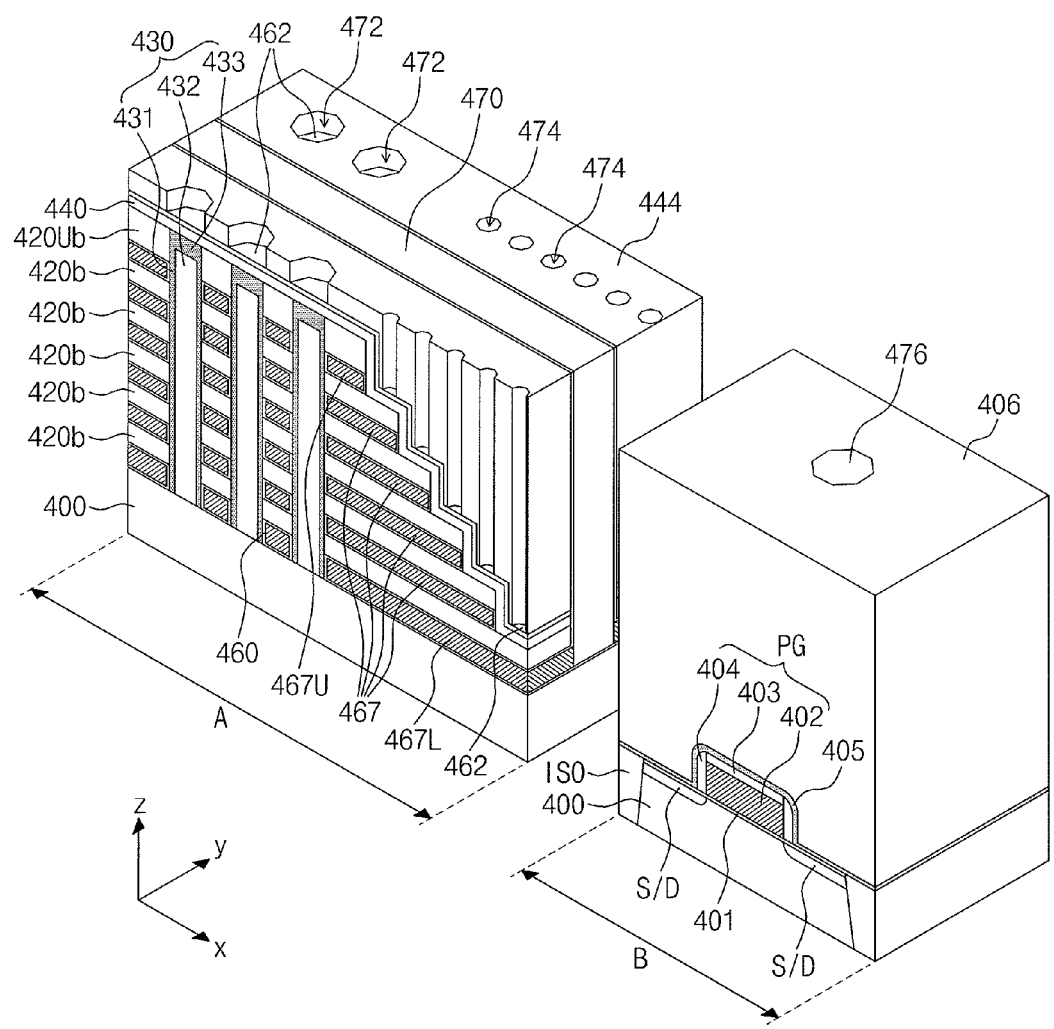

Referring to FIG. 17I, the gate conductive layer 465 positioned outside the recess regions 455, 455U may be removed to form conductive patterns 467L, 467, 467U in the recess regions 455L, 455, 455U. The gate conductive layer 465 positioned outside the recess regions 455, 455U may be removed by, for example, a wet etching process and/or a dry etching process, etc.

The conductive patterns 467L, 467, 467U and the insulation patterns 420b, 420Ub stacked alternatingly may define one stack structure. The conductive patterns 467L, 467, 467U correspond to some portions of the gate conductive layers 465 positioned within the recess regions 455L, 455, 455U, respectively. Among the conductive patterns 467L, 467, 467U, the lowermost conductive pattern 467L may correspond to a gate of a lower select transistor, and the uppermost conductive pattern 467U may correspond to a gate of an upper select transistor. The conductive patterns 467 between the lowermost conductive pattern 467L and the uppermost conductive pattern 467U may correspond to control gates of memory cells, respectively.

A device isolation pattern 470 filling the trench 450 may be formed. The forming of the device isolation pattern 470 may include forming a device isolation layer on the substrate 400 and performing a planarization process using a top surface of the interlayer insulation layer 444 as an etch stop layer. The device isolation pattern 470 may include the same material as the device isolation patterns 160, 162 described with reference to FIG. 4I.

A peripheral contact hole 476 penetrating the peripheral interlayer insulation layer 406 and the peripheral etch stop layer 405 on the peripheral gate pattern PG, and preliminary bit line contact holes 474 and preliminary cell contact holes 472 penetrating the interlayer insulation layer 444 may be formed. The peripheral contact hole 476 may expose the peripheral gate electrode 402, the preliminary cell contact holes 472 may expose contact extending portions of the conductive patterns 467L, 467, and the preliminary bit line contact holes 474 may expose the drain portions of the semiconductor pillars 430. The preliminary contact holes 472, 474 may be formed by, for example, patterning the interlayer insulation layer 444 by using the barrier layer 462 as an etch stop layer. Bottom surfaces of the preliminary contact holes 472, 474 may correspond to a top surface of the barrier layer 462. That is, the preliminary contact holes 472, 474 may expose the barrier layer 462.

Among the conductive patterns 467L, 467, the depth of the preliminary cell contact hole 472 for exposing the contact extending portion of the conductive pattern positioned at a relatively low level may be deeper than the depth of the preliminary cell contact hole 472 for exposing the contact extending portion of the conductive pattern positioned at a relatively high level.

In the case where the barrier layer 462 is omitted and contact holes exposing the contact extending portions, the drain portion 433 and the peripheral gate electrode 402 are formed, a material and/or a layer exposed by the contact hole having a relatively low depth may be over-etched due to a depth difference between the contact holes.

However, according to exemplary embodiments of the inventive concept, since the preliminary contact holes 472, 474 are formed by using the barrier layer 462 as etch stop layer, an over-etch which may be caused by the depth difference between contact holes may be minimized. Therefore, a high reliability semiconductor device may be realized.

Continuously referring to FIG. 15, cell contact holes penetrating the etch stop layer 462, the capping insulation layer 440, the insulation patterns 420b and the information storage layer 460 to expose the contact extending portions of the conductive patterns 467L, 467 may be formed. Cell contact plugs 484 filling the cell contact holes and bit line contact plugs 482 filling the bit line contact holes may be formed respectively. Conductive wirings 494 connected to the cell contact plugs 484 and bit lines 492 connected to the bit line contact plugs 482 may be formed respectively.

A peripheral contact plug 486 filling the peripheral contact hole 476 may be formed. A peripheral conductive wiring 496 connected to the peripheral contact plug 486 may be formed on the peripheral interlayer insulation layer 406.

The semiconductor devices according to the foregoing embodiments may be mounted in various types of packages. The semiconductor devices according to the embodiments of the inventive concept may be packaged in the form of, for example, package on package (PoP), ball grid arrays (BGAs), chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), a small outline package (SOP), a shrink small outline package (SSOP), a thin small outline package (TSOP), a thin quad flat package (TQFP), a system in package (SIP), a multi chip package (MCP), a wafer-level fabricated package (WFP), a wafer-level processed package (WSP) and so on. The packages in which the semiconductor devices according to the embodiments of the inventive concept are mounted may further include, for example, a controller controlling the semiconductor device and/or a logic device.

Figure 18:
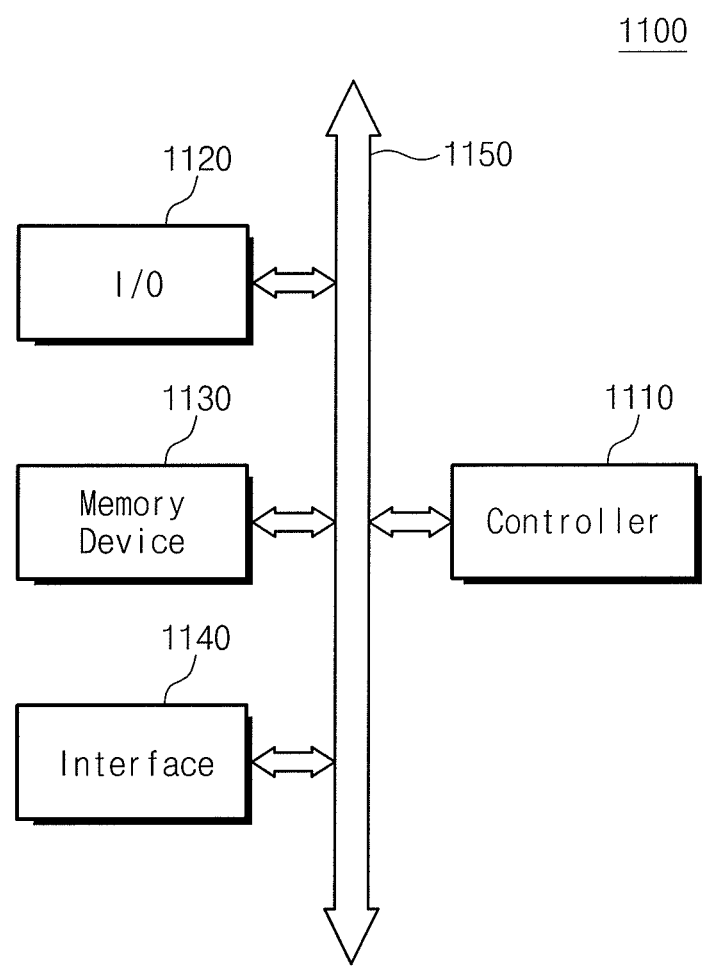
FIG. 18 is a schematic block diagram illustrating an electronic system including a semiconductor device according to an embodiment of the inventive concept.

FIG. 18 is a block diagram illustrating an electronic system including a semiconductor device according to an exemplary embodiment of the inventive concept.

Referring to FIG. 18, an electronic system 1100 according to embodiments of the inventive concept includes a controller 1110, an input/output device (I/O) 1120, a memory device 1130, an interface 1140 and a bus 1150. The controller 1110, the input/output device 1120, the memory device 1130 and/or the interface 1140 may be coupled to one another through the bus 1150. The bus 1150 corresponds to a path through which data is moved.

The controller 1110 includes, for example, at least one selected from the group consisting of a microprocessor, a digital signal processor, a microcontroller, and logic devices capable of performing similar functions to the above elements. The input/output device 1120 may include, for example, a keypad, a keyboard, a display device and the like. The memory device 1130 may store data and/or commands. The memory device 1130 may include at least one among the semiconductor memory devices disclosed in the embodiments. Also, the memory device 1130 may further include other types of semiconductor devices (e.g., DRAM device and/or SRAM device). The interface 1140 may serve to transmit/receive data to/from a communication network. The interface 1140 may include a wired and/or wireless interface. For example, the interface 1140 may include an antenna and/or a wired/wireless transceiver. Although not shown in the drawings, the electronic system 1100 may further include a high speed DRAM and/or SRAM as a working memory for enhancing operations of the controller 1110.

The electronic system 1100 may be applied to, for example, a personal digital assistant (PDA), a portable computer, a web tablet, a wireless phone, a mobile phone, a digital music player, a memory card, or all electronic products capable of transmitting/receiving information in a wireless environment.

Figure 19:
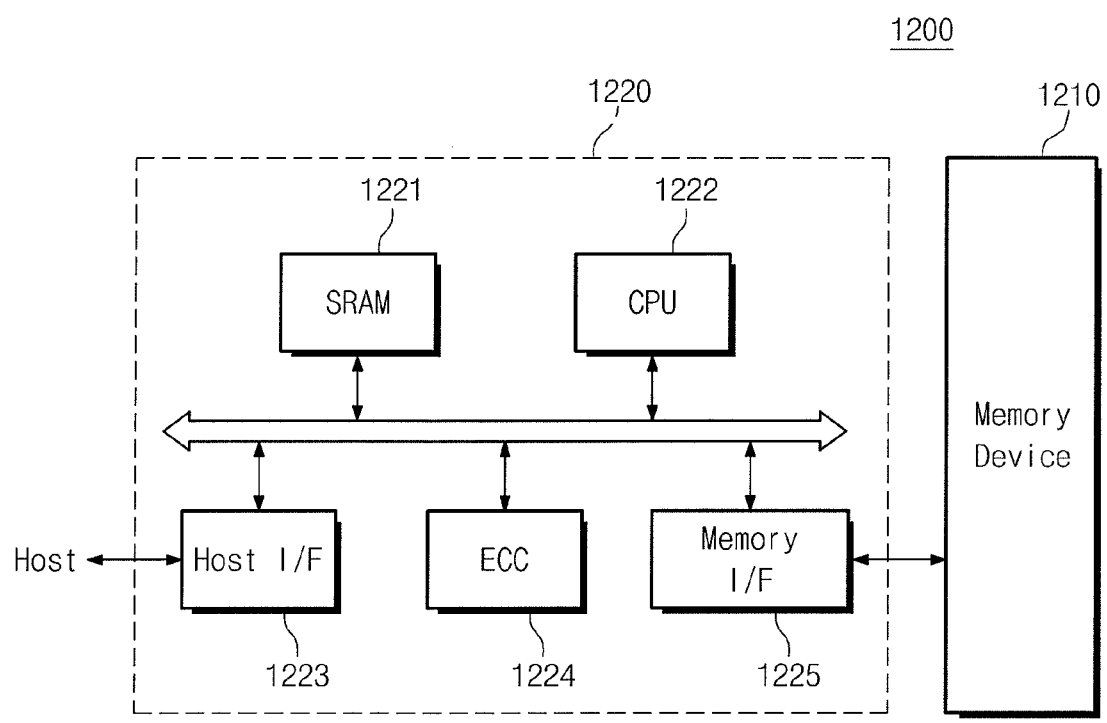
FIG. 19 is a schematic block diagram illustrating a memory card including a semiconductor device formed according to an embodiment of the inventive concept.

FIG. 19 is a block diagram illustrating a memory card including a semiconductor device according to an exemplary embodiment of the inventive concept.

Referring to FIG. 19, a memory card 1200 according to embodiments of the inventive concept includes a memory device 1210. The memory device 1210 may include at least one among the semiconductor memory devices disclosed in the embodiments. Also, the memory device 1210 may further include other types of semiconductor memory devices (e.g., DRAM device and/or SRAM device). The memory card 1200 may include a memory controller for controlling data exchange between a host and the memory device 1210.

The memory controller 1220 may include a processing unit (CPU) 1222 controlling an overall operation of the memory card 1200. Also, the memory controller 1220 may include an SRAM 1221 used as a working memory of the processing unit 1222. In addition, the memory controller 1220 may further include a host interface 1223 and a memory interface 1225. The host interface 1223 may be provided with a data exchange protocol between the memory card 1200 and the host. The memory interface 1225 may connect the memory controller 1220 and the memory device 1210. Furthermore, the memory controller 1220 may further include an error correction block (ECC) 1224. The ECC 1224 may detect and correct an error of data read from the memory device 1210. Although not shown in FIG. 10, the memory card 1200 may further include a ROM device storing code data for interfacing with the host. The memory card 1200 may be used as a portable data storage card. Alternatively, the memory card 1200 may be provided in the form of a solid state disk (SSD) that can substitute for a hard disk of a computer system.

According to embodiments of the inventive concept, a pad portion connected to a plurality of conductive patterns stacked spaced apart from each other and extending in a first direction is provided. The pad portion includes a flat portion extending in the first direction, and a landing sidewall portion extending upward from one end of the flat portion and having a width in the first direction which is greater than a width in the second direction crossing the first direction. Thus, the depth of contact holes decreases and a contact process margin is increased, so that a high reliability semiconductor device can be provided.

While the inventive concept has been particularly shown and described with reference to exemplary embodiments thereof, it will be understood by those of ordinary skill in the art that various changes in form and details may be made therein without departing from the spirit and scope of the inventive concept as defined by the appended claims.

What is claimed is:

1. A semiconductor device comprising:
a plurality of conductive patterns stacked on a substrate and spaced apart from each other; and
a pad pattern including a flat portion extending in a first direction parallel to the substrate from one end of any one of the plurality of conductive patterns, and a landing sidewall portion extending upward from a top surface of the flat portion,
wherein a width of some portion of the landing sidewall portion is less than a width of the flat portion, in a second direction parallel to the substrate and perpendicular to the first direction.

2. The semiconductor device of claim 1, wherein the landing sidewall portion comprises a first portion extending in the first direction, and a second portion extending in the second direction,
a width of the first portion of the landing sidewall portion is less than the width of the flat portion, in the second direction, and
a width of the second portion of the landing sidewall portion is equal to the width of the flat portion, in the second direction.

3. The semiconductor device of claim 1, wherein the pad pattern is provided in plurality on the substrate, the plurality of pad patterns are connected to one end of the stacked conductive patterns respectively, the flat portions respectively connected to the stacked conductive patterns have a stepwise structure, and top surfaces of the landing sidewall portions extending upward respectively from top surfaces of one end of the flat portions are positioned at the same level.

4. The semiconductor device of claim 3, wherein each of the conductive patterns comprises gate electrodes extending in parallel in the first direction and positioned at the same level, and a connecting portion connecting one end of the gate electrodes to each other, wherein the connecting portion comprises a first sidewall contacting the gate electrodes, and a second sidewall facing the first sidewall, and the pad pattern is connected to the second sidewall.

5. The semiconductor device of claim 1, further comprising:
a semiconductor pillar penetrating the stacked conductive patterns; and
an information storage layer between the semiconductor pillar and the conductive patterns.

6. The semiconductor device of claim 5, further comprising:
a first insulation layer and a second insulation layer disposed on uppermost conductive pattern among the conductive patterns; and
a bather layer between the first insulation layer and the second insulation layer, wherein the bather layer comprises a same material as the information storage layer.

7. The semiconductor device of claim 4, further comprises an auxiliary pad pattern extending in the first direction from the one end of any one of the conductive patterns and spaced apart from the pad pattern,
wherein the auxiliary pad pattern comprises an auxiliary flat portion parallel to the substrate, and an auxiliary sidewall portion extending upward from one end of the auxiliary flat portion.

8. The semiconductor device of claim 7, wherein a width of the auxiliary sidewall portion is equal to a width of the auxiliary flat portion, in the second direction.

9. The semiconductor device of claim 1, further comprising a contact plug on the landing sidewall portion.

10. The semiconductor device of claim 9, wherein each width of the contact plug in the first and second directions is greater than the width of the some portion of the landing sidewall portion.

11. The semiconductor device of claim 1, wherein the width of the landing sidewall portion in the first direction is greater than a thickness of the conductive pattern.

* * * * *